US008653553B2

(12) United States Patent
Yamazaki et al.

(10) Patent No.: US 8,653,553 B2
(45) Date of Patent: Feb. 18, 2014

(54) LIGHT-EMITTING ELEMENT, LIGHT-EMITTING DEVICE, DISPLAY DEVICE, ELECTRONIC DEVICE, AND LIGHTING DEVICE

(71) Applicant: Semiconductor Energy Laboratory Co., Ltd., Kanagawa-ken (JP)

(72) Inventors: Shunpei Yamazaki, Tokyo (JP); Satoshi Seo, Kanagawa (JP); Yoshiharu Hirakata, Kanagawa (JP); Takahiro Ishisone, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/799,872

(22) Filed: Mar. 13, 2013

(65) Prior Publication Data
US 2013/0240933 A1   Sep. 19, 2013

(30) Foreign Application Priority Data

Mar. 14, 2012   (JP) ................................. 2012-057241

(51) Int. Cl.
*H01L 33/00* (2010.01)
(52) U.S. Cl.
USPC ................................. 257/98; 257/99; 257/79
(58) Field of Classification Search
USPC .............................................. 257/98, 99, 79
See application file for complete search history.

(56) References Cited

U.S. PATENT DOCUMENTS 6,911,271 B1   6/2005   Lamansky et al.
6,939,624 B2   9/2005   Lamansky et al.
7,009,338 B2   3/2006   D'Andrade et al.
7,285,907 B2   10/2007  D'Andrade et al.
7,381,479 B2   6/2008   Lamansky et al.
(Continued)

FOREIGN PATENT DOCUMENTS

EP   1 202 608 A2   5/2002
JP   2004-506305    2/2004
(Continued)

OTHER PUBLICATIONS

Itano, K. et al, "Exciplex Formation at the Organic Solid-State Interface: Yellow Emission in Organic Light-Emitting Diodes Using Green-Fluorescent tris(8-quinolinolato)aluminum and Hole-Transporting Molecular Materials with Low Ionization Potentials," Applied Physics Letters, vol. 72, No. 6, Feb. 9, 1998, pp. 636-638.

(Continued)

*Primary Examiner* — Bilkis Jahan
(74) *Attorney, Agent, or Firm* — Husch Blackwell LLP

(57) ABSTRACT

An object is to provide a light-emitting element which uses a plurality of kinds of light-emitting dopants and has high emission efficiency. In one embodiment of the present invention, a light-emitting device, a light-emitting module, a light-emitting display device, an electronic device, and a lighting device each having reduced power consumption by using the above light-emitting element are provided. Attention is paid to Förster mechanism, which is one of mechanisms of intermolecular energy transfer. Efficient energy transfer by Förster mechanism is achieved by making an emission wavelength of a molecule which donates energy overlap with a local maximum peak on the longest wavelength side of a graph obtained by multiplying an absorption spectrum of a molecule which receives energy by a wavelength raised to the fourth power.

25 Claims, 29 Drawing Sheets

(56) References Cited

U.S. PATENT DOCUMENTS

| | | | |
|---|---|---|---|
| 7,553,560 B2 | 6/2009 | Lamansky et al. | |
| 7,572,522 B2 | 8/2009 | Seo et al. | |
| 7,771,844 B2 | 8/2010 | Inoue et al. | |
| 7,943,925 B2 | 5/2011 | Yamazaki | |
| 2003/0205696 A1 | 11/2003 | Thoms et al. | |
| 2005/0106415 A1* | 5/2005 | Jarikov et al. | 428/690 |
| 2005/0214576 A1 | 9/2005 | Lamansky et al. | |
| 2006/0159955 A1 | 7/2006 | Inoue et al. | |
| 2007/0222374 A1* | 9/2007 | Egawa et al. | 313/504 |
| 2008/0281098 A1 | 11/2008 | Lamansky et al. | |
| 2011/0001146 A1 | 1/2011 | Yamazaki et al. | |
| 2011/0210316 A1* | 9/2011 | Kadoma et al. | 257/40 |
| 2012/0098417 A1 | 4/2012 | Inoue et al. | |
| 2012/0205632 A1 | 8/2012 | Shitagaki et al. | |
| 2012/0205687 A1 | 8/2012 | Yamazaki et al. | |
| 2012/0206035 A1 | 8/2012 | Shitagaki et al. | |
| 2012/0217486 A1 | 8/2012 | Takemura et al. | |
| 2012/0217487 A1 | 8/2012 | Yamazaki et al. | |
| 2012/0242219 A1 | 9/2012 | Seo et al. | |
| 2012/0256535 A1 | 10/2012 | Seo et al. | |

FOREIGN PATENT DOCUMENTS

| | | |
|---|---|---|
| JP | 2004-522276 | 7/2004 |
| JP | 2007-250296 | 9/2007 |
| JP | 2008-247810 | 10/2008 |
| JP | 2012-44125 | 3/2012 |
| WO | WO 00/70655 A2 | 11/2000 |
| WO | WO 2010/140549 A1 | 12/2010 |

OTHER PUBLICATIONS

Baldo, M.A. et al, "Very High-Efficiency Green Organic Light-Emitting Devices Based on Electrophosphorescence," Applied Physics Letters, vol. 75, No. 1, Jul. 5, 1999, pp. 4-6.

Choong, V.-E. et al, "Organic Light-Emitting Diodes With a Bipolar Transport Layer," Applied Physics Letters, vol. 75, No. 2, Jul. 12, 1999, pp. 172-174.

International Search Report re application No. PCT/JP2013/056212, dated Apr. 9, 2013.

Written Opinion of the International Searching Authority re application No. PCT/JP2013/056212, dated Apr. 9, 2013.

\* cited by examiner

FIG. 1C
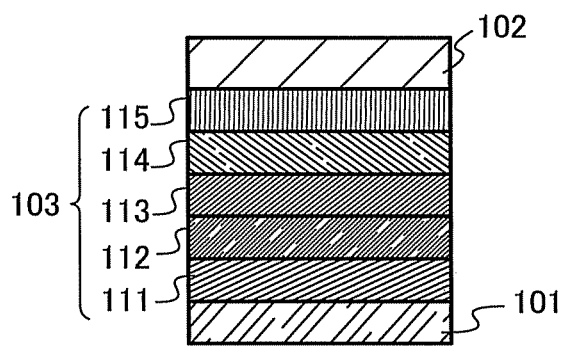
FIG. 1A    FIG. 1B
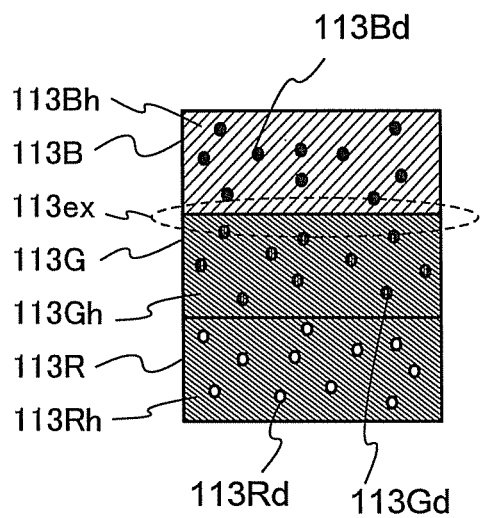
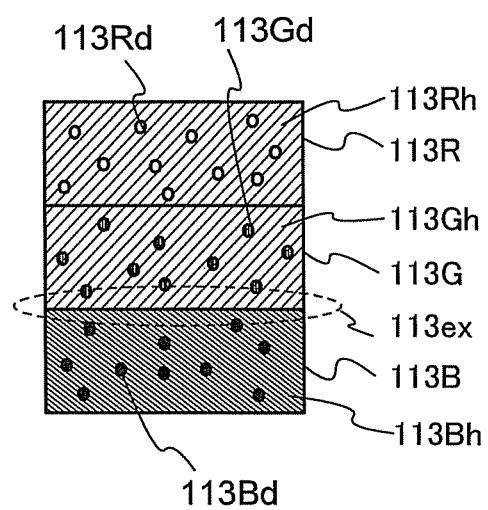

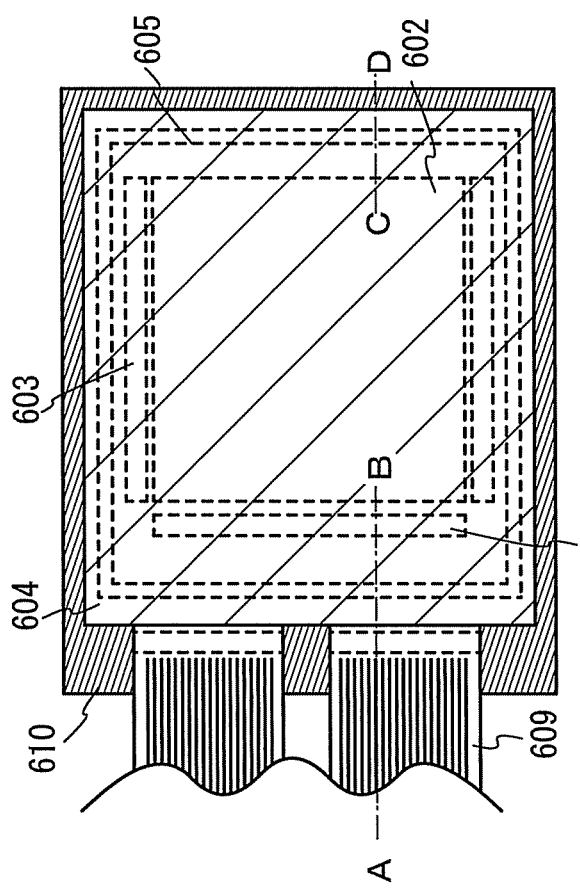
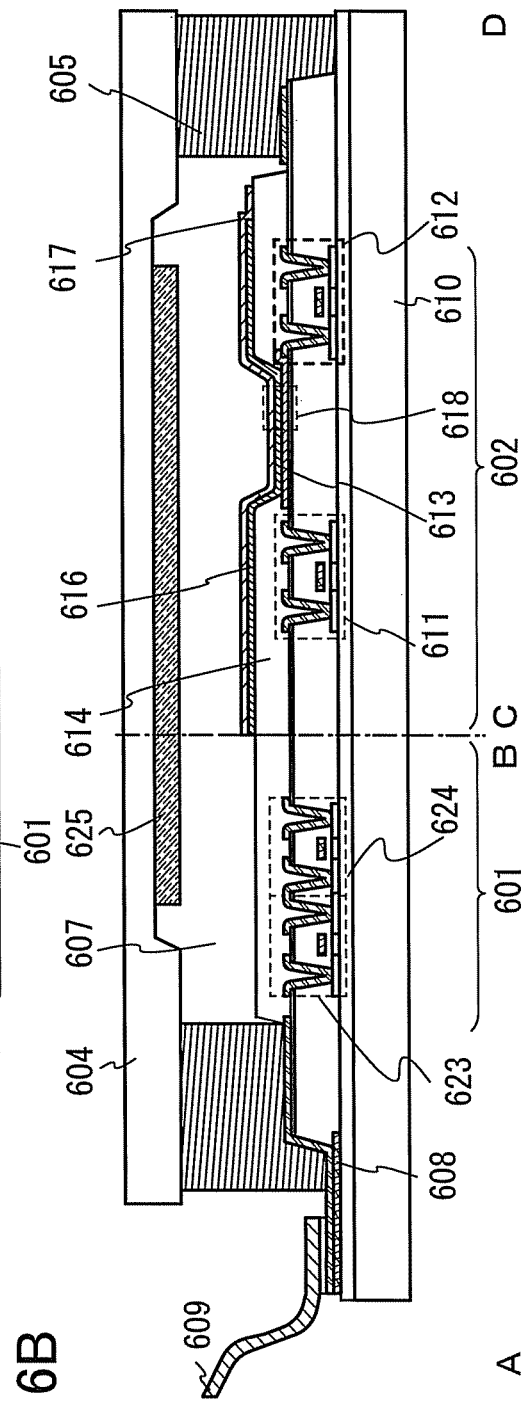
FIG. 6A
FIG. 6B

LIGHT-EMITTING ELEMENT, LIGHT-EMITTING DEVICE, DISPLAY DEVICE, ELECTRONIC DEVICE, AND LIGHTING DEVICE

TECHNICAL FIELD

The present invention relates to a light-emitting element, a display device, a light-emitting device, an electronic device, and a lighting device each of which uses an organic compound as a light-emitting substance.

BACKGROUND ART

In recent years, research and development have been extensively conducted on light-emitting elements utilizing electroluminescence (EL). In the basic structure of such a light-emitting element, a layer containing a light-emitting substance is interposed between a pair of electrodes. By voltage application to this element, light emission from the light-emitting substance can be obtained.

Such light-emitting elements are self-luminous elements and have advantages over liquid crystal displays in having high pixel visibility and eliminating the need for backlights, for example; thus, such light-emitting elements are thought to be suitable for flat panel display elements. Displays including such light-emitting elements are also highly advantageous in that they can be thin and lightweight. Furthermore, very high speed response is one of the features of such elements.

Since light-emitting layers of such light-emitting elements can be formed in a film form, they make it possible to provide planar light emission. Therefore, large-area elements can be easily formed. This is a feature difficult to obtain with point light sources typified by incandescent lamps and LEDs or linear light sources typified by fluorescent lamps. Thus, the light-emitting elements also have great potential as planar light sources applicable to lightings and the like.

In the case of an organic EL element in which a layer containing an organic compound used as a light-emitting substance is provided between a pair of electrodes, application of a voltage between the pair of electrodes causes injection of electrons from a cathode and holes from an anode into the layer containing the organic compound having a light-emitting property and thus a current flows. By recombination of the injected electrons and holes, the organic compound having a light-emitting property is put in an excited state to provide light emission.

It is to be noted that the excited states formed by an organic compound include a singlet excited state and a triplet excited state, and luminescence from the singlet excited state ($S^*$) is referred to as fluorescence, whereas luminescence from the triplet excited state ($T^*$) is referred to as phosphorescence. In addition, the statistical generation ratio thereof in the light-emitting element is considered to be as follows: $S^*:T^*=1:3$.

In a compound that emits light from the singlet excited state (hereinafter, referred to as a fluorescent compound), at room temperature, generally light emission from the triplet excited state (phosphorescence) is not observed while only light emission from the singlet excited state (fluorescence) is observed. Therefore, the internal quantum efficiency (the ratio of generated photons to injected carriers) of a light-emitting element using a fluorescent compound is assumed to have a theoretical limit of 25% based on the ratio of $S^*$ to $T^*$ which is 1:3.

In contrast, in a compound that emits light from the triplet excited state (hereinafter, referred to as a phosphorescent compound), light emission from the triplet excited state (phosphorescence) is observed. Further, in a phosphorescent compound, since intersystem crossing (i.e., transfer from a singlet excited state to a triplet excited state) easily occurs, the internal quantum efficiency can be increased to 100% in theory. That is, higher emission efficiency can be achieved than using a fluorescent compound. For this reason, light-emitting elements using phosphorescent compounds are now under active development in order to obtain highly efficient light-emitting elements.

A white light-emitting element disclosed in Patent Document 1 includes a light-emitting region containing a plurality of kinds of light-emitting dopants which emit phosphorescence.

REFERENCE

Patent Document

[Patent Document 1] Japanese Translation of PCT International Application No. 2004-522276

DISCLOSURE OF INVENTION

Although an internal quantum efficiency of 100% in a phosphorescent compound is theoretically possible, such high efficiency can be hardly achieved without optimization of an element structure or a combination with another material. Especially in a light-emitting element which includes a plurality of kinds of phosphorescent compounds having different bands (different emission colors) as light-emitting dopants, it is difficult to obtain highly efficient light emission without not only considering energy transfer but also optimizing the efficiency of the energy transfer. In fact, in Patent Document 1, even when all the light-emitting dopants of a light-emitting element are phosphorescent compounds, the external quantum efficiency is approximately 3% to 4%. It is thus presumed that even when light extraction efficiency is taken into account, the internal quantum efficiency is 20% or lower, which is low for a phosphorescent light-emitting element.

In a multicolor light-emitting element using dopants exhibiting different emission colors (e.g., a white light-emitting element by combination of blue, green, and red), beside improvement of emission efficiency, it is also necessary to attain a good balance between light emissions by the dopants which exhibit different emission colors. It is not easy to keep a balance between light emissions by the dopants and to achieve high emission efficiency at the same time.

In view of the above, an object of one embodiment of the present invention is to provide a light-emitting element which uses a plurality of kinds of light-emitting dopants and has high emission efficiency. Another object of one embodiment of the present invention is to provide a light-emitting device, a display device, an electronic device, and a lighting device each having reduced power consumption by using the above light-emitting element.

It is only necessary that at least one of the above objects be achieved in the present invention.

In one embodiment of the present invention, attention is paid to Förster mechanism, which is one of mechanisms of intermolecular energy transfer, and efficient energy transfer by Förster mechanism is achieved by employing a combination of molecules which makes it possible to obtain an overlap between a crest of an emission spectrum of the molecule which donates energy and a crest including a local maximum on the longest wavelength side of a characteristic curve obtained by multiplying an absorption spectrum of the molecule which receives energy by a wavelength raised to the fourth power. Here, one of the characteristics of the above energy transfer is that the energy transfer is not general energy transfer from a host to a dopant but energy transfer from a dopant to a dopant. The light-emitting element of one embodiment of the present invention can be obtained by employing such a combination of dopants between which energy can be transferred so efficiently and designing an element structure such that dopant molecules are appropriately separated.

That is, one embodiment of the present invention is a light-emitting element including, between a pair of electrodes, a first light-emitting layer in which a first phosphorescent compound is dispersed in a first host material; a second light-emitting layer in which a second phosphorescent compound is dispersed in a second host material; and a third light-emitting layer in which a third phosphorescent compound is dispersed in a third host material. The first phosphorescent compound emits blue light. The second phosphorescent compound has, within a range of 440 nm to 520 nm, a local maximum value A on the longest wavelength side of a function $\epsilon(\lambda)\lambda^4$. The second phosphorescent compound emits light with a wavelength longer than a wavelength of the blue light emitted from the first phosphorescent compound. The third phosphorescent compound has, within a range of 520 nm to 600 nm, a local maximum value B on the longest wavelength side of the function $\epsilon(\lambda)\lambda^4$. The third phosphorescent compound emits light with a wavelength longer than the wavelength of the light emitted from the second phosphorescent compound. The first to third light-emitting layers are stacked in this order. Note that $\epsilon(\lambda)$ denotes a molar absorption coefficient of each of the phosphorescent compounds and is a function of a wavelength $\lambda$.

Another embodiment of the present invention is a light-emitting element including, between a pair of electrodes, a first light-emitting layer in which a first phosphorescent compound is dispersed in a first host material; a second light-emitting layer in which a second phosphorescent compound is dispersed in a second host material; and a third light-emitting layer in which a third phosphorescent compound is dispersed in a third host material. The first phosphorescent compound emits blue light. The second phosphorescent compound has, within a range of 440 nm to 520 nm, a local maximum value A on the longest wavelength side of a function $\epsilon(\lambda)\lambda^4$. The second phosphorescent compound has a peak wavelength of phosphorescence within a range of 520 nm to 600 nm. The third phosphorescent compound has, within a range of 520 nm to 600 nm, a local maximum value B on the longest wavelength side of the function $\epsilon(\lambda)\lambda^4$. The third phosphorescent compound emits light with a wavelength longer than the wavelength of the second phosphorescent compound. The first to third light-emitting layers are stacked in this order. Note that $\epsilon(\lambda)$ denotes a molar absorption coefficient of each of the phosphorescent compounds and is a function of a wavelength $\lambda$.

A further embodiment of the present invention is a light-emitting element having the above structure, in which the local maximum value B is larger than the local maximum value A.

A still further embodiment of the present invention is a light-emitting element having the above structure, in which the first light-emitting layer has an electron-transport property and the second light-emitting layer and the third light-emitting layer each have a hole-transport property.

A yet still further embodiment of the present invention is a light-emitting element having the above structure, in which the first host material has an electron-transport property and the second host material and the third host material each have a hole-transport property.

A yet still further embodiment of the present invention is a light-emitting element having the above structure, in which the first light-emitting layer has a hole-transport property and the second light-emitting layer and the third light-emitting layer each have an electron-transport property.

A yet still further embodiment of the present invention is a light-emitting element having the above structure, in which the first host material has a hole-transport property and the second host material and the third host material each have an electron-transport property.

A yet still further embodiment of the present invention is a light-emitting element having the above structure, in which the first to third light-emitting layers are stacked in this order, and are in contact with each other.

A yet still further embodiment of the present invention is a light-emitting element having the above structure, in which the second light-emitting layer has a thickness of greater than or equal to 5 nm and less than or equal to 20 nm, preferably greater than or equal to 5 nm and less than or equal to 10 nm.

A yet still further embodiment of the present invention is a light-emitting device, a light-emitting display device, an electronic device, and a lighting device each including a light-emitting element having the above structure.

Note that the light-emitting device in this specification includes, in its category, an image display device using a light-emitting element. Further, the category of the light-emitting device in this specification includes a module in which a light-emitting element is provided with a connector such as an anisotropic conductive film or a TCP (tape carrier package); a module in which the top of the TCP is provided with a printed wiring board; and a module in which an IC (integrated circuit) is directly mounted on a light-emitting element by a COG (chip on glass) method. Furthermore, the category includes light-emitting devices that are used in lighting equipment or the like.

One embodiment of the present invention provides a light-emitting element having high emission efficiency. By using the light-emitting element, another embodiment of the present invention provides a light-emitting device, a light-emitting display device, an electronic device, and a lighting device each having reduced power consumption.

BRIEF DESCRIPTION OF DRAWINGS

FIGS. 1A to 1C are conceptual diagrams of light-emitting elements.

FIGS. 6A and 6B are conceptual diagrams of an active matrix light-emitting device.

FIGS. 11A, 11B1, 11B2, 11C, and 11D each illustrate an electronic device.

BEST MODE FOR CARRYING OUT THE INVENTION

Figure 2:
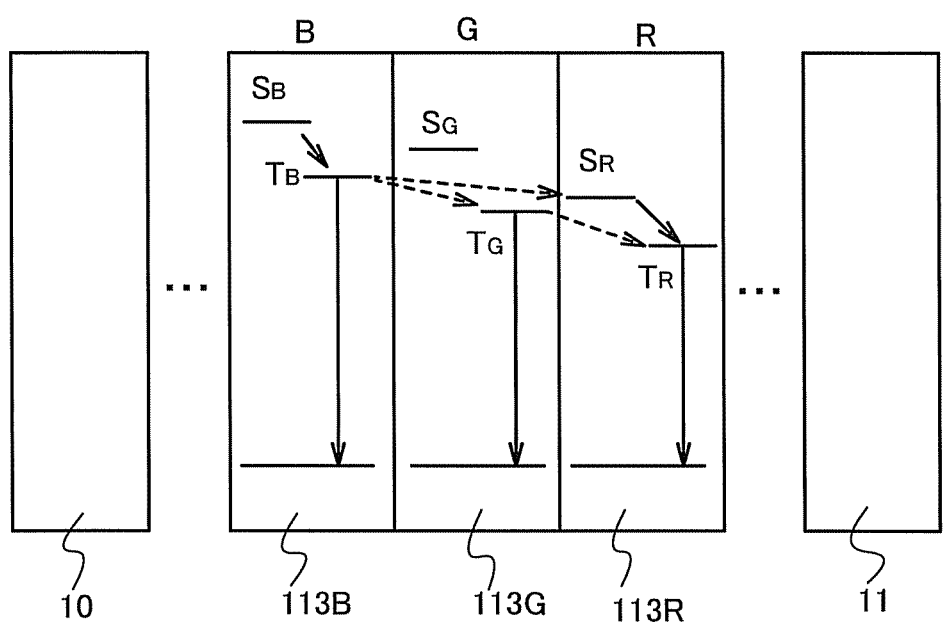
FIG. 2 illustrates energy transfer in light-emitting layers.

Hereinafter, embodiments of the present invention will be described in detail with reference to the drawings. Note that the present invention is not limited to the description given below, and it will be easily understood by those skilled in the art that various changes and modifications can be made without departing from the spirit and scope of the present invention. Therefore, the present invention should not be interpreted as being limited to the description of the embodiments given below.

Embodiment 1

An operation principle of a light-emitting element of one embodiment of the present invention will be described. The point of the present invention is that a first phosphorescent compound emitting blue light (specifically, a phosphorescent compound having an emission peak at 440 nm to 520 nm, or a phosphorescent compound emitting light of a color in a color gamut in which a CIE chromaticity (x, y) is $0.12 \leq x \leq 0.25$ and $0.05 \leq y \leq 0.5$) and second and third phosphorescent compounds emitting light (e.g., green light or red light) with wavelengths longer than the wavelength of the blue light emitted from the first phosphorescent compound are used and all of the first to third phosphorescent compounds are made to emit light efficiently, whereby a multicolor light-emitting element with high efficiency is obtained.

As a general method for obtaining a multicolor light-emitting element including a phosphorescent compound, a method can be given in which a plurality of kinds of phosphorescent compounds having different emission colors are dispersed in some host material in an appropriate ratio. However, in such a method, the phosphorescent compound which emits light with the longest wavelength readily emits light, so that it is extremely difficult to design and control a structure (especially the concentrations of the phosphorescent compounds in the host material) for obtaining polychromatic light.

As another technique for obtaining a multicolor light-emitting element, what is called a tandem structure, in which light-emitting elements having different emission colors are stacked in series, can be given. For example, a blue light-emitting element, a green light-emitting element, and a red light-emitting element are stacked in series and made to emit light at the same time, whereby polychromatic light (in this case, white light) can be easily obtained. The element structure can be relatively easily designed and controlled because the blue light-emitting element, the green light-emitting element, and the red light-emitting element can be independently optimized. However, the stacking of three elements accompanies an increase in the number of layers and makes the fabrication complicated. In addition, when a problem occurs in electrical contact at connection portions between the elements (what is called intermediate layers), an increase in drive voltage, i.e., power loss might be caused.

In contrast, in the light-emitting element of one embodiment of the present invention, between the pair of electrodes are provided the first light-emitting layer in which the first phosphorescent compound emitting blue light is dispersed in the first host material, the second light-emitting layer in which the second phosphorescent compound emitting light with a wavelength longer than that of light emitted from the first phosphorescent compound is dispersed in the second host material, and the third light-emitting layer in which the third phosphorescent compound emitting light with a wavelength longer than that of light emitted from the second phosphorescent compound is dispersed in the third host material. The first to third light-emitting layers are stacked in this order. Here, unlike the case of a tandem structure, the first to third light-emitting layers may be provided in contact with each other.

An element structure of the above-described light-emitting element of one embodiment of the present invention is schematically illustrated in FIGS. 1A to 1C. In FIG. 1C, a first electrode 101, a second electrode 102, and an EL layer 103 are illustrated. The EL layer 103 includes at least a light-emitting layer 113 and other layers may be provided as appropriate. In the structure illustrated in FIG. 1C, a hole-injection layer 111, a hole-transport layer 112, an electron-transport layer 114, and an electron-injection layer 115 are assumed to be provided. Note that it is assumed that the first electrode 101 functions as an anode and the second electrode 102 functions as a cathode.

FIGS. 1A and 1B are each an enlarged view of the light-emitting layer 113 in the light-emitting element. In each of FIGS. 1A and 1B, a first light-emitting layer 113B, a second light-emitting layer 113G, a third light-emitting layer 113R, the light-emitting layer 113 which is a combination of the three layers, a first phosphorescent compound 113Bd, a second phosphorescent compound 113Gd, a third phosphorescent compound 113Rd, a first host material 113Bh, a second host material 113Gh, a third host material 113Rh, and a recombination region 113ex are illustrated. FIG. 1A is a schematic diagram illustrating the case where the first light-emitting layer 113B is provided on the cathode side and FIG. 1B is a schematic diagram illustrating the case where the first light-emitting layer 113B is provided on the anode side. In either case, the phosphorescent compounds (the first to third phosphorescent compounds) are dispersed in the host materials so that the phosphorescent compounds are separated from each other by the host materials. Note that the first to third host materials may be the same or different from each other.

In that case, between the phosphorescent compounds, energy transfer by electron exchange interaction (what is called Dexter mechanism) is suppressed. In other words, a phenomenon in which after the first phosphorescent compound 113Bd is excited, the excitation energy is transferred to the second phosphorescent compound 113Gd or the third phosphorescent compound 113Rd by Dexter mechanism can be prevented. Further, a phenomenon in which after the second phosphorescent compound 113Gd is excited, the excitation energy is transferred to the third phosphorescent compound 113Rd by Dexter mechanism can also be prevented. Thus, a phenomenon in which the third phosphorescent compound 113Rd emitting light with the longest wavelength mainly emits light can be suppressed. Note that the third phosphorescent compound 113Rd mainly emits light also in the case where an exciton is directly generated in the third light-emitting layer 113R; therefore, it is preferable that the recombination region 113ex of carriers be in the first light-emitting layer 113B or near the interface between the first light-emitting layer 113B and the second light-emitting layer 113G (i.e., the first phosphorescent compound 113Bd be mainly excited).

Note that if energy transfer from the first phosphorescent compound 113Bd is completely suppressed, in turn, light emission from the third phosphorescent compound 113Rd cannot be obtained. Thus, in one embodiment of the present invention, element design is performed such that excitation energy of the first phosphorescent compound 113Bd which emits blue light is partly transferred to the second phosphorescent compound 113Gd and excitation energy of the second phosphorescent compound 113Gd is partly transferred to the third phosphorescent compound 113Rd. Such energy transfer between separated molecules becomes possible by utilizing dipole-dipole interaction (Förster mechanism).

Here, Förster mechanism is described. The molecule which donates excitation energy and the molecule which receives excitation energy are hereinafter referred to as an energy donor and an energy acceptor, respectively. That is, in one embodiment of the present invention, both the energy donor and the energy acceptor are phosphorescent compounds and are separated from each other by the host materials.

In Förster mechanism, direct intermolecular contact is not necessary for energy transfer. Through a resonant phenomenon of dipolar oscillation between an energy donor and an energy acceptor, energy transfer occurs. The resonant phenomenon of dipolar oscillation causes the energy donor to donate energy to the energy acceptor; thus, the energy donor in an excited state relaxes to a ground state and the energy acceptor in a ground state is excited. The rate constant $k_F$ of energy transfer by Förster mechanism is expressed by a formula (1).

[Formula 1]

$$k_F = \frac{9000c^4 K^2 \phi \ln 10}{128\pi^5 n^4 N \tau R^6} \int \frac{F(v)\varepsilon(v)}{v^4} dv \quad (1)$$

In the formula (1), $v$ denotes a frequency, $F(v)$ denotes a normalized emission spectrum of an energy donor (a fluorescence spectrum in energy transfer from a singlet excited state, and a phosphorescence spectrum in energy transfer from a triplet excited state), $\varepsilon(v)$ denotes a molar absorption coefficient of an energy acceptor, N denotes Avogadro's number, n denotes a refractive index of a medium, R denotes an intermolecular distance between the energy donor and the energy acceptor, $\tau$ denotes a measured lifetime of an excited state (fluorescence lifetime or phosphorescence lifetime), c denotes the speed of light, $\phi$ denotes a luminescence quantum yield (a fluorescence quantum yield in energy transfer from a singlet excited state, and a phosphorescence quantum yield in energy transfer from a triplet excited state), and $K^2$ denotes a coefficient (0 to 4) of orientation of a transition dipole moment between the energy donor and the energy acceptor. Note that $K^2 = 2/3$ in random orientation.

As the formula (1) suggests, the following can be given as necessary conditions for energy transfer by Förster mechanism (Förster energy transfer): 1. the energy donor and the energy acceptor are not too far apart from each other (which relates to the distance R); 2. the energy donor emits light (which relates to the luminescence quantum yield $\phi$); and 3. an emission spectrum of the energy donor overlaps with an absorption spectrum of the energy acceptor (which relates to the integral term).

Here, as already described with reference to FIGS. 1A to 1C, the phosphorescent compounds (the first to third phosphorescent compounds) are dispersed in the respective host materials and separated from each other by the host materials; thus, the distance R is at least one molecule length or longer (i.e., 1 nm or more). Therefore, the excitation energy generated in the first phosphorescent compound is not entirely transferred to the second or third phosphorescent compound by Förster mechanism. Meanwhile, Förster energy transfer to the distance R can occur when R is less than or equal to approximately 10 nm to 20 nm, which means that, for example, setting the thickness of the second light-emitting layer 113G to 20 nm or less in FIGS. 1A and 1B allows energy to be partly transferred, so that all of the first phosphorescent compound 113Bd, the second phosphorescent compound 113Gd, and the third phosphorescent compound 113Rd can be made to emit light.

FIG. 2 schematically illustrates Förster energy transfer between the phosphorescent compounds in the light-emitting element of one embodiment of the present invention, in which the first phosphorescent compound 113Bd emitting blue light, the second phosphorescent compound 113Gd emitting light (e.g., green light) with a wavelength longer than that of light emitted from the first phosphorescent compound, and the third phosphorescent compound 113Rd emitting light (e.g., red light) with a wavelength longer than that of light emitted from the second phosphorescent compound 113Gd are included. In FIG. 2, a structure in which the first light-emitting layer 113B, the second light-emitting layer 113G, and the third light-emitting layer 113R are stacked between an electrode 10 and an electrode 11 is illustrated. Note that one of the electrode 10 and the electrode 11 functions as an anode and the other functions as a cathode. As illustrated in FIG. 2, first, a singlet excited state formed in the first phosphorescent compound 113Bd ($S_B$) is converted into a triplet excited state ($T_B$) by intersystem crossing. In other words, an exciton in the first light-emitting layer 113B is basically brought into $T_B$.

Then, the energy of the exciton in the $T_B$ state, some of which is converted into blue light emission, can be partly transferred to the triplet excited state of the second phosphorescent compound 113Gd ($T_G$) by Förster mechanism. This results from the fact that the first phosphorescent compound 113Bd has a light-emitting property (has a high phosphorescence quantum yield $\phi$) and that direct absorption, which corresponds to electron transition from a singlet ground state to a triplet excited state, is observed in the second phosphorescent compound 113Gd (an absorption spectrum of a triplet excited state exists). When these conditions are fulfilled, triplet-triplet Förster energy transfer from $T_B$ to $T_G$ is possible. Further, energy transfer from $T_B$ to a singlet excited state of the third phosphorescent compound 113Rd ($S_R$) can occur as long as the conditions for Förster energy transfer are fulfilled, though the contribution is slight. This energy transfer easily occurs in the case where the third phosphorescent compound 113Rd is a red light-emitting material, as described later. By intersystem crossing, $S_R$ is converted into a triplet excited state of the third phosphorescent compound 113Rd ($T_R$) to contribute to emission by the third phosphorescent compound 113Rd. Note that since the energy donor in Förster mechanism (here, the first phosphorescent compound 113Bd) needs to have a light-emitting property, the phosphorescence quantum yield of the first phosphorescent compound 113Bd is preferably 0.1 or more.

Note that a singlet excited state of the second phosphorescent compound 113Gd ($S_G$) has higher energy than the triplet excited state of the first phosphorescent compound 113Bd ($T_B$) in many cases and therefore does not contribute to the above energy transfer so much in many cases. For this reason, the description is omitted here.

Further, the energy of an exciton in the triplet $T_G$ state in the second phosphorescent compound 113Gd, some of which is converted into light emission (e.g., green light emission), can be partly transferred to the triplet excited state of the third phosphorescent compound 113Rd ($T_R$) by Förster mechanism. This results from the fact that the second phosphorescent compound 113Gd has a light-emitting property (has a high phosphorescence quantum yield $\phi$) and that direct absorption, which corresponds to electron transition from a singlet ground state to a triplet excited state, is observed in the third phosphorescent compound 113Rd (an absorption spectrum of a triplet excited state exists). When these conditions are fulfilled, triplet-triplet Förster energy transfer from $T_G$ to $T_R$ is possible. Note that since the energy donor in Förster mechanism (here, the second phosphorescent compound 113Gd) needs to have a light-emitting property, the phosphorescence quantum yield of the second phosphorescent compound 113Gd is preferably 0.1 or more.

The $T_R$ which results from such energy transfer is converted into light emission by the third phosphorescent compound 113Rd (e.g., red light emission). In this manner, light emission can be obtained from each of the first to third phosphorescent compounds.

Note that to make the above Förster energy transfer efficiently occur between the phosphorescent compounds serving as the dopants, not to the host materials, it is preferable that absorption spectra of the first to third host materials be not in the blue wavelength range. Specifically, an absorption edge of the absorption spectrum is preferably at 440 nm or less. In this manner, energy is transferred directly between dopants without being transferred through the host material (specifically, the second or third host material), so that formation of an extra path of energy transfer is suppressed and high emission efficiency can be achieved.

Further, the first host material preferably has a triplet excitation energy higher than that of the first phosphorescent compound so as not to quench the first phosphorescent compound which emits blue light.

As described above, a basic concept of one embodiment of the present invention is an element structure in which the first phosphorescent compound emitting light with the shortest wavelength is mainly excited in a state where the first to third phosphorescent compounds are separated from each other with the use of the host materials and the stacked-layer structure. Since energy is partly transferred by Förster mechanism to a certain distance (20 nm or less) in such an element structure, excitation energy of the first phosphorescent compound which emits blue light is partly transferred to the second phosphorescent compound, and further, excitation energy of the second phosphorescent compound is partly transferred to the third phosphorescent compound. As a result, light emission from each of the first to third phosphorescent compounds can be obtained.

Here, what is more important in one embodiment of the present invention is that the materials and the element structure are determined in consideration of the above energy transfer.

To make Förster energy transfer occur, the energy donor needs to have a high luminescence quantum yield $\phi$. In terms of the luminescence quantum yield, there is no problem in one embodiment of the present invention since a phosphorescent compound (specifically, a light-emitting compound with a phosphorescence quantum yield of 0.1 or more) is used. An important point is that the integral term of the formula (1) is made large, i.e., an emission spectrum F(v) of the energy donor is made to properly overlap with the molar absorption coefficient $\epsilon$(v) of the energy acceptor.

In general, it is thought that the emission spectrum F(v) of the energy donor simply needs to overlap with a wavelength range in which the molar absorption coefficient $\epsilon$(v) of the energy acceptor is large (i.e., the product of F(v) and $\epsilon$(v) simply needs to be large). However, this does not necessarily apply to Förster mechanism because the integral term in the formula (1) is inversely proportional to the frequency v raised to the fourth power to have wavelength dependence.

For easier understanding, here, the formula (1) is transformed. Since v=c/λ, where λ denotes a wavelength of light, the formula (1) can be transformed into a formula (2).

[Formula 2]

$$k_F = \frac{9000K^2 \phi \ln 10}{128\pi^5 n^4 N \tau R^6} \int F(\lambda)\varepsilon(\lambda)\lambda^4 d\lambda \quad (2)$$

In other words, it can be found that the longer the wavelength λ is, the larger the integral term is. In simpler terms, it is indicated that energy transfer occurs more easily on a longer wavelength side. That is, this is not so simple that F(λ) needs to overlap with the wavelength range in which the molar absorption coefficient ε(λ) is large. It is necessary that F(λ) overlap with a range in which $\varepsilon(\lambda)\lambda^4$ is large.

Thus, in the light-emitting element of one embodiment of the present invention, in order to increase efficiency of energy transfer from the first phosphorescent compound 113Bd which emits blue light (specifically, a phosphorescent compound having an emission peak at 440 nm to 520 nm), a phosphorescent compound which has, within a range of 440 nm to 520 nm, a local maximum value A on the longest wavelength side of the function $\varepsilon(\lambda)\lambda^4$, and which emits light with a wavelength longer than that of light emitted from the first phosphorescent compound 113Bd (specifically, a phosphorescent compound having an emission peak at 520 nm to 600 nm) is used as the second phosphorescent compound 113Gd. Further, in order to increase efficiency of energy transfer from the second phosphorescent compound 113Gd, a phosphorescent compound which has, within a range of 520 nm to 600 nm, a local maximum value B on the longest wavelength side of the function $\varepsilon(\lambda)\lambda^4$, and which emits light with a wavelength longer than that of light emitted from the second phosphorescent compound 113Gd is used as the third phosphorescent compound 113Rd. Note that the use of the phosphorescent compounds emitting light in the above manner allows lightings to provide light having a high color rendering property, and displays to efficiently emit light having a high chromaticity.

For better understanding of such structures of phosphorescent compounds (especially the local maximum values A and B), explanation is made below referring to specific examples. Here, as an example, a case is described where a compound (1) shown below (tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)₃)) is used as the first phosphorescent compound 113Bd which emits blue light; a compound (2) shown below ((acetylacetonato)bis(6-tert-butyl-4-phenylpyrimidinato)iridium(III) (abbreviation: Ir(tBuppm)₂(acac))) is used as the second phosphorescent compound 113Gd which emits light (green light) with a wavelength longer than that of light emitted from the first phosphorescent compound 113Bd; and a compound (3) shown below (bis(2,3,5-triphenylpyrazinato)(dipivaloylmethanato)iridium(III) (abbreviation: Ir(tppr)₂(dpm))) is used as the third phosphorescent compound 113Rd which emits light (red light) with a wavelength longer than that of light emitted from the second phosphorescent compound 113Gd.

[Chemical formula 1]

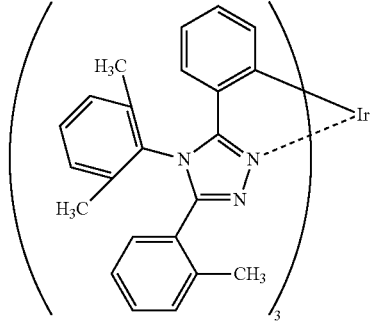
compound(1)

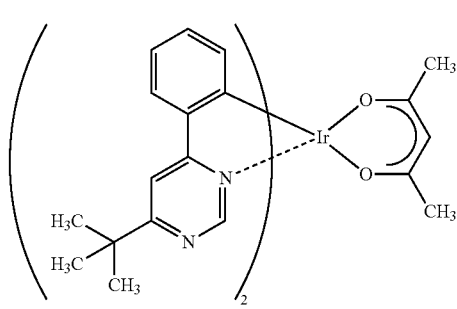
compound(2)

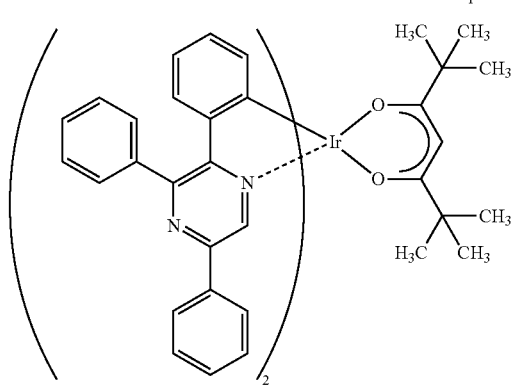
compound(3)

Figure 3A:
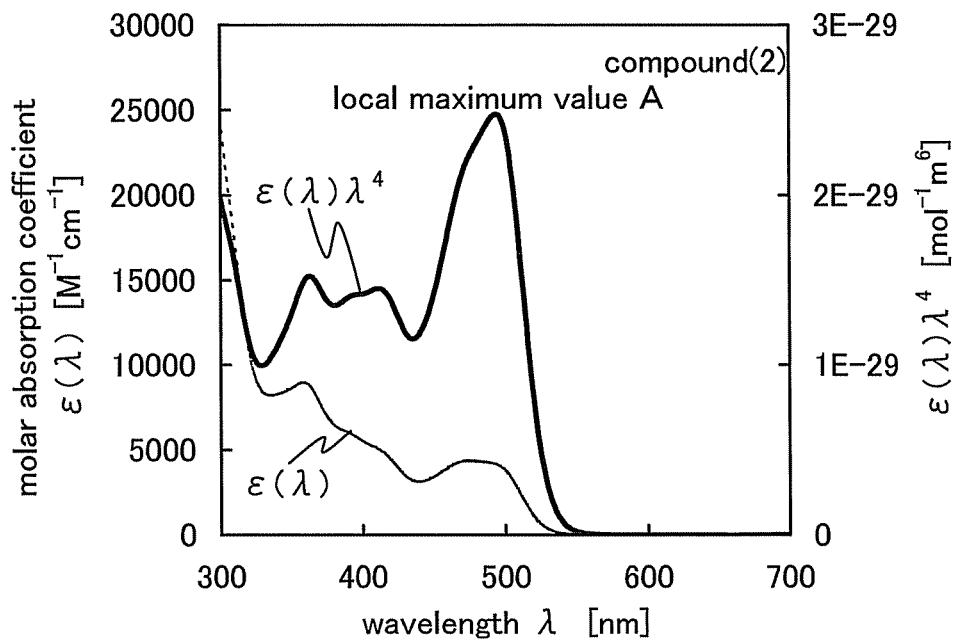
FIGS. 3A and 3B explain Förster energy transfer from a blue phosphorescent compound.

FIG. 3A shows a molar absorption coefficient ε(λ) and $\varepsilon(\lambda)\lambda^4$ of the compound (2) that is the second phosphorescent compound. The molar absorption coefficient ε(λ) gets smaller on a longer wavelength side, but $\varepsilon(\lambda)\lambda^4$ has the local maximum value A at around 490 nm (which corresponds to the triplet MLCT absorption band of the compound (2)). As can be seen from this example, affected by the term $\lambda^4$, $\varepsilon(\lambda)\lambda^4$ of the second phosphorescent compound has the local maximum value A in the absorption band (triplet MLCT absorption band) located on the longest wavelength side.

Figure 3B:
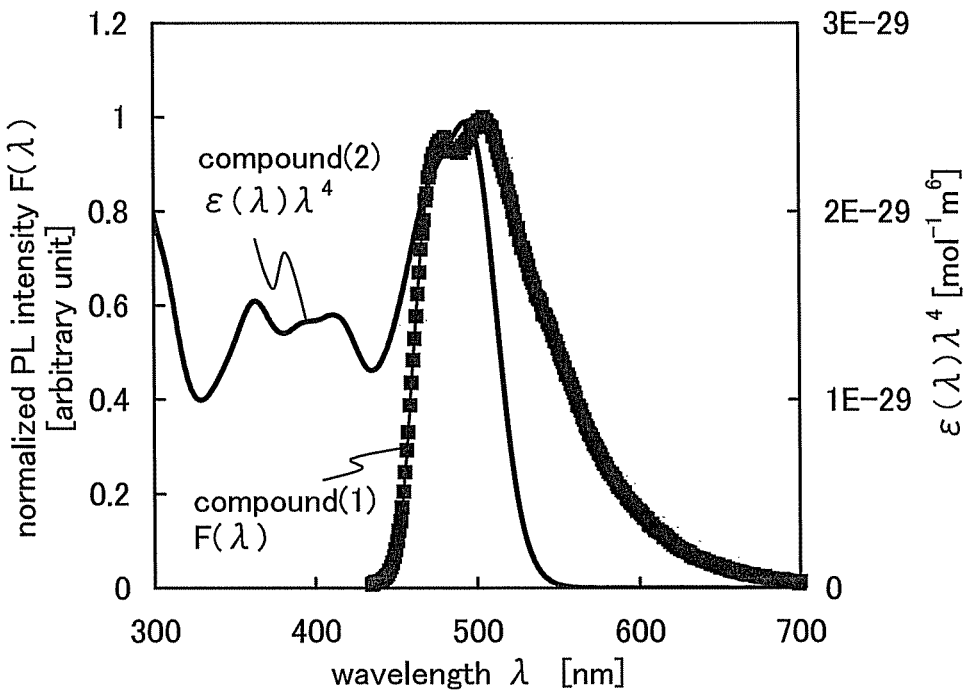

FIG. 3B shows a photoluminescence (PL) spectrum F(λ) of the compound (1) and $\varepsilon(\lambda)\lambda^4$ of the compound (2). The compound (1) is the first phosphorescent compound and emits blue light with emission peaks at around 475 nm and 505 nm. Around the local maximum value A of $\varepsilon(\lambda)\lambda^4$ of the second phosphorescent compound, the PL spectrum F(λ) of the first phosphorescent compound largely overlaps with $\varepsilon(\lambda)\lambda^4$, and energy transfer from the first phosphorescent compound to the second phosphorescent compound occurs by Förster mechanism. Note that in this case, since the local maximum value A corresponds to the triplet MLCT absorption band, the energy transfer is the triplet-triplet Förster energy transfer ($T_B$-$T_G$ energy transfer in FIG. 2).

Figure 4A:
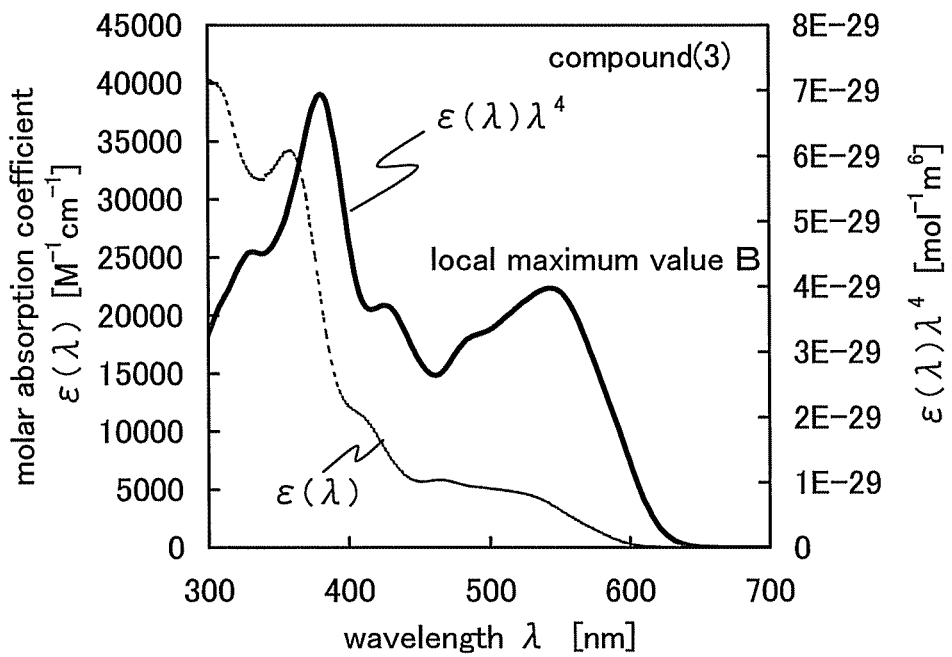
FIGS. 4A and 4B explain Förster energy transfer from a blue phosphorescent compound.

FIG. 4A shows a molar absorption coefficient $\epsilon(\lambda)$ and $\epsilon(\lambda)\lambda^4$ of the compound (3) that is the third phosphorescent compound. The molar absorption coefficient $\epsilon(\lambda)$ gets smaller on a longer wavelength side, but $\epsilon(\lambda)\lambda^4$ has the local maximum value B at around 550 nm (which corresponds to the triplet MLCT absorption band of the compound (3)). As can be seen from this example, affected by the term $\lambda^4$, $\epsilon(\lambda)\lambda^4$ of the third phosphorescent compound has the local maximum value B in the absorption band (triplet MLCT absorption band) located on the longest wavelength side.

Figure 4B:
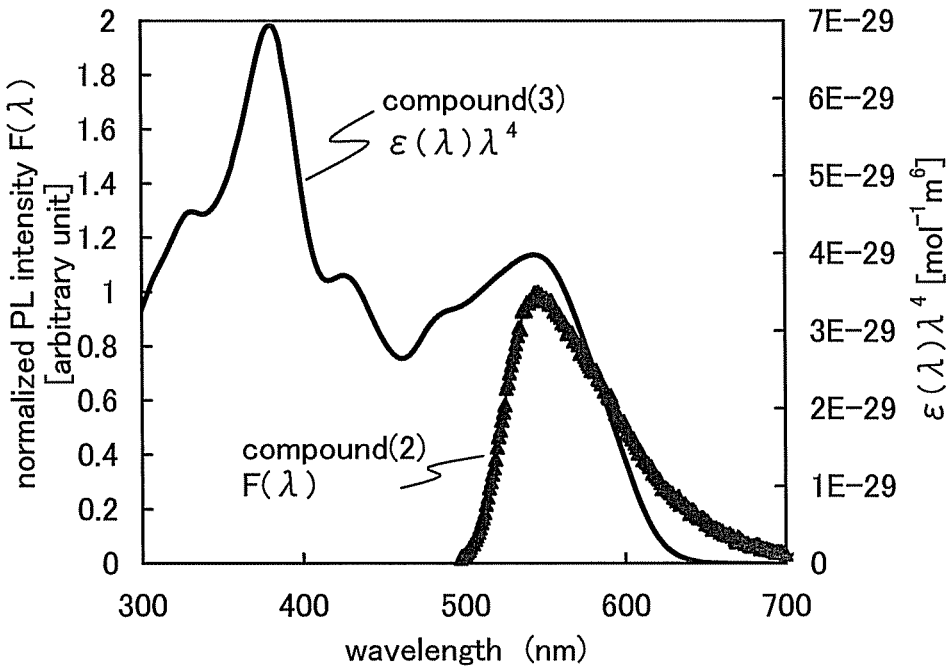

FIG. 4B shows a photoluminescence (PL) spectrum $F(\lambda)$ of the compound (2) and $\epsilon(\lambda)\lambda^4$ of the compound (3). The compound (2) is the second phosphorescent compound and emits green light with an emission peak at around 545 nm. Around the local maximum value B of $\epsilon(\lambda)\lambda^4$ of the third phosphorescent compound, the PL spectrum $F(\lambda)$ of the second phosphorescent compound largely overlaps with $\epsilon(\lambda)\lambda^4$, and energy transfer from the second phosphorescent compound to the third phosphorescent compound occurs by Förster mechanism. Note that in this case, since the local maximum value B corresponds to the triplet MLCT absorption band, the energy transfer is the triplet-triplet Förster energy transfer ($T_G$-$T_R$ energy transfer in FIG. 2).

Note that from the above, it is preferable that absorption spectra of the second and third phosphorescent compounds show, on the longest wavelength side, direct absorption which corresponds to electron transition from a singlet ground state to a triplet excited state (e.g., triplet MLCT absorption). Such a structure leads to high efficiency of triplet-triplet energy transfer shown in FIG. 2.

Figure 5:
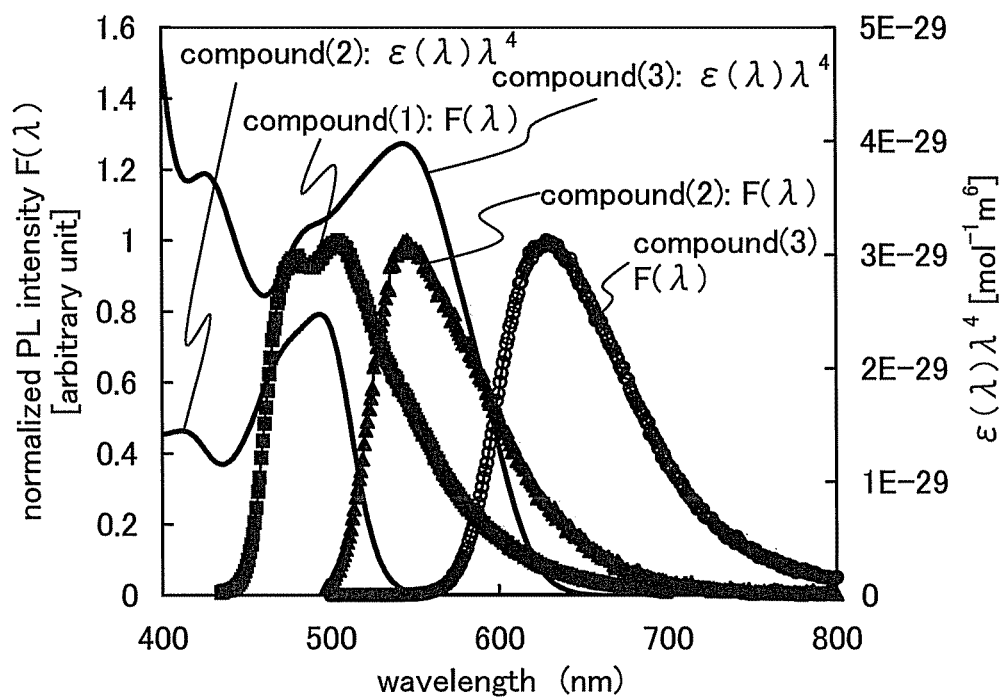
FIG. 5 explains Förster energy transfer from a blue phosphorescent compound.

Here, FIG. 5 shows a PL spectrum of the compound (3) that is the third phosphorescent compound together with a combination of FIG. 3B and FIG. 4B. It can be found that energy can be transferred stepwise first from the compound (1) to the compound (2) by utilizing the overlap between the PL spectrum of the compound (1) and $\epsilon(\lambda)\lambda^4$ of the compound (2) (around the local maximum value A), and then from the compound (2) to the compound (3) by utilizing the overlap between the PL spectrum of the compound (2) and $\epsilon(\lambda)\lambda^4$ of the compound (3) (around the local maximum value B). Note that direct energy transfer from the compound (1) that is the first phosphorescent compound to the compound (3) that is the third phosphorescent compound is also possible. The reason for this is that, as can be seen from FIG. 5, the PL spectrum $F(\lambda)$ of the compound (1) and $\epsilon(\lambda)\lambda^4$ of the compound (3) overlap with each other on a shorter wavelength side than the triplet MLCT absorption band (around the local maximum value B) of the compound (3), and existence of triplet-singlet Förster energy transfer ($T_B$-$S_R$ energy transfer in FIG. 2) is suggested.

An important finding in FIGS. 3A and 3B, FIGS. 4A and 4B, and FIG. 5 is that owing to the influence of $\lambda^4$, the third phosphorescent compound more easily receives energy (more easily becomes an energy acceptor) than the second phosphorescent compound. The second phosphorescent compound and the third phosphorescent compound have substantially the same molar absorption coefficient $\epsilon(\lambda)$ of the triplet MLCT absorption band on the longest wavelength side, which is approximately 5000 [$M^{-1}cm^{-1}$]. Nevertheless, as can be seen from FIG. 5, when the local maximum value A and the local maximum value B of $\epsilon(\lambda)\lambda^4$ are compared to each other, the local maximum value B is about 1.6 times as large as the local maximum value A. This is due to the influence of the term $\lambda^4$, and it is indicated that $\epsilon(\lambda)\lambda^4$ tends to be large in a compound which has an absorption band on a longer wavelength side. Thus, it is shown that the third phosphorescent compound receives energy more easily than the second phosphorescent compound.

In view of the above, attention is focused on an element structure (which is as illustrated in FIGS. 1A to 1C) in which the first to third light-emitting layers are stacked in this order and the recombination region of carriers is in the first light-emitting layer or in the vicinity of the interface between the first light-emitting layer and the second light-emitting layer (that is, the first phosphorescent compound is mainly excited). With such an element structure, the third light-emitting layer containing the third phosphorescent compound is further apart from the recombination region of carriers than the second light-emitting layer containing the second phosphorescent compound is. In this manner, the third phosphorescent compound, which easily receives energy, is positioned far apart from the recombination region, and the second phosphorescent compound, which does not relatively easily receive energy, is positioned near the recombination region, whereby light emissions by the first to third phosphorescent compounds can be achieved in a good balance. As a result, a light-emitting element with high emission efficiency and a good balance of spectra can be obtained.

Note that to obtain the above-described recombination region, the first light-emitting layer preferably has an electron-transport property and the second light-emitting layer and the third light-emitting layer preferably have hole-transport properties (FIG. 1A). Specifically, a material having an electron-transport property can be used as the first host material and a material having a hole-transport property can be used as the second host material and the third host material, for example.

Note that in another embodiment for obtaining the above-described recombination region, the first light-emitting layer preferably has a hole-transport property and the second light-emitting layer and the third light-emitting layer preferably have electron-transport properties (FIG. 1B). Specifically, a material having a hole-transport property can be used as the first host material and a material having an electron-transport property can be used as the second host material and the third host material, for example.

In addition, in order to make both the second light-emitting layer and the third light-emitting layer provide light emission, the thickness of the second light-emitting layer is preferably set to be greater than or equal to 5 nm and less than or equal to 20 nm in consideration of the distance R of Förster energy transfer. More preferably, the thickness is set to be greater than or equal to 5 nm and less than or equal to 10 nm.

Embodiment 2

In this embodiment, a detailed example of the structure of the light-emitting element described in Embodiment 1 will be described below with reference to FIGS. 1A to 1C.

A light-emitting element in this embodiment includes, between a pair of electrodes, an EL layer including a plurality of layers. In this embodiment, the light-emitting element includes the first electrode 101, the second electrode 102, and the EL layer 103, which is provided between the first electrode 101 and the second electrode 102. Note that in this embodiment, description is made on the assumption that the first electrode 101 functions as an anode and that the second electrode 102 functions as a cathode. In other words, when a voltage is applied between the first electrode 101 and the second electrode 102 so that the potential of the first electrode 101 is higher than that of the second electrode 102, light emission can be obtained.

Since the first electrode 101 functions as the anode, the first electrode 101 is preferably formed using any of metals, alloys, electrically conductive compounds with a high work function (specifically, a work function of 4.0 eV or more), mixtures thereof, and the like. Specifically, for example, indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like can be given. Films of these electrically conductive metal oxides are usually formed by a sputtering method but may be formed by application of a sol-gel method or the like. In an example of the formation method, indium oxide-zinc oxide is deposited by a sputtering method using a target obtained by adding 1 wt % to 20 wt % of zinc oxide to indium oxide. Further, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Besides, gold (Au), platinum (Pt), nickel (Ni), tungsten (W), chromium (Cr), molybdenum (Mo), iron (Fe), cobalt (Co), copper (Cu), palladium (Pd), nitrides of metal materials (e.g., titanium nitride), and the like can be given. Graphene can also be used. Note that when a composite material described later is used for a layer which is in contact with the first electrode 101 in the EL layer 103, an electrode material can be selected regardless of its work function.

There is no particular limitation on the stacked-layer structure of the EL layer 103 as long as the EL layer includes the light-emitting layer 113 which has a structure similar to that described in Embodiment 1. For example, the EL layer 103 can be formed by combining a hole-injection layer, a hole-transport layer, the light-emitting layer, an electron-transport layer, an electron-injection layer, a carrier-blocking layer, an intermediate layer, and the like as appropriate. In this embodiment, the EL layer 103 has a structure in which the hole-injection layer 111, the hole-transport layer 112, the light-emitting layer 113, the electron-transport layer 114, and the electron-injection layer 115 are stacked in this order over the first electrode 101. Materials included in the layers are specifically given below.

The hole-injection layer 111 is a layer containing a substance having a high hole-injection property. Molybdenum oxide, vanadium oxide, ruthenium oxide, tungsten oxide, manganese oxide, or the like can be used. Alternatively, the hole-injection layer 111 can be formed using a phthalocyanine-based compound such as phthalocyanine (abbreviation: $H_2Pc$) or copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), a high molecular compound such as poly(ethylenedioxythiophene)/poly(styrenesulfonic acid) (PEDOT/PSS), or the like.

Alternatively, a composite material in which a substance having a hole-transport property contains a substance having an acceptor property can be used for the hole-injection layer 111. Note that the use of such a substance having a hole-transport property which contains a substance having an acceptor property enables selection of a material used to form an electrode regardless of its work function. In other words, besides a material having a high work function, a material having a low work function can also be used for the first electrode 101. As the substance having an acceptor property, 7,7,8,8-tetracyano-2,3,5,6-tetrafluoroquinodimethane (abbreviation: $F_4$-TCNQ), chloranil, and the like can be given. In addition, transition metal oxides can be given. Oxides of the metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable in that their electron-accepting property is high. Among these, molybdenum oxide is especially preferable in that it is stable in the air, has a low hygroscopic property, and is easily treated.

As the substance having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably an organic compound having a high hole-transport property. Specifically, a substance having a hole mobility of $10^{-6}$ cm$^2$/Vs or more is preferably used. Organic compounds that can be used as the substance having a hole-transport property in the composite material are specifically given below.

Examples of the aromatic amine compounds are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivatives that can be used for the composite material are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivatives that can be used for the composite material are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbons that can be used for the composite material are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can also be used. The aromatic hydrocarbon which has a hole mobility higher than or equal to $1 \times 10^{-6}$ cm$^2$/Vs and which has 14 to 42 carbon atoms is particularly preferable.

Note that the aromatic hydrocarbons that can be used for the composite material may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

A high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: poly-TPD) can also be used.

By providing a hole-injection layer, a high hole-transport property can be achieved to allow a light-emitting element to have a small drive voltage.

The hole-transport layer 112 is a layer that contains a substance having a hole-transport property. Examples of the substance having a hole-transport property are aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), and the like. The substances mentioned here have high hole-transport properties and are mainly ones that have a hole mobility of $10^{-6}$ cm$^2$/Vs or more. An organic compound given as an example of the substance having a hole-transport property in the composite material described above can also be used for the hole-transport layer 112. A high molecular compound such as poly(N-vinylcarbazole) (abbreviation: PVK) or poly(4-vinyltriphenylamine) (abbreviation: PVTPA) can also be used. Note that the layer that contains a substance having a hole-transport property is not limited to a single layer, and may be a stack of two or more layers including any of the above substances.

The light-emitting layer 113 is a layer containing a light-emitting substance. Since the light-emitting layer 113 has a structure similar to that described in Embodiment 1, the light-emitting element in this embodiment can have an extremely high emission efficiency. Embodiment 1 is to be referred to for the structure and the materials of the light-emitting layer 113.

There is no particular limitation on a material that can be used as the light-emitting substance or an emission center substance in the light-emitting layer 113. The following can be given as examples of the above light-emitting substance or emission center substance.

A compound which emits blue light is preferably used as the first phosphorescent compound, and for example, a phosphorescent compound having an emission peak at 440 nm to 520 nm can be selected. The following are the specific examples: an organometallic iridium complex having a 4H-triazole skeleton such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), or tris[4-(3-biphenyl)-5-isopropyl-3-phenyl-4H-1,2,4-triazolato]iridium(III) (abbreviation: Ir(iPrptz-3b)$_3$); an organometallic iridium complex having a 1H-triazole skeleton such as tris[3-methyl-1-(2-methylphenyl)-5-phenyl-1H-1,2,4-triazolato]iridium(III) (abbreviation: Ir(Mptz1-mp)$_3$), or tris(1-methyl-5-phenyl-3-propyl-1H-1,2,4-triazolato)iridium(III) (abbreviation: Ir(Prptz1-Me)$_3$); an organometallic iridium complex having an imidazole skeleton such as fac-tris[1-(2,6-diisopropylphenyl)-2-phenyl-1H-imidazole]iridium(III) (abbreviation: Ir(iPrpmi)$_3$) or tris[3-(2,6-dimethylphenyl)-7-methylimidazo[1,2-f]phenanthridinato]iridium(III) (abbreviation: Ir(dmpimpt-Me)$_3$); and an organometallic iridium complex in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), or bis[2-(4',6'-difluorophenyl)pyridinato-N,C$^{2'}$]iridium(III) acetylacetonate (abbreviation: FIr(acac)). Among the above compounds, an organometallic iridium complex having a polyazole skeleton such as a 4H-triazole skeleton, a 1H-triazole skeleton, or an imidazole skeleton has a high hole-trapping property. Therefore, in the case where the first light-emitting layer in the light-emitting element of one embodiment of the present invention has an electron-transport property (specifically when the first host material is an electron-transport material), an organometallic iridium complex having a polyazole skeleton is preferably used as the first phosphorescent compound, in which case a recombination region of carriers can be controlled to be in the first light-emitting layer or in the vicinity of the interface between the first light-emitting layer and the second light-emitting layer. Note that an organometallic iridium complex having a 4H-triazole skeleton has excellent reliability and emission efficiency and thus is especially preferable.

As the second phosphorescent compound, any compound can be selected as long as the compound emits light with a wavelength longer than that of light emitted from the first phosphorescent compound. It is preferable to select a phosphorescent compound having an emission peak at 520 nm to 600 nm, for example. The following are the specific examples: an organometallic iridium complex having a pyrimidine skeleton such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[6-(2-norbornyl)-4-phenylpyrimidinato]iridium(III) (abbreviation: Ir(nbppm)$_2$(acac)), bis{2-[5-methyl-6-(2-methylphenyl)-4-pyrimidinyl-κN3]phenyl-κC}(2,4-pentanedionato-κ$^2$O,O') iridium(III) (abbreviation: Ir(mpmppm)$_2$(acac)), or (acetylacetonato)bis(4,6-diphenylpyrimidinato)iridium(III) (abbreviation: Ir(dppm)$_2$(acac)); an organometallic iridium complex having a pyrazine skeleton such as (acetylacetonato)bis(3,5-dimethyl-2-phenylpyrazinato)iridium(III) (abbreviation: Ir(mppr-Me)$_2$(acac)) or (acetylacetonato)bis(5-isopropyl-3-methyl-2-phenylpyrazinato)iridium(III) (abbreviation: Ir(mppr-iPr)$_2$(acac)); an organometallic iridium complex having a pyridine skeleton such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$acac), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), or bis(2-phenylquinolinato-N,C$^{2'}$)iridium(III) acetylacetonate (abbreviation: Ir(pq)$_2$(acac)); and a rare earth metal complex such as tris(acetylacetonato)(monophenanthroline)terbium(III) (abbreviation: Tb(acac)$_3$(Phen)). Among the above compounds, an organometallic iridium complex having a diazine skeleton such as a pyrimidine skeleton or a pyrazine skeleton has a low hole-trapping property and a high electron-trapping property. Therefore, in the case where the second light-emitting layer in the light-emitting element of one embodiment of the present invention has a hole-transport property (specifically when the second host material is a hole-transport material), an organometallic iridium complex having a diazine skeleton is preferably used as the second phosphorescent compound, in which case a recombination region of carriers can be controlled to be in the first light-emitting layer or in the vicinity of the interface between the first light-emitting layer and the second light-emitting layer. Note that an organometallic iridium complex having a pyrimidine skeleton has distinctively high reliability and omission efficiency and thus is especially preferable.

As the third phosphorescent compound, any compound can be selected as long as the compound emits light with a wavelength longer than that of light emitted from the second phosphorescent compound. It is preferable to select a phosphorescent compound which emits red light having an emission peak at 600 nm to 700 nm, for example. The following are the specific examples: an organometallic iridium complex having a pyrimidine skeleton such as bis[4,6-bis(3-methylphenyl)pyrimidinato](diisobutylylmethano)iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), or bis[4,6-di(naphthalen-1-yl)pyrimidinato](dipivaloylmethanato)iridium(III) (abbreviation: Ir(d1npm)$_2$(dpm)); an organometallic iridium complex having a pyrazine skeleton such as (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: Ir(tppr)$_2$(dpm)), or (acetylacetonato)bis[2,3-bis(4-fluorophenyl)quinoxalinato]iridium(III) (abbreviation: Ir(Fdpq)$_2$(acac)); an organometallic iridium complex having a pyridine skeleton such as tris(1-phenylisoquinolinato-N,C$^{2'}$)iridium(III) (abbreviation: Ir(piq)$_3$) or bis(1-phenylisoquinolinato-N,C$^{2'}$)iridium(III) acetylacetonate (abbreviation: Ir(piq)$_2$acac); a platinum complex such as 2,3,7,8,12,13,17,18-octaethyl-21H,23H-porphyrin platinum(II) (abbreviation: PtOEP); and a rare earth metal complex such as tris(1,3-diphenyl-1,3-propanedionato)(monophenanthroline)europium(III) (abbreviation: Eu(DBM)$_3$(Phen)) or tris[1-(2-thenoyl)-3,3,3-trifluoroacetonato](monophenanthroline)europium(III) (abbreviation: Eu(TTA)$_3$(Phen)). Among the above materials, an organometallic iridium complex having a diazine skeleton such as a pyrimidine skeleton or a pyrazine skeleton has a low hole-trapping property and a high electron-trapping property. Therefore, in the case where the third light-emitting layer in the light-emitting element of one embodiment of the present invention has a hole-transport property (specifically when the third host material is a hole-transport material), an organometallic iridium complex having a diazine skeleton is preferably used as the third phosphorescent compound, in which case a recombination region of carriers can be controlled to be in the first light-emitting layer or in the vicinity of the interface between the first light-emitting layer and the second light-emitting layer. Note that an organometallic iridium complex having a pyrimidine skeleton has distinctively high reliability and emission efficiency and thus is especially preferable. Further, because an organometallic iridium complex having a pyrazine skeleton can provide red light emission with favorable chromaticity, the use of the organometallic iridium complex in a white light-emitting element of one embodiment of the present invention improves a color rendering property of the white light-emitting element.

It is also possible to select a first phosphorescent material, a second phosphorescent material, and a third phosphorescent material which have the relation described in Embodiment 1, from known phosphorescent materials in addition to the above phosphorescent compounds.

There is no particular limitation on the materials which can be used as the first to third host materials; a variety of carrier transporting materials may be selected and appropriately combined such that the element structure illustrated in FIGS. 1A to 1C is obtained. At this time, as described above, a host material having an electron-transport property and a host material having a hole-transport property are preferably combined.

The following are examples of the host material having an electron-transport property: a metal complex such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB). Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in drive voltage.

The following are examples of the host material having a hole-transport property: a compound having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)

phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenyl-carbazole (abbreviation: CzTP), or 3,3'-bis(9-phenyl-9H-carbazole) (abbreviation: PCCP); a compound having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4''-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in drive voltage.

Host materials can be selected from known substances as well as from the above host materials. Note that as the host materials, substances having a triplet level (energy gap between a ground state and a triplet excited state) higher than that of the phosphorescent compound are preferably selected. It is preferable that these host materials do not have an absorption spectrum in the blue wavelength range. Specifically, an absorption edge of the absorption spectrum is preferably at 440 nm or less.

For formation of the light-emitting layer 113 having the above-described structure, co-evaporation by a vacuum evaporation method can be used, or alternatively an inkjet method, a spin coating method, a dip coating method, or the like using a mixed solution can be used.

The electron-transport layer 114 is a layer containing a substance having an electron-transport property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here have high electron-transport properties and are mainly ones that have an electron mobility of $10^{-6}$ cm$^2$/Vs or more. Note that any of the above-described host materials having electron-transport properties may be used for the electron-transport layer 114.

Furthermore, the electron-transport layer 114 is not limited to a single layer and may be a stack of two or more layers containing any of the above substances.

Between the electron-transport layer and the light-emitting layer, a layer that controls transport of electron carriers may be provided. This is a layer formed by addition of a small amount of a substance having a high electron-trapping property to a material having a high electron-transport property as described above, and the layer is capable of adjusting carrier balance by suppressing transport of electron carriers. Such a structure is very effective in preventing a problem (such as a reduction in element lifetime) caused when electrons pass through the light-emitting layer.

In addition, the electron-injection layer 115 may be provided in contact with the second electrode 102 between the electron-transport layer 114 and the second electrode 102. For the electron-injection layer 115, an alkali metal, an alkaline earth metal, or a compound thereof such as lithium fluoride (LiF), cesium fluoride (CsF), or calcium fluoride (CaF$_2$) can be used. For example, a layer that is formed using a substance having an electron-transport property and contains an alkali metal, an alkaline earth metal, or a compound thereof can be used. Note that a layer that is formed using a substance having an electron-transport property and contains an alkali metal or an alkaline earth metal is preferably used as the electron-injection layer 115, in which case electron injection from the second electrode 102 is efficiently performed.

For the second electrode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. Films of these electrically conductive materials can be formed by a sputtering method, an inkjet method, a spin coating method, or the like.

Further, any of a variety of methods can be used to form the EL layer 103 regardless whether it is a dry process or a wet process. For example, a vacuum evaporation method, an inkjet method, a spin coating method, or the like may be used. Different formation methods may be used for the electrodes or the layers.

In addition, the electrode may be formed by a wet method using a sol-gel method, or by a wet method using paste of a metal material. Alternatively, the electrode may be formed by a dry method such as a sputtering method or a vacuum evaporation method.

In the light-emitting element having the above-described structure, current flows due to a potential difference between the first electrode 101 and the second electrode 102, and holes and electrons recombine in the light-emitting layer 113 which contains a substance having a high light-emitting property, so that light is emitted. That is, a light-emitting region is formed in the light-emitting layer 113.

Light emission is extracted out through one or both of the first electrode 101 and the second electrode 102. Therefore, one or both of the first electrode 101 and the second electrode 102 are light-transmitting electrodes. In the case where only the first electrode 101 is a light-transmitting electrode, light emission is extracted through the first electrode 101. In the case where only the second electrode 102 is a light-transmitting electrode, light emission is extracted through the second electrode 102. In the case where both the first electrode 101 and the second electrode 102 are light-transmitting electrodes, light emission is extracted through the first electrode 101 and the second electrode 102.

The structure of the layers provided between the first electrode 101 and the second electrode 102 is not limited to the above-described structure. Preferably, a light-emitting region where holes and electrons recombine is positioned away from the first electrode 101 and the second electrode 102 so that quenching due to the proximity of the light-emitting region and a metal used for electrodes and carrier-injection layers can be prevented.

Further, in order that transfer of energy from an exciton generated in the light-emitting layer can be suppressed, preferably, the hole-transport layer and the electron-transport layer which are in contact with the light-emitting layer 113, particularly a carrier-transport layer in contact with a side closer to the light-emitting region in the light-emitting layer 113 is formed using a substance having a wider band gap than the light-emitting substance of the light-emitting layer or the emission center substance included in the light-emitting layer.

A light-emitting element in this embodiment is preferably fabricated over a substrate of glass, plastic, or the like. As the way of stacking layers over the substrate, layers may be sequentially stacked from the first electrode 101 side or sequentially stacked from the second electrode 102 side. In a light-emitting device, although one light-emitting element may be formed over one substrate, a plurality of light-emitting elements may be formed over one substrate. With a plurality of light-emitting elements as described above formed over one substrate, a lighting device in which elements are separated or a passive-matrix light-emitting device can be manufactured. A light-emitting element may be formed over an electrode electrically connected to a thin film transistor (TFT), for example, which is formed over a substrate of glass, plastic, or the like, so that an active matrix light-emitting device in which the TFT controls the drive of the light-emitting element can be manufactured. Note that there is no particular limitation on the structure of the TFT, which may be a staggered TFT or an inverted staggered TFT. In addition, crystallinity of a semiconductor used for the TFT is not particularly limited either; an amorphous semiconductor or a crystalline semiconductor may be used. In addition, a driver circuit formed in a TFT substrate may be formed with an n-type TFT and a p-type T, or with either an n-type TFT or a p-type TFT.

Note that this embodiment can be combined with any of the other embodiments as appropriate.

Embodiment 3

In this embodiment, a light-emitting device using the light-emitting element described in Embodiments 1 and 2 will be described.

In this embodiment, the light-emitting device using the light-emitting element described in Embodiments 1 and 2 is described with reference to FIGS. 6A and 6B. Note that FIG. 6A is a top view of the light-emitting device and FIG. 6B is a cross-sectional view taken along the lines A-B and C-D in FIG. 6A. This light-emitting device includes a driver circuit portion (source line driver circuit) 601, a pixel portion 602, and a driver circuit portion (gate line driver circuit) 603, which are to control light emission of the light-emitting element and illustrated with dotted lines. Moreover, a reference numeral 604 denotes a sealing substrate; 625, a drying agent; 605, a sealing material; and 607, a space surrounded by the sealing material 605.

Reference numeral 608 denotes a wiring for transmitting signals to be inputted into the source line driver circuit 601 and the gate line driver circuit 603 and receiving signals such as a video signal, a clock signal, a start signal, and a reset signal from an FPC (flexible printed circuit) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure is described with reference to FIG. 6B. The driver circuit portion and the pixel portion are formed over an element substrate 610; the source line driver circuit 601, which is a driver circuit portion, and one of the pixels in the pixel portion 602 are illustrated here.

As the source line driver circuit 601, a CMOS circuit in which an n-channel TFT 623 and a p-channel TFT 624 are combined is formed. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching TFT 611, a current controlling TFT 612, and a first electrode 613 electrically connected to a drain of the current controlling TFT 612. Note that to cover an end portion of the first electrode 613, an insulator 614 is formed, for which a positive photosensitive acrylic resin film is used here.

In order to improve coverage, the insulator 614 is formed to have a curved surface with curvature at its upper or lower end portion. For example, in the case where positive photosensitive acrylic is used for a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

In addition, the EL layer 616 is formed by any of a variety of methods such as an evaporation method using an evaporation mask, an inkjet method, and a spin coating method. The EL layer 616 has a structure similar to that described in Embodiments 1 and 2. Further, for another material included in the EL layer 616, any of low molecular compounds and high molecular compounds (including oligomers and dendrimers) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. In the case where light generated in the EL layer 616 passes through the second electrode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting element is formed with the first electrode 613, the EL layer 616, and the second electrode 617. The light-emitting element is the light-emitting element described in Embodiments 1 and 2. In the light-emitting device of this embodiment, the pixel portion, which includes a plurality of light-emitting elements, may include both the light-emitting element described in Embodiments 1 and 2 and a light-emitting element having a different structure.

Further, the sealing substrate 604 is attached to the element substrate 610 with the sealing material 605, so that a light-emitting element 618 is provided in the space 607 surrounded by the element substrate 610, the sealing substrate 604, and the sealing material 605. The space 607 may be filled with filler, and may be filled with an inert gas (such as nitrogen or argon), or the sealing material 605. It is preferable that the sealing substrate be provided with a recessed portion and the drying agent 625 be provided in the recessed portion, in which case deterioration due to influence of moisture can be suppressed.

An epoxy-based resin or glass frit is preferably used for the sealing material 605. It is preferable that such a material do not transmit moisture or oxygen as much as possible. As the sealing substrate 604, a glass substrate, a quartz substrate, or a plastic substrate formed of fiberglass reinforced plastic (FRP), polyvinyl fluoride) (PVF), polyester, acrylic, or the like can be used.

As described above, the light-emitting device which uses the light-emitting element described in Embodiments 1 and 2 can be obtained.

The light-emitting device in this embodiment is fabricated using the light-emitting element described in Embodiments 1 and 2 and thus can have favorable characteristics. Specifically, since the light-emitting element described Embodiments 1 and 2 has high emission efficiency, the light-emitting device can have reduced power consumption. In addition, since the light-emitting element has low drive voltage, the light-emitting device can be driven at low voltage.

Figure 7A:
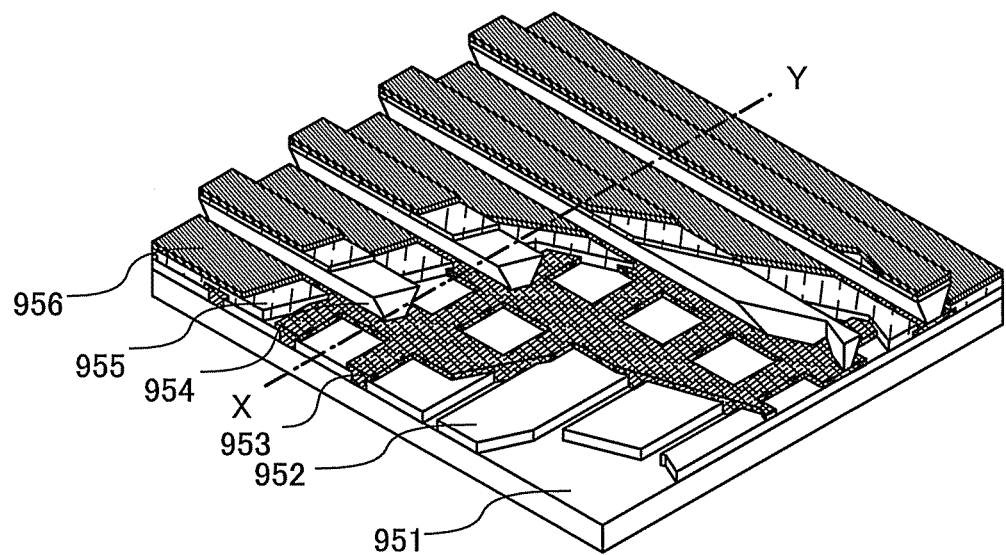
FIGS. 7A and 7B are conceptual diagrams of a passive matrix light-emitting device.
Figure 7B:
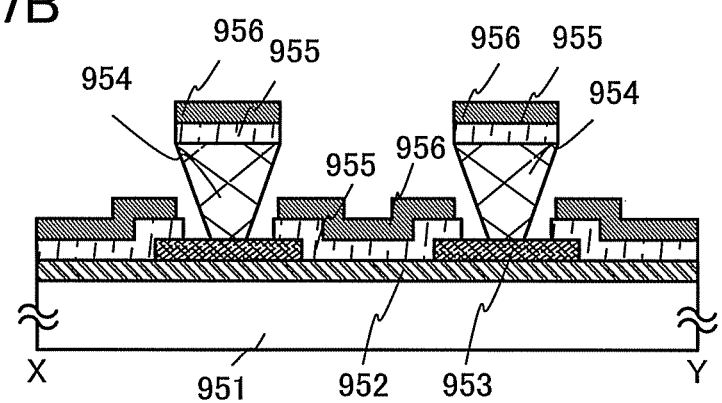

Although an active matrix light-emitting device is described in this embodiment as described above, a passive matrix light-emitting device may be manufactured. FIGS. 7A and 7B illustrate a passive matrix light-emitting device manufactured using the present invention. FIG. 7A is a perspective view of the light-emitting device, and FIG. 7B is a cross-sectional view taken along the line X-Y in FIG. 7A. In FIGS. 7A and 7B, over a substrate 951, an EL layer 955 is provided between an electrode 952 and an electrode 956. An end portion of the electrode 952 is covered with an insulating layer 953. In addition, a partition layer 954 is provided over the insulating layer 953. The sidewalls of the partition layer 954 are a slope such that the distance between both sidewalls is gradually narrowed toward the surface of the substrate. In other words, a cross section taken along the direction of the short side of the partition wall layer 954 is trapezoidal, and the lower side (a side which is in the same direction as a plane direction of the insulating layer 953 and in contact with the insulating layer 953) is shorter than the upper side (a side which is in the same direction as the plane direction of the insulating layer 953 and not in contact with the insulating layer 953). The partition layer 954 thus provided can prevent defects in the light-emitting element due to static electricity or the like. The passive matrix light-emitting device can also be driven with low power consumption by including the light-emitting element in Embodiments 1 and 2 which is capable of operating at low voltage. Further, the light-emitting device can have high reliability by including the light-emitting element described in Embodiments 1 and 2.

Figures 8A, 8B:
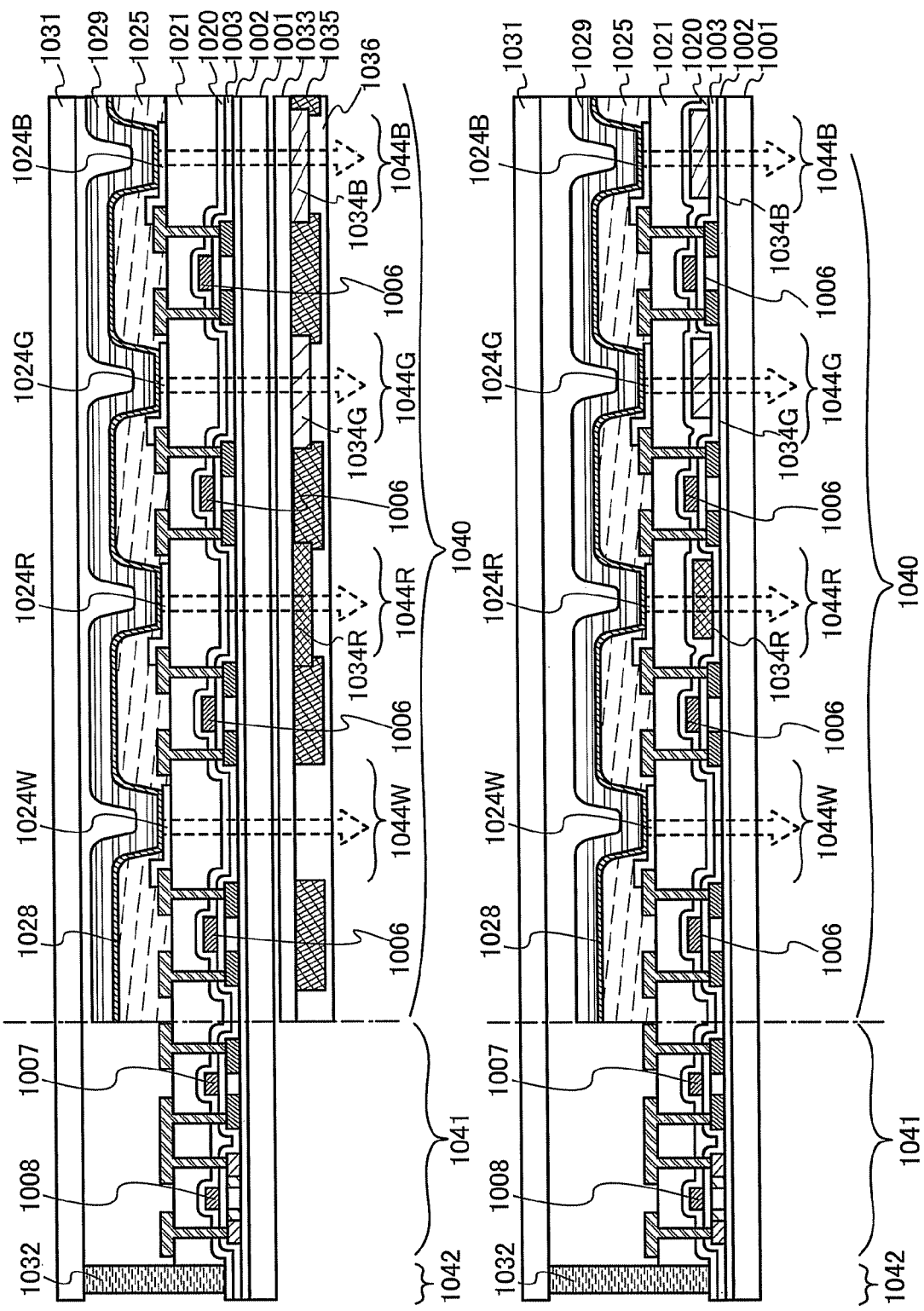
FIGS. 8A and 8B are conceptual diagrams of structures of an active matrix light-emitting device.

Further, for performing full color display, a coloring layer or a color conversion layer may be provided in a light path through which light from the light-emitting element passes to the outside of the light-emitting device. An example of a light-emitting device in which full color display is achieved with the use of a coloring layer and the like is illustrated in FIGS. 8A and 8B. In FIG. 8A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition wall 1025, a layer 1028 containing an organic compound, a second electrode 1029 of the light-emitting elements, a sealing substrate 1031, and a sealant 1032 are illustrated. Further, coloring layers (a red coloring layer 1034R, a green coloring layer 1034G, and a blue coloring layer 1034B) are provided on a transparent base material 1033. Further, a black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In this embodiment, light emitted from some of the light-emitting layers does not pass through the coloring layers, while light emitted from the others of the light-emitting layers passes through the coloring layers. Since light which does not pass through the coloring layers is white and light which passes through any one of the coloring layers is red, blue, or green, an image can be displayed using pixels of the four colors.

Figure 9:
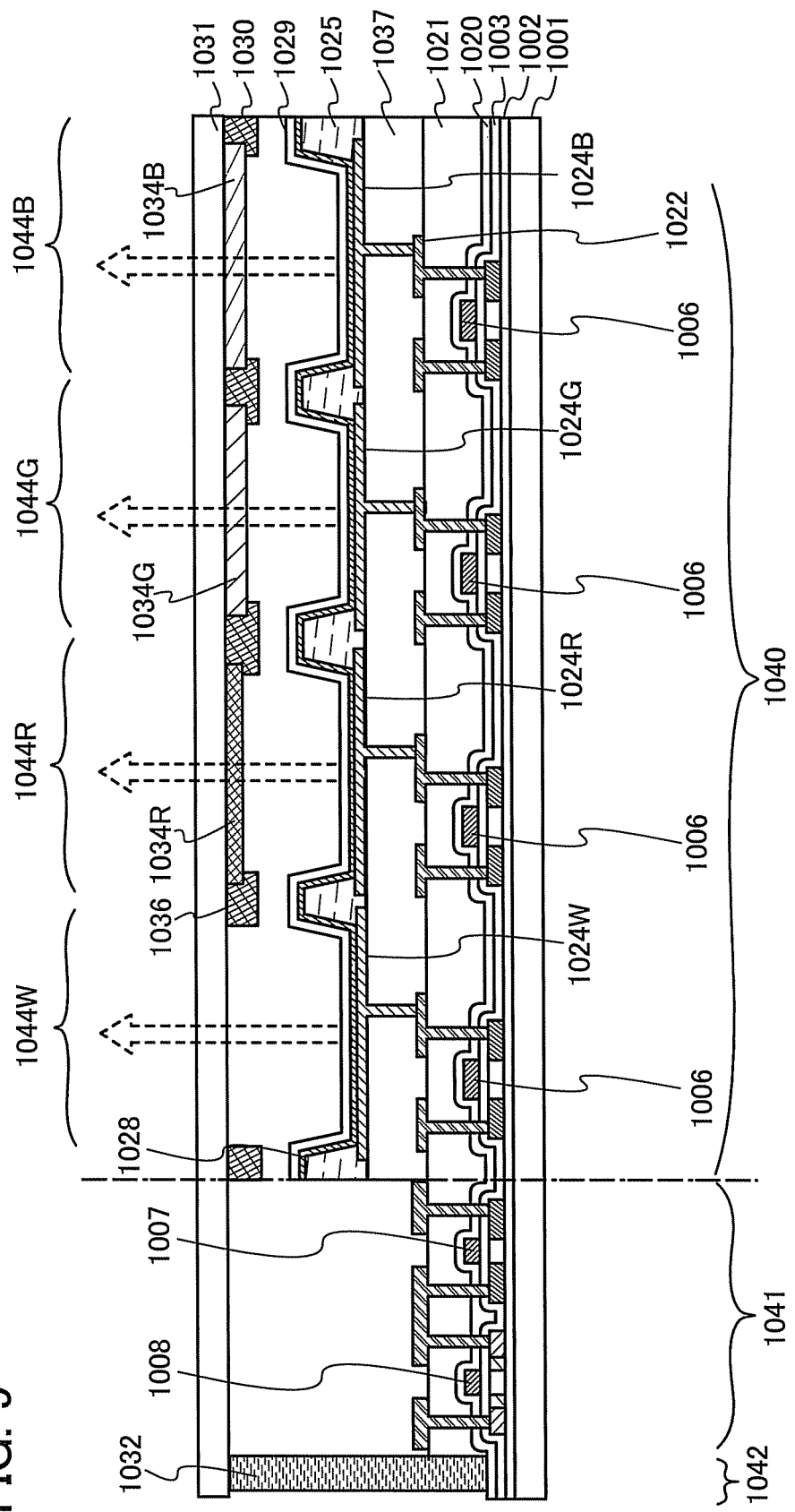
FIG. 9 is a conceptual diagram of an active matrix light-emitting device.

The above-described light-emitting device is a light-emitting device having a structure in which light is extracted from the substrate 1001 side where the TFTs are formed (a bottom emission structure), but may be a light-emitting device having a structure in which light is extracted from the sealing substrate 1031 side (a top emission structure). FIG. 9 is a cross-sectional view of a light-emitting device having a top emission structure. In this case, a substrate which does not transmit light can be used as the substrate 1001. The process up to the step of forming of a connection electrode which connects the TFT and the anode of the light-emitting element is performed in a manner similar to that of the light-emitting device having a bottom emission structure. Then, a third interlayer insulating film 1037 is formed to cover an electrode 1022. The third interlayer insulating film 1037 may have a planarization function. The third interlayer insulating film 1037 can be formed using a material similar to that of the second interlayer insulating film, and can alternatively be formed using any other known material.

The first electrodes 1024W, 1024R, 1024G, and 1024B of the light-emitting elements each serve as an anode here, but may serve as a cathode. Further, in the case of a light-emitting device having a top emission structure as illustrated in FIG. 9, the first electrodes are preferably reflective electrodes. The layer 1028 containing an organic compound is formed to have a structure similar to the structure described in Embodiments 1 and 2, with which white light emission can be obtained. As the structure with which white light emission can be obtained, in the case where two EL layers are used, a structure with which blue light is obtained from a light-emitting layer in one of the EL layers and orange light is obtained from a light-emitting layer of the other of the EL layers; a structure in which blue light is obtained from a light-emitting layer of one of the EL layers and red light and green light are obtained from a light-emitting layer of the other of the EL layers; and the like can be given. Further, in the case where three EL layers are used, red light, green light, and blue light are obtained from respective light-emitting layers, so that a light-emitting element which emits white light can be obtained. Needless to say, the structure with which white light emission is obtained is not limited thereto as long as the structure described in Embodiments 1 and 2 is used.

The coloring layers are each provided in a light path through which light from the light-emitting element passes to the outside of the light-emitting device. In the case of the light-emitting device having a bottom emission structure as illustrated in FIG. 8A, the coloring layers 1034R, 1034G, and 1034B can be provided on the transparent base material 1033 and then fixed to the substrate 1001. The coloring layers may be provided between the gate insulating film 1003 and the first interlayer insulating film 1020 as illustrated in FIG. 8B. In the case of a top emission structure as illustrated in FIG. 9, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (the black matrix) 1035 which is positioned between pixels. The coloring layers (the red coloring layer 1034R, the green coloring layer 1034G, and the blue coloring layer 1034B) and the black layer (the black matrix) 1035 may be covered with the overcoat layer 1036. Note that a light-transmitting substrate is used as the sealing substrate 1031.

When voltage is applied between the pair of electrodes of the thus obtained organic light-emitting element, a white light-emitting region 1044W can be obtained. In addition, by using the coloring layers, a red light-emitting region 1044R, a blue light-emitting region 1044B, and a green light-emitting region 1044G can be obtained. The light-emitting device in this embodiment includes the light-emitting element described in Embodiments 1 and 2; thus, a light-emitting device with low power consumption can be obtained.

Further, although an example in which full color display is performed using four colors of red, green, blue, and white is shown here, there is no particular limitation and full color display using three colors of red, green, and blue may be performed.

This embodiment can be freely combined with any of other embodiments.

Embodiment 4

Figure 10A:
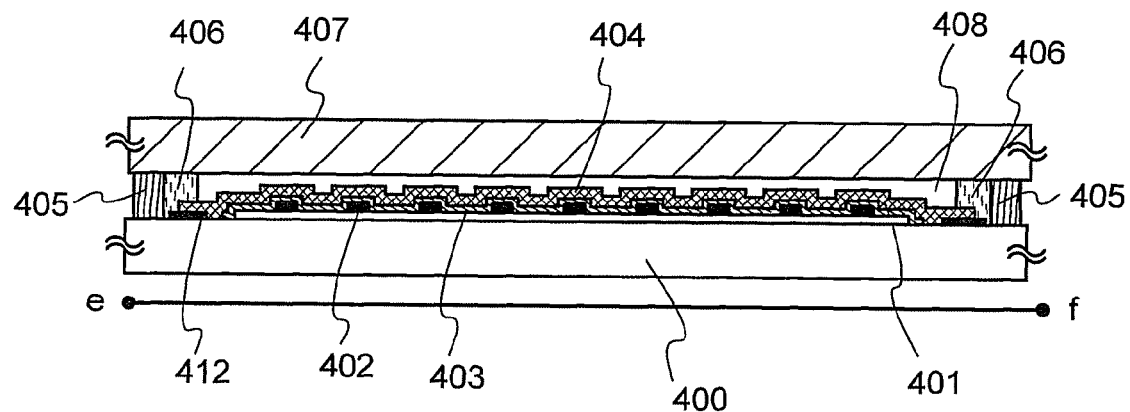
FIGS. 10A and 10B are conceptual diagrams of a lighting device.
Figure 10B:
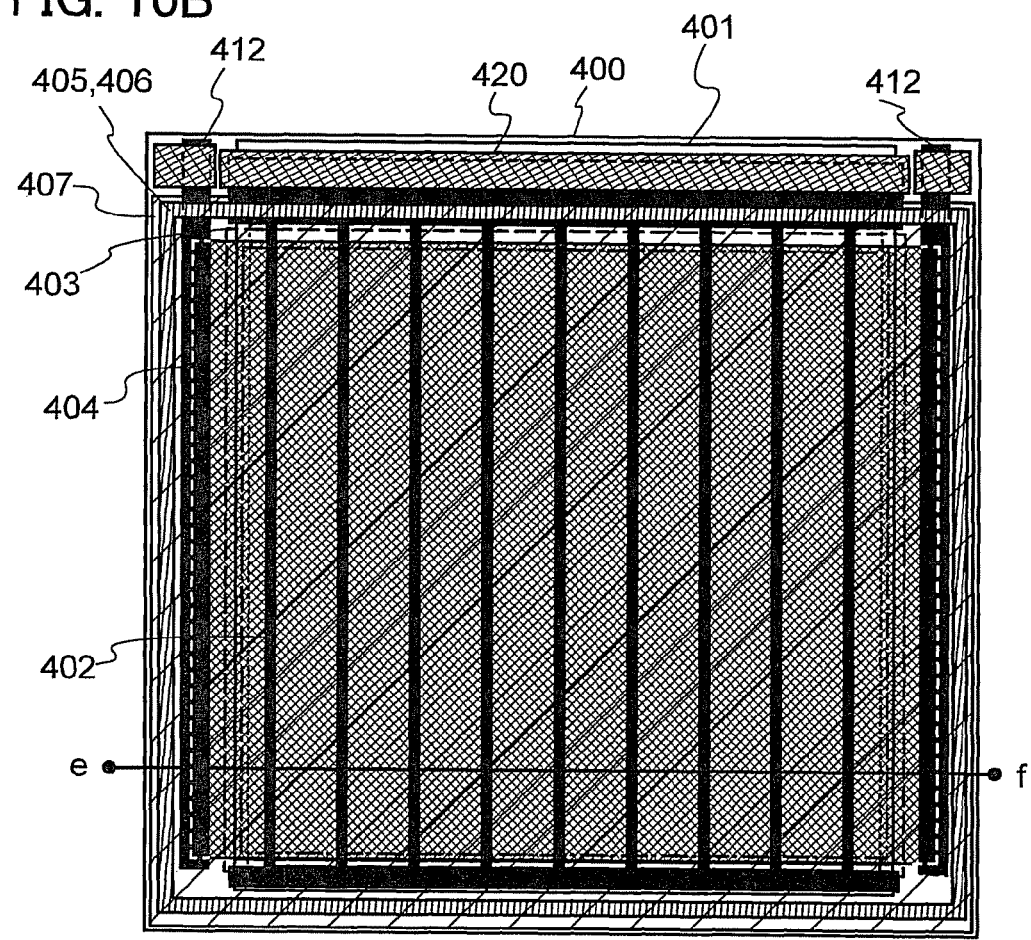

In this embodiment, an example in which the light-emitting element described in Embodiments 1 and 2 is used for a lighting device will be described with reference to FIGS. 10A and 10B. FIG. 10B is a top view of the lighting device, and FIG. 10A is a cross-sectional view taken along the line e-f in FIG. 10B.

In the lighting device in this embodiment, a first electrode 401 is formed over a substrate 400 which is a support and has a light-transmitting property. The first electrode 401 corresponds to the first electrode 101 in Embodiment 3.

An auxiliary electrode 402 is provided over the first electrode 401. Since light emission is extracted through the first electrode 401 side in the example given in this embodiment, the first electrode 401 is formed using a material having a light-transmitting property. The auxiliary electrode 402 is provided in order to compensate for the low conductivity of the material having a light-transmitting property, and has a function of suppressing luminance unevenness in a light emission surface due to voltage drop caused by the high resistance of the first electrode 401. The auxiliary electrode 402 is formed using a material having at least higher conductivity than the material of the first electrode 401, and is preferably formed using a material having high conductivity such as aluminum. Note that surfaces of the auxiliary electrode 402 other than a portion thereof in contact with the first electrode 401 are preferably covered with an insulating layer. This is for suppressing light emission over the upper portion of the auxiliary electrode 402, which cannot be extracted, for reducing a reactive current, and for suppressing a reduction in power efficiency. Note that a pad 412 for applying a voltage to a second electrode 404 may be formed at the same time as the formation of the auxiliary electrode 402.

An EL layer 403 is formed over the first electrode 401 and the auxiliary electrode 402. The EL layer 403 has the structure described in Embodiments 1 and 2. Refer to the descriptions for the structure. Note that the EL layer 403 is preferably formed to be slightly larger than the first electrode 401 when seen from above, in which case the EL layer 403 can also serve as an insulating layer that suppresses a short circuit between the first electrode 401 and the second electrode 404.

The second electrode 404 is formed to cover the EL layer 403. The second electrode 404 corresponds to the second electrode 102 in Embodiment 3 and has a similar structure. In this embodiment, it is preferable that the second electrode 404 be formed using a material having high reflectance because light emission is extracted through the first electrode 401 side. In this embodiment, the second electrode 404 is connected to the pad 412, whereby voltage is applied.

As described above, the lighting device described in this embodiment includes a light-emitting element including the first electrode 401, the EL layer 403, and the second electrode 404 (and the auxiliary electrode 402). Since the light-emitting element is a light-emitting element with high emission efficiency, the lighting device in this embodiment can be a lighting device having low power consumption. Furthermore, since the light-emitting element is a light-emitting element having high reliability, the lighting device in this embodiment can be a lighting device having high reliability.

The light-emitting element having the above structure is fixed to a sealing substrate 407 with sealing materials 405 and 406 and sealing is performed, whereby the lighting device is completed. It is possible to use only either the sealing material 405 or the sealing material 406. In addition, the inner sealing material 406 can be mixed with a desiccant which enables moisture to be adsorbed, increasing reliability.

When parts of the pad 412, the first electrode 401, and the auxiliary electrode 402 are extended to the outside of the sealing materials 405 and 406, the extended parts can serve as external input terminals. An IC chip 420 mounted with a converter or the like may be provided over the external input terminals.

As described above, since the lighting device described in this embodiment includes the light-emitting element described in Embodiments 1 and 2 as an EL element, the lighting device can be a lighting device having low power consumption. Further, the lighting device can be a lighting device having low drive voltage. Furthermore, the lighting device can be a lighting device having high reliability.

Embodiment 5

In this embodiment, examples of electronic devices each including the light-emitting element described in Embodiments 1 and 2 will be described. The light-emitting element described in Embodiments 1 and 2 has high emission efficiency and reduced power consumption. As a result, the electronic devices described in this embodiment can each include a light-emitting portion having reduced power consumption. In addition, the electronic devices can be driven at low voltage since the light-emitting element described in Embodiments 1 and 2 has low drive voltage.

Examples of the electronic device to which the above light-emitting element is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, large game machines such as pachinko machines, and the like. Specific examples of these electronic devices are given below.

Figure 11A:
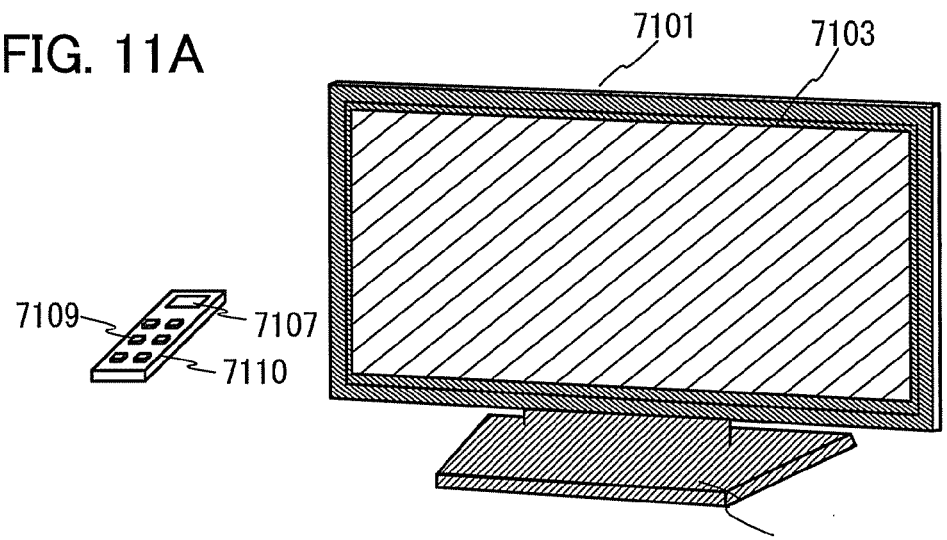
Figure 11A:
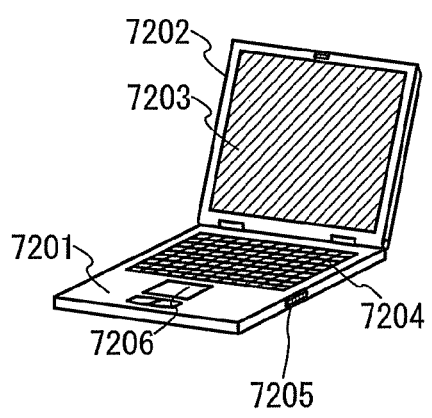
Figure 11A:
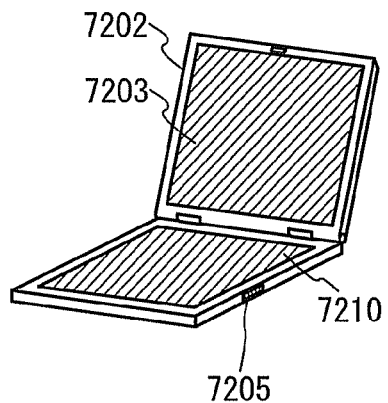

FIG. 11A illustrates an example of a television device. In the television device, a display portion 7103 is incorporated in a housing 7101. In addition, here, the housing 7101 is supported by a stand 7105. Images can be displayed on the display portion 7103, and in the light-emitting portion 7103, the light-emitting elements described in Embodiments 1 and 2 are arranged in a matrix. The light-emitting elements can have high emission efficiency. Further, the light-emitting elements can be driven at low voltage. Furthermore, the light-emitting elements can have a long lifetime. Therefore, the television device including the display portion 7103 which is formed using the light-emitting elements can be a television device having reduced power consumption. Further, the television device can be a television device having low drive voltage. Furthermore, the television device can be a television device having high reliability.

Operation of the television device can be performed with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIG. 11B1 illustrates a computer, which includes a main body 7201, a housing 7202, a display portion 7203, a keyboard 7204, an external connection port 7205, a pointing device 7206, and the like. Note that this computer is manufactured by using light-emitting elements arranged in a matrix in the display portion 7203, which are the same as that described in Embodiment 2 or 3. The computer illustrated in FIG. 11B1 may have a structure illustrated in FIG. 11B2. The computer illustrated in FIG. 11B2 is provided with a second display portion 7210 instead of the keyboard 7204 and the pointing device 7206. The second display portion 7210 is a touch screen, and input can be performed by operation of display for input on the second display portion 7210 with a finger or a dedicated pen. The second display portion 7210 can also display images other than the display for input. The display portion 7203 may be also a touch screen. Connecting the two screens with a hinge can prevent troubles; for example, the screens can be prevented from being cracked or broken while the computer is being stored or carried. The light-emitting elements can have high emission efficiency. Therefore, this computer having the display portion 7203 which is formed using the light-emitting elements consumes less power.

Figure 11C:
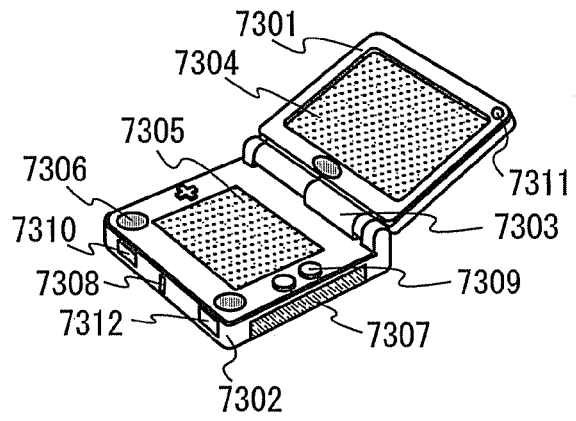

FIG. 11C illustrates a portable game machine having two housings, a housing 7301 and a housing 7302, which are connected with a joint portion 7303 so that the portable game machine can be opened or folded. The housing 7301 incorporates a display portion 7304 including the light-emitting elements described in Embodiments 1 and 2 and arranged in a matrix, and the housing 7302 incorporates a display portion 7305. In addition, the portable game machine illustrated in FIG. 11C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the display portion which includes the light-emitting elements described in Embodiments 1 and 2 and arranged in a matrix is used as at least either the display portion 7304 or the display portion 7305, or both, and the structure can include other accessories as appropriate. The portable game machine illustrated in FIG. 11C has a function of reading out a program or data stored in a storage medium to display it on the display portion, and a function of sharing information with another portable game machine by wireless communication. Note that functions of the portable game machine illustrated in FIG. 11C are not limited to them, and the portable game machine can have various functions. Since the light-emitting elements used in the display portion 7304 have high emission efficiency, the portable game machine including the above-described display portion 7304 can be a portable game machine having reduced power consumption. Since the light-emitting elements used in the display portion 7304 each can be driven at low voltage, the portable game machine can also be a portable game machine having low drive voltage. Furthermore, since the light-emitting elements used in the display portion 7304 each have a long lifetime, the portable game machine can be highly reliable.

Figure 11D:
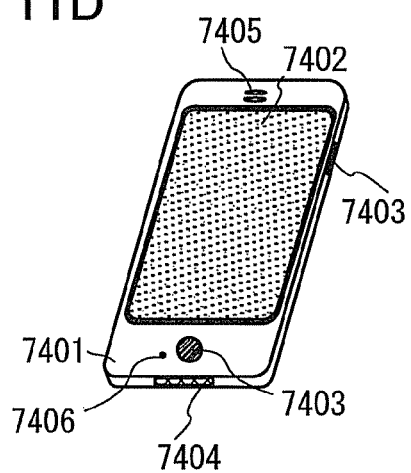

FIG. 11D illustrates an example of a mobile phone. The mobile phone is provided with a display portion 7402 incorporated in a housing 7401, operation buttons 7403, an external connection port 7404, a speaker 7405, a microphone 7406, and the like. Note that the mobile phone 7400 has the display portion 7402 including the light-emitting elements described in Embodiments 1 and 2 and arranged in a matrix. The light-emitting elements can have high emission efficiency. Further, the light-emitting elements can be driven at low voltage. Furthermore, the light-emitting elements can have a long lifetime. Therefore, the mobile phone including the display portion 7402 which is formed using the light-emitting elements can be a mobile phone having reduced power consumption. Further, the mobile phone can be a mobile phone having low drive voltage. Furthermore, the mobile phone can be a mobile phone having high reliability.

When the display portion 7402 of the mobile phone illustrated in FIG. 11D is touched with a finger or the like, data can be input into the mobile phone. In this case, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are combined.

For example, in the case of making a call or creating an e-mail, a character input mode mainly for inputting characters is selected for the display portion 7402 so that characters displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone, display on the screen of the display portion 7402 can be automatically changed by determining the orientation of the mobile phone (whether the mobile phone is placed horizontally or vertically for a landscape mode or a portrait mode).

The screen modes are switched by touch on the display portion 7402 or operation with the operation buttons 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Note that the structure described in this embodiment can be combined with any of the structures described in Embodiments 1 to 4 as appropriate.

As described above, the application range of the light-emitting device having the light-emitting element described in Embodiments 1 and 2 is wide so that this light-emitting device can be applied to electronic devices in a variety of fields. By using the light-emitting element described in Embodiments 1 and 2, an electronic device having reduced power consumption can be obtained.

Figure 12:
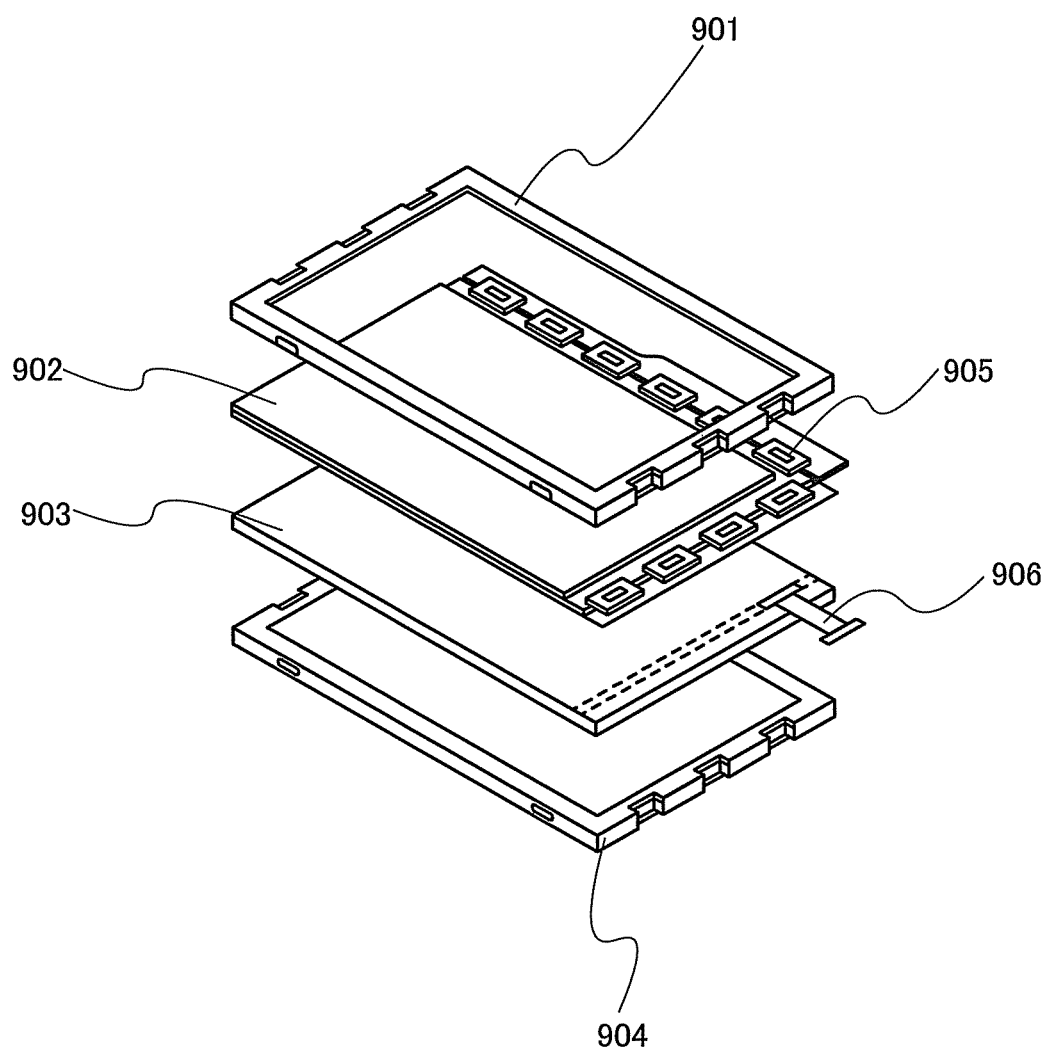
FIG. 12 illustrates an electronic device.

FIG. 12 illustrates an example of a liquid crystal display device using the light-emitting element described in Embodiments 1 and 2 for a backlight. The liquid crystal display device illustrated in FIG. 12 includes a housing 901, a liquid crystal layer 902, a backlight unit 903, and a housing 904. The liquid crystal layer 902 is connected to a driver IC 905. The light-emitting element described in Embodiments 1 and 2 is used in the backlight unit 903, to which current is supplied through a terminal 906.

The light-emitting element described in Embodiments 1 and 2 is used for the backlight of the liquid crystal display device; thus, the backlight can have reduced power consumption. In addition, the use of the light-emitting element described in Embodiment 2 enables manufacture of a planar-emission lighting device and further a larger-area planar-emission lighting device; therefore, the backlight can be a larger-area backlight, and the liquid crystal display device can also be a larger-area device. Furthermore, the light-emitting device using the light-emitting element described in Embodiment 2 can be thinner than a conventional one; accordingly, the display device can also be thinner.

Figure 13:
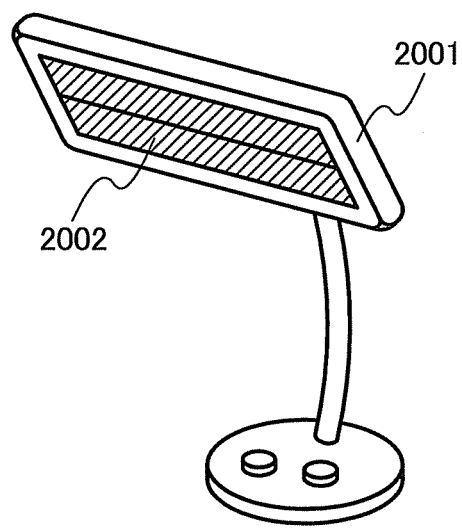
FIG. 13 illustrates a lighting device.

FIG. 13 illustrates an example in which the light-emitting element described in Embodiments 1 and 2 is used for a table lamp which is a lighting device. The table lamp illustrated in FIG. 13 includes a housing 2001 and a light source 2002, and the light-emitting device described in Embodiment 4 is used for the light source 2002.

Figure 14:
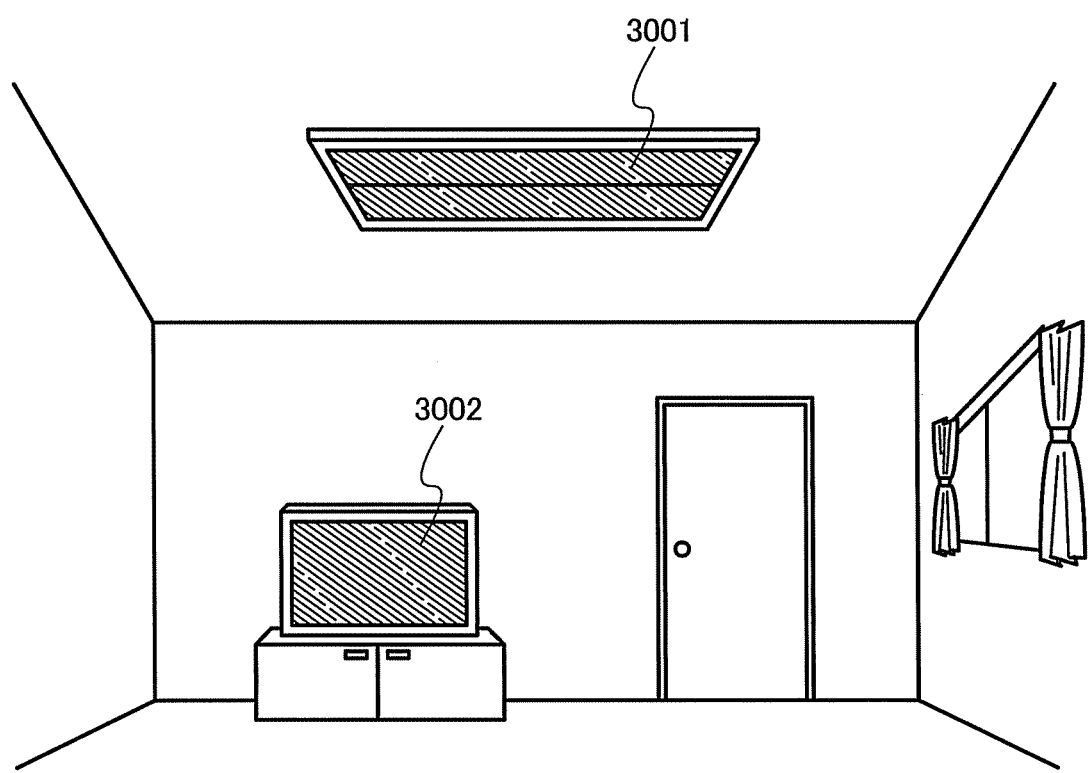
FIG. 14 illustrates a lighting device and a display device.

FIG. 14 illustrates an example in which the light-emitting element described in Embodiments 1 and 2 is used for an indoor lighting device 3001 and a display device 3002. Since the light-emitting element described in Embodiments 1 and 2 has reduced power consumption, a lighting device that has reduced power consumption can be obtained. Further, since the light-emitting element described in Embodiments 1 and 2 can have a large area, the light-emitting element can be used for a large-area lighting device. Furthermore, since the light-emitting element described in Embodiments 1 and 2 is thin, the light-emitting element can be used for a lighting device having a reduced thickness.

Figure 15:
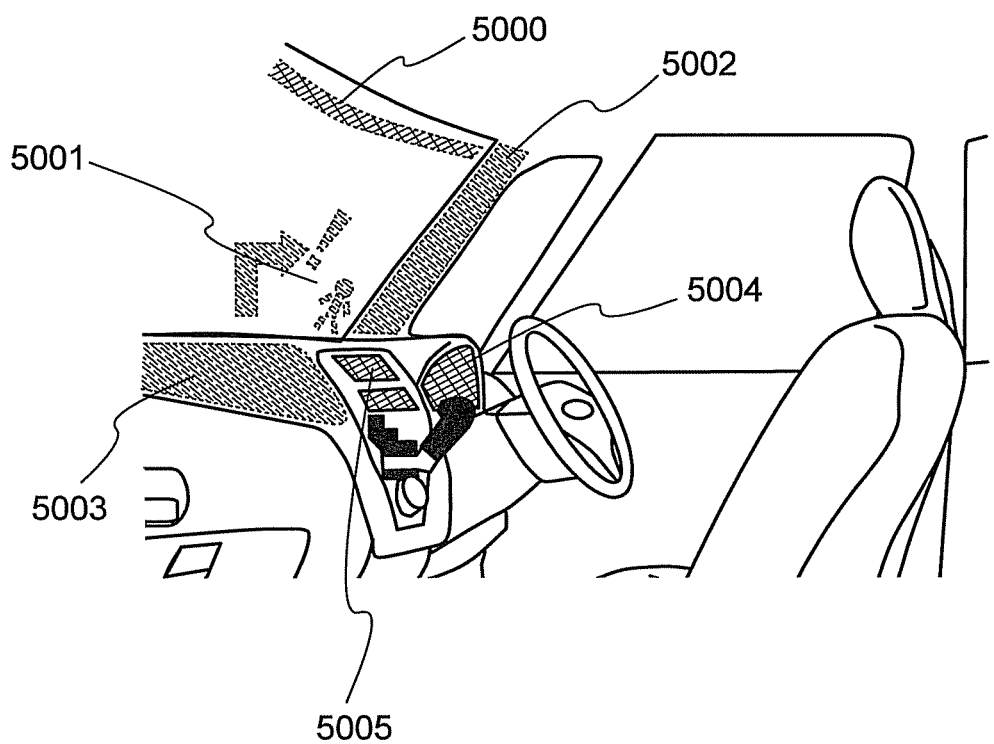
FIG. 15 illustrates car-mounted display devices and lighting devices.

The light-emitting element described in Embodiments 1 and 2 can also be used for an automobile windshield or an automobile dashboard. FIG. 15 illustrates one mode in which the light-emitting elements described in Embodiment 2 are used for an automobile windshield and an automobile dashboard. Displays 5000 to 5005 each include the light-emitting element described in Embodiments 1 and 2.

The display 5000 and the display 5001 are display devices which are provided in the automobile windshield and in which the light-emitting elements described in Embodiments 1 and 2 are incorporated. The light-emitting element described in Embodiments 1 and 2 can be formed into what is called a see-through display device, through which the opposite side can be seen, by including a first electrode and a second electrode formed of electrodes having light-transmitting properties. Such see-through display devices can be provided even in the windshield of the car, without hindering the vision. Note that in the case where a transistor for driving is provided, a transistor having a light-transmitting property, such as an organic transistor using an organic semiconductor material or a transistor using an oxide semiconductor, is preferably used.

The display 5002 is a display device which is provided in a pillar portion and in which the light-emitting elements described in Embodiments 1 and 2 are incorporated. The display 5002 can compensate for the view hindered by the pillar portion by showing an image taken by an imaging unit provided in the car body. Similarly, the display 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

The display 5004 and the display 5005 can provide a variety of kinds of information such as navigation data, a speedometer, a tachometer, a mileage, a fuel meter, a gearshift indicator, and air-condition setting. The content or layout of the display can be changed freely by a user as appropriate. Note that such information can also be shown by the displays 5000 to 5003. The displays 5000 to 5005 can also be used as lighting devices.

The light-emitting element described in Embodiments 1 and 2 can have high emission efficiency and low power consumption. Therefore, load on a battery is small even when a number of large screens such as the displays 5000 to 5005 are provided, which provides comfortable use. For that reason, the light-emitting device and the lighting device each of which includes the light-emitting element described in Embodiments 1 and 2 can be suitably used as an in-vehicle light-emitting device and an in-vehicle lighting device.

Figure 16A:
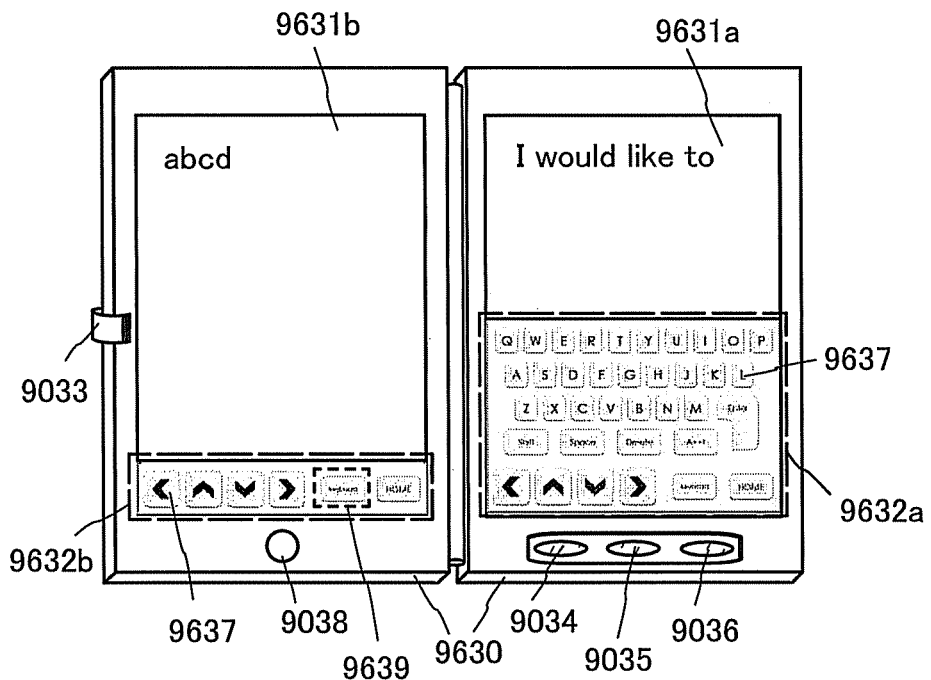
FIGS. 16A to 16C illustrate an electronic device.
Figure 16B:
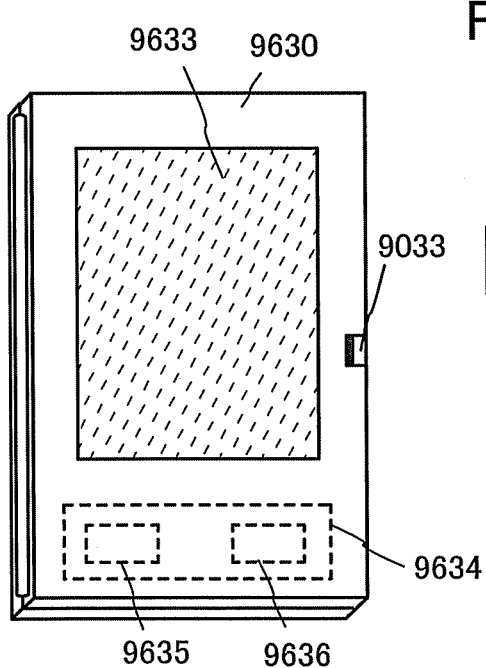

FIGS. 16A and 16B illustrate an example of a foldable tablet. FIG. 16A illustrates the tablet which is unfolded. The tablet includes a housing 9630, a display portion 9631*a*, a display portion 9631*b*, a display mode switch 9034, a power switch 9035, a power-saving mode switch 9036, a clasp 9033, and an operation switch 9038. Note that in the tablet, one or both of the display portion 9631*a* and the display portion 9631*b* is/are formed using a light-emitting device which includes the light-emitting element described in Embodiments 1 and 2.

Part of the display portion 9631*a* can be a touchscreen region 9632*a* and data can be input when a displayed operation key 9637 is touched. Although half of the display portion 9631*a* has only a display function and the other half has a touchscreen function, one embodiment of the present invention is not limited to the structure. The whole display portion 9631*a* may have a touchscreen function. For example, a keyboard is displayed on the entire region of the display portion 9631*a* so that the display portion 9631*a* is used as a touchscreen; thus, the display portion 9631*b* can be used as a display screen.

Like the display portion 9631*a*, part of the display portion 9631*b* can be a touchscreen region 9632*b*. When a switching button 9639 for showing/hiding a keyboard on the touchscreen is touched with a finger, a stylus, or the like, the keyboard can be displayed on the display portion 9631*b*.

Touch input can be performed in the touchscreen region 9632*a* and the touchscreen region 9632*b* at the same time.

The display mode switch 9034 can switch the display between portrait mode, landscape mode, and the like, and between monochrome display and color display, for example. The power-saving switch 9036 can control display luminance in accordance with the amount of external light in use of the tablet detected by an optical sensor incorporated in the tablet. Another detection device including a sensor for detecting inclination, such as a gyroscope or an acceleration sensor, may be incorporated in the tablet, in addition to the optical sensor.

Although FIG. 16A illustrates an example in which the display portion 9631*a* and the display portion 9631*b* have the same display area, one embodiment of the present invention is not limited to the example. The display portion 9631*a* and the display portion 9631*b* may have different display areas and different display quality. For example, higher definition images may be displayed on one of the display portions 9631*a* and 9631*b*.

FIG. 16B illustrates the tablet which is folded. The tablet includes the housing 9630, a solar cell 9633, a charge and discharge control circuit 9634, a battery 9635, and a DC-to-DC converter 9636. As an example, FIG. 16B illustrates the charge and discharge control circuit 9634 including the battery 9635 and the DC-to-DC converter 9636.

Since the tablet is foldable, the housing 9630 can be closed when the tablet is not in use. As a result, the display portion 9631*a* and the display portion 9631*b* can be protected, thereby providing a tablet with high endurance and high reliability for long-term use.

The tablet illustrated in FIGS. 16A and 16B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet can supply power to the touchscreen, the display portion, a video signal processing portion, or the like. Note that the solar battery 9633 can be provided on one or both surfaces of the housing 9630, so that the battery 9635 can be charged efficiently.

Figure 16C:
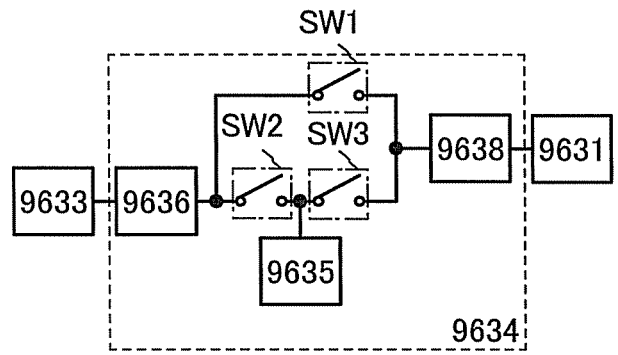

The structure and operation of the charge and discharge control circuit 9634 illustrated in FIG. 16B will be described with reference to a block diagram of FIG. 16C. FIG. 16C illustrates the solar cell 9633, the battery 9635, the DC-to-DC converter 9636, a converter 9638, switches SW1 to SW3, and the display portion 9631. The battery 9635, the DC-to-DC converter 9636, the converter 9638, and the switches SW1 to SW3 correspond to the charge and discharge control circuit 9634 illustrated in FIG. 16B.

First, description is made on an example of the operation in the case where power is generated by the solar cell 9633 with the use of external light. The voltage of the power generated by the solar cell is raised or lowered by the DC-to-DC converter 9636 so as to be voltage for charging the battery 9635. Then, when power from the solar cell 9633 is used for the operation of the display portion 9631, the switch SW1 is turned on and the voltage of the power is raised or lowered by the converter 9638 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module capable of performing charging by transmitting and receiving power wirelessly (without contact), or any of the other charge means used in combination, and the power generation means is not necessarily provided.

One embodiment of the present invention is not limited to the tablet having the shape illustrated in FIGS. 16A to 16C as long as the display portion 9631 is included.

Example 1

In this example, a light-emitting element 1 and a light-emitting element 2 each of which includes the compounds (1) to (3) described in Embodiment 1 and corresponds to one embodiment of the present invention are described. In each of the light-emitting elements in this example, the compound (1), the compound (2), and the compound (3) described in Embodiment 1 are used as phosphorescent compounds in the first light-emitting layer 113B, the second light-emitting layer 113G, and the third light-emitting layer 113R, respectively, and thus the relations between the emission wavelengths ($F(\lambda)$) and $\epsilon(\lambda)\lambda^4$ are the same as those described in Embodiment 1 with reference to FIG. 5.

The substances used in the light-emitting elements in this example are shown below.

[Chemical formula 2]
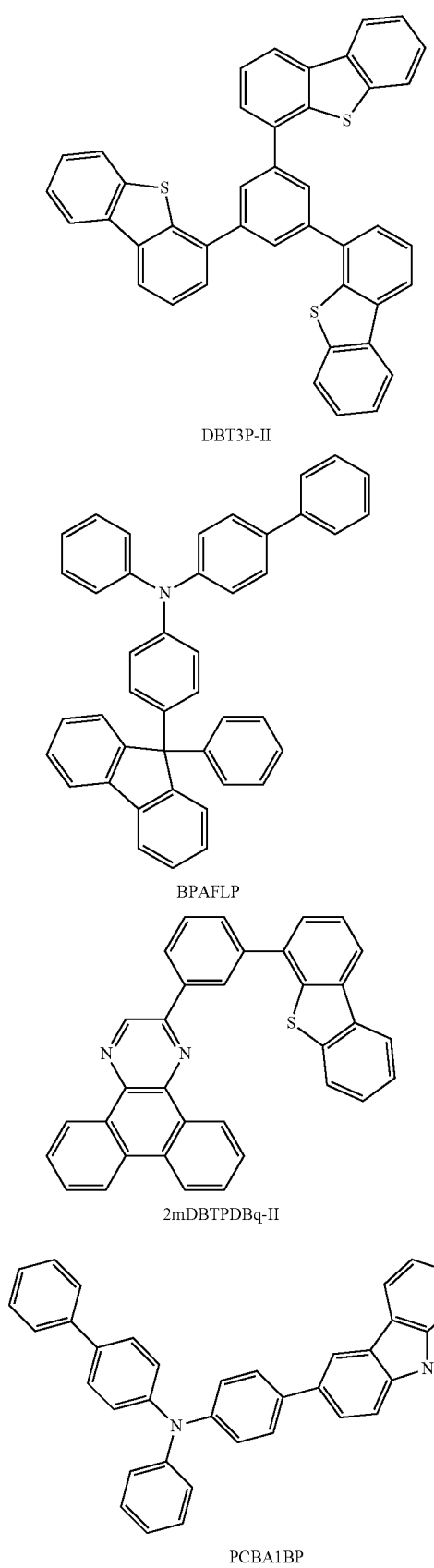
(i) DBT3P-II
(ii) BPAFLP
(iii) 2mDBTPDBq-II
(iv) PCBA1BP
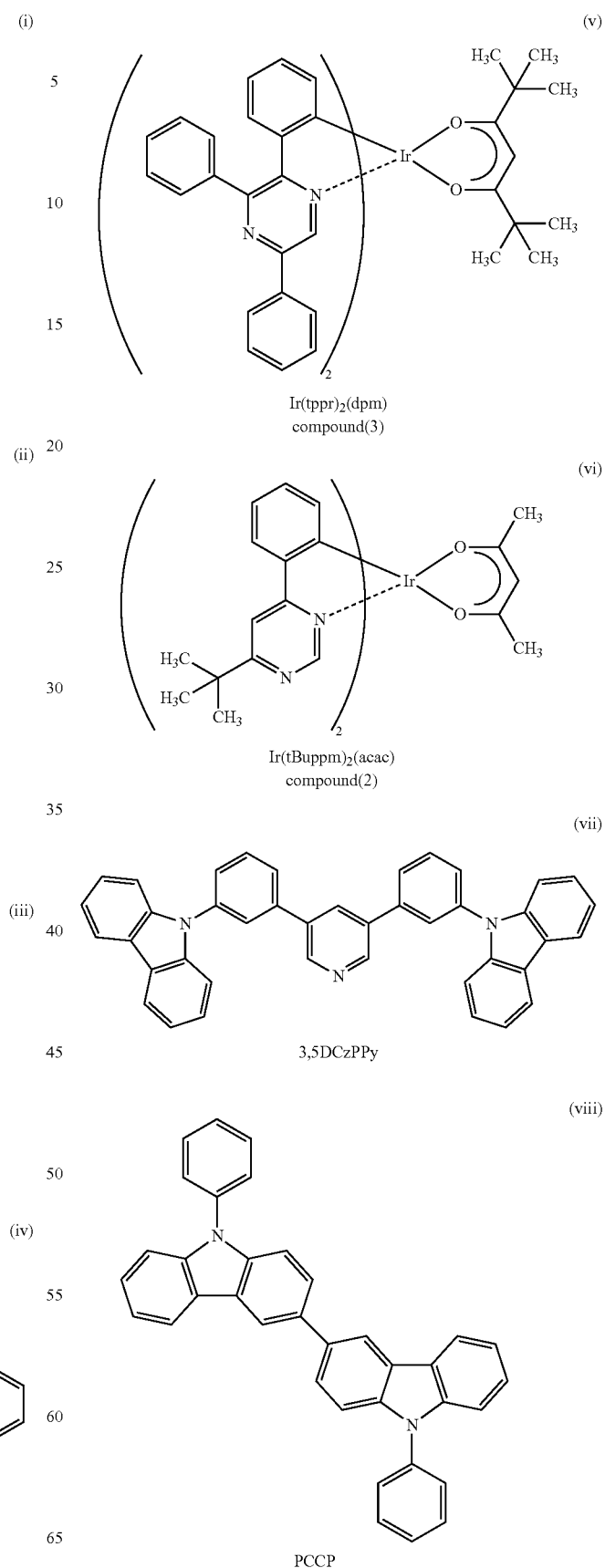
(v) Ir(tppr)₂(dpm) compound(3)
(vi) Ir(tBuppm)₂(acac) compound(2)
(vii) 3,5DCzPPy
(viii) PCCP

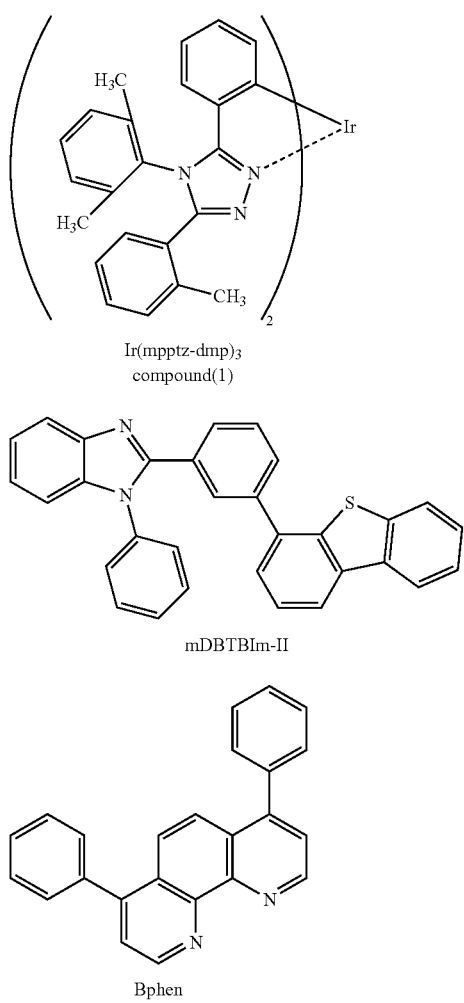

Ir(mpptz-dmp)₃
compound(1)

mDBTBIm-II

Bphen

A method for fabricating the light-emitting elements 1 and 2 in this example is described below.

(Method for Fabricating Light-Emitting Element 1)

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 is an electrode that functions as an anode of the light-emitting element.

Next, as pretreatment for forming the light-emitting element over the substrate, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately 10⁻⁴ Pa, and was subjected to vacuum baking at 170° C. for 30 minutes in a heating chamber of the vacuum evaporation apparatus, and then the substrate was cooled down for about 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about 10⁻⁴ Pa. After that, over the first electrode 101, 4,4',4"-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating, so that the hole-injection layer 111 was formed. The thickness of the hole-injection layer 111 was set to 40 nm, and the weight ratio of DBT3P-II to molybdenum oxide was adjusted to 4:2. Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) which is represented by Structural Formula (ii) was formed to a thickness of 20 nm over the hole-injection layer 111 to form the hole-transport layer 112.

Further, the light-emitting layer 113 was formed in the following manner. Over the hole-transport layer 112, 2-[3-(dibenzothiophen-4-yl)phenyl]dibenzo[f,h]quinoxaline (abbreviation: 2mDBTPDBq-II) represented by Structural Formula (iii), 4-phenyl-4'-(9-phenyl-9H-carbazol-3-yl)triphenylamine (abbreviation: PCBA1BP) represented by Structural Formula (iv), and bis(2,3,5-triphenylpyrazinato)(dipivaloylmethanato)iridium(III) (abbreviation: [Ir(tppr)₂(dpm)]) represented by Structural Formula (v) (the compound (3)) were deposited by co-evaporation to a thickness of 10 nm with a mass ratio of 2mDBTPDBq-II to PCBA1BP and [Ir(tppr)₂(dpm)] being 0.5:0.5:0.05, so that the third light-emitting layer 113R was formed; then, 2mDBTPDBq-II, PCBA1BP, and (acetylacetonato)bis(6-tert-butyl-4-phenylpyrimidinato)iridium(III) (abbreviation: [Ir(tBuppm)₂(acac)]) represented by Structural Formula (vi) (the compound (2)) were deposited by co-evaporation to a thickness of 5 nm with a mass ratio of 2mDBTPDBq-II to PCBA1BP and [Ir(tBuppm)₂(acac)] being 0.5:0.5:0.05, so that the second light-emitting layer 113G was formed; after that, 3,5-bis[3-(9H-carbazol-9-yl)phenyl]pyridine (abbreviation: 35DCzPPy) represented by Structural Formula (vii), 3,3'-bis(9-phenyl-9H-carbazole) (abbreviation: PCCP) represented by Structural Formula (viii), and tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)₃]) represented by Structural Formula (ix) (the compound (1)) were deposited by co-evaporation to a thickness of 30 nm with a mass ratio of 35DCzPPy to PCCP and [Ir(mpptz-dmp)₃] being 0.5:0.5:0.06, so that the first light-emitting layer 113B was formed.

Note that 2mDBTPDBq-II and PCBA1BP form an exciplex and 35DCzPPy and PCCP form an exciplex. Further, the second light-emitting layer 113G and the third light-emitting layer 113R have hole-transport properties by containing 2mDBTPDBq-II, which has an electron-transport property, and PCBA1BP, which has a hole-transport property, in a ratio of 0.5:0.5. The first light-emitting layer 113B has an electron-transport property by containing 35DCzPPy, which has an electron-transport property, and PCCP, which has a hole-transport property, in a ratio of 0.5:0.5.

Then, the electron-transport layer 114 was formed over the light-emitting layer 113 in such a way that a 10-nm-thick film of 2-[3-(dibenzothiophen-4-yl)phenyl]-1-phenyl-1H-benzimidazole (abbreviation: mDBTBIm-II) represented by Structural formula (x) was formed and a 20-nm-thick film of bathophenanthroline (abbreviation: BPhen) represented by Structural Formula (xi) was formed.

After the formation of the electron-transport layer 114, lithium fluoride (LiF) was deposited by evaporation to a thickness of 1 nm, so that the electron-injection layer 115 was formed. At last, aluminum was deposited by evaporation to a thickness of 200 nm to form the second electrode 102 functioning as a cathode. Thus, the light-emitting element 1 in this example was fabricated.

Note that in all the above evaporation steps, evaporation was performed by a resistance-heating method.

(Method for Fabricating Light-Emitting Element 2)

The light-emitting element 2 was fabricated with the same structure and process as the light-emitting element 1 except that the second light-emitting layer 113G was formed to a thickness of 10 nm.

The light-emitting element 1 and the light-emitting element 2 were sealed using a glass substrate in a glove box containing a nitrogen atmosphere so as not to be exposed to the air (specifically, a sealing material was applied onto an outer edge of the element and heat treatment was performed at 80° C. for 1 hour at the time of sealing). Then, the reliability of each of the light-emitting elements was measured. Note that the measurement was carried out at room temperature (in an atmosphere kept at 25° C.).

Figure 17:
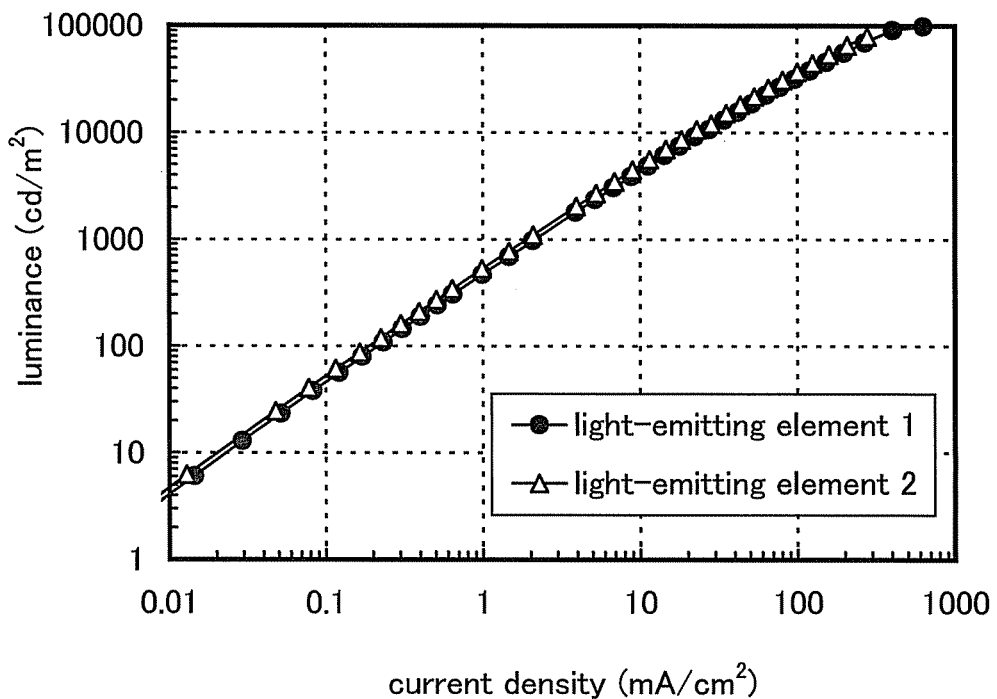
FIG. 17 is a graph showing current density-luminance characteristics of a light-emitting element 1 and a light-emitting element 2.
Figure 18:
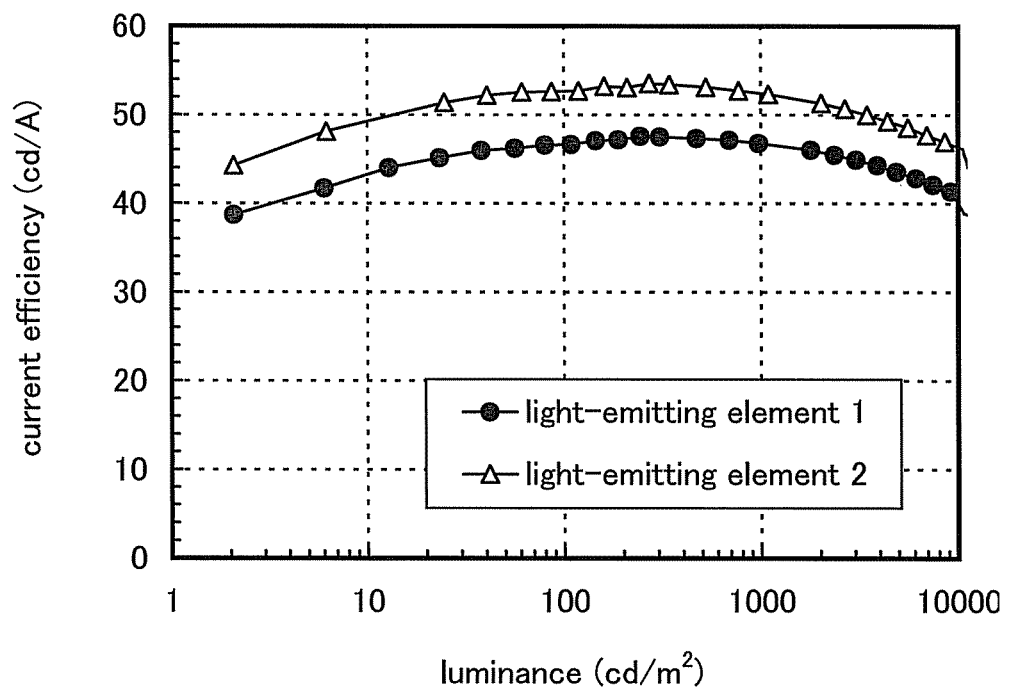
FIG. 18 is a graph showing luminance-current efficiency characteristics of a light-emitting element 1 and a light-emitting element 2.
Figure 19:
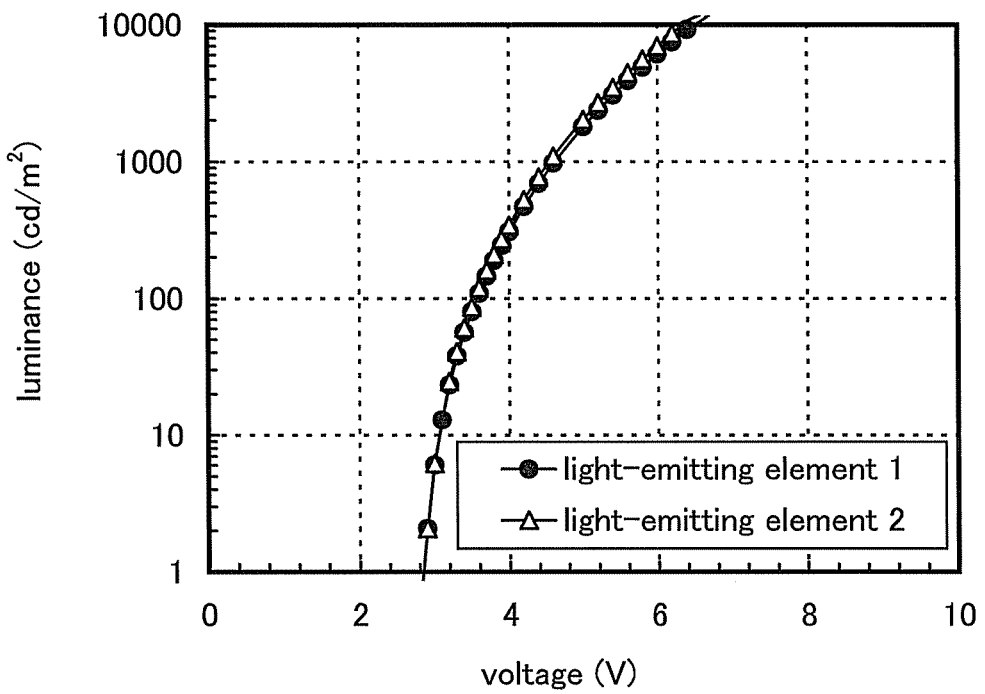
FIG. 19 is a graph showing voltage-luminance characteristics of a light-emitting element 1 and a light-emitting element 2.
Figure 20:
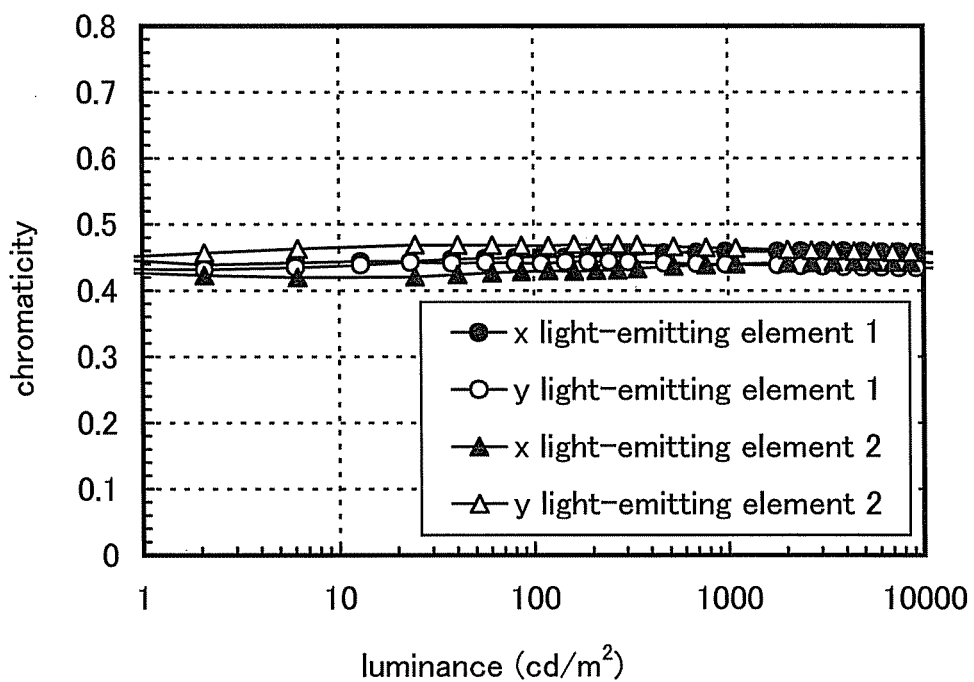
FIG. 20 is a graph showing luminance-chromaticity characteristics of a light-emitting element 1 and a light-emitting element 2.
Figure 21:
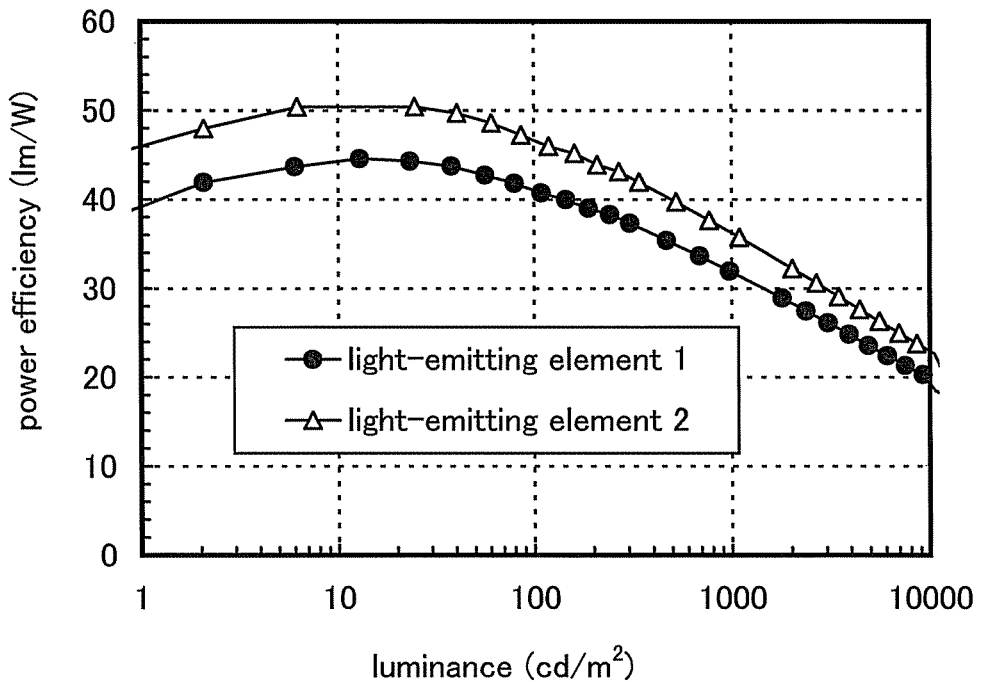
FIG. 21 is a graph showing luminance-power efficiency characteristics of a light-emitting element 1 and a light-emitting element 2.
Figure 22:
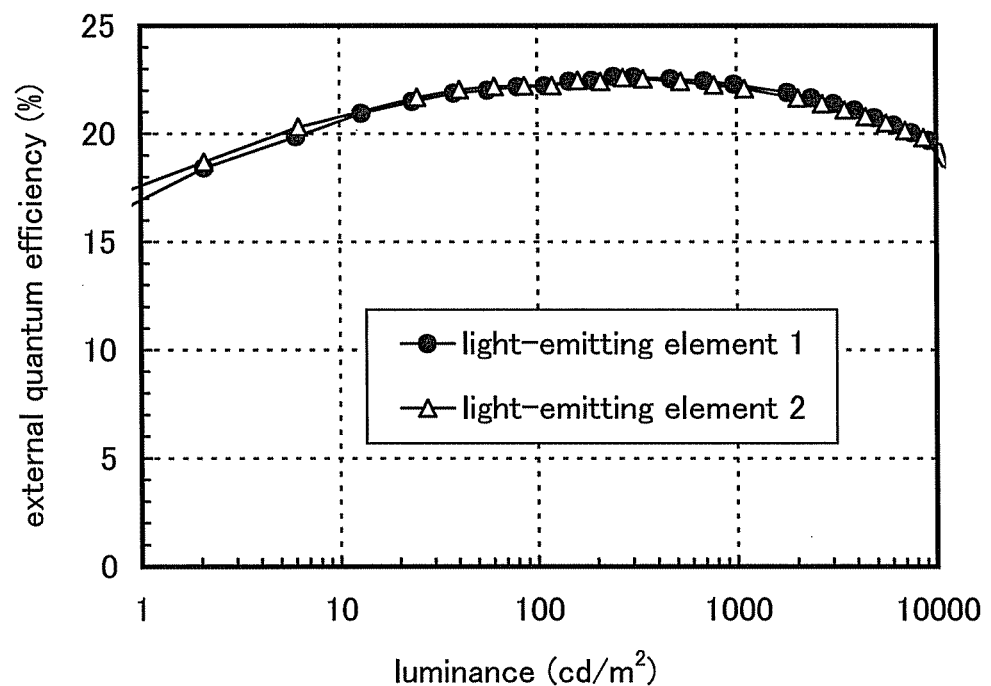
FIG. 22 is a graph showing luminance-external quantum efficiency characteristics of a light-emitting element 1 and a light-emitting element 2.
Figure 23:
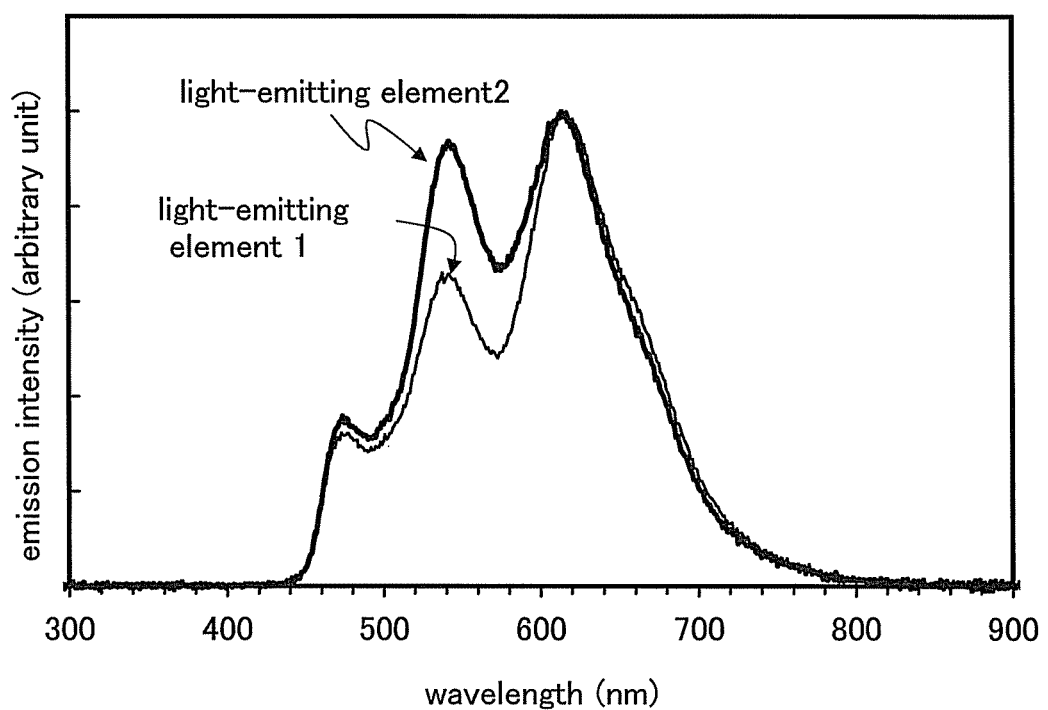
FIG. 23 shows emission spectra of a light-emitting element 1 and a light-emitting element 2.

FIG. 17 shows current density-luminance characteristics of the light-emitting element 1 and the light-emitting element 2; FIG. 18 shows luminance-current efficiency characteristics thereof; FIG. 19 shows voltage-luminance characteristics thereof; FIG. 20 shows luminance-chromaticity characteristics thereof; FIG. 21 shows luminance-power efficiency characteristics thereof; FIG. 22 shows luminance-external quantum efficiency characteristics thereof; and FIG. 23 shows emission spectra thereof.

It was found that the light-emitting element 1 showed extremely favorable characteristics of a current efficiency of 47 cd/A, an external quantum efficiency of 22%, and a power efficiency of 32 lm/W at around 1000 cd/m², which is a practical luminance. It was also shown that the emission color was a warm white color of 2930 K and the general color rendering index Ra was 91.7 to reveal a favorable color rendering property. The light-emitting element 2 was found to show extremely high efficiencies of a current efficiency of 52 cd/A, an external quantum efficiency of 22%, and a power efficiency of 36 lm/W at around 1000 cd/m², which is a practical luminance. Further, FIG. 20 reveals that the chromaticities of the light-emitting element 1 and the light-emitting element 2 each of which is one embodiment of the present invention are less dependent on luminance.

Recombination regions of carriers in the light-emitting element 1 and the light-emitting element 2 are each in the vicinity of the interface between the first light-emitting layer 113B and the second light-emitting layer 113G owing to the transport properties of the light-emitting layers; in spite of this fact, the third light-emitting layer 113R sufficiently provided light emission in each of the light-emitting element 1 including the second light-emitting layer 113G with a thickness of 5 nm and the light-emitting element 2 including the second light-emitting layer 113G with a thickness of 10 nm. Further, the spectrum clearly indicates light emitted from the light-emitting substances contained in the first light-emitting layer 113B to the third light-emitting layer 113R, which means that effective transfer of excitation energy occurred in a good balance.

Example 2

In this example, a light-emitting element (a light-emitting element 3) which has a structure different from that in Example 1 and which is one embodiment of the present invention is described. In the light-emitting element 3, a compound (4) (bis{2-[5-methyl-6-(2-methylphenyl)-4-pyrimidinyl-κN3]phenyl-κC}(2,4-pentanedionato-κ²O,O')iridium (III) (abbreviation: [Ir(mpmppm)₂(acac)])) which is a phosphorescent compound exhibiting a yellow emission color is used instead of [Ir(tBuppm)₂(acac)] which is used as the second compound in Example 1. Note that the other substances used in the light-emitting element 3 are the same as those used in the light-emitting element 1 and the light-emitting element 2 in Example 1.

A structural formula of the compound (4) ([Ir(mpmppm)₂(acac)]) is shown below. Structural Formulae of the other compounds are shown in Example 1 and are therefore omitted here.

[Chemical formula 3]

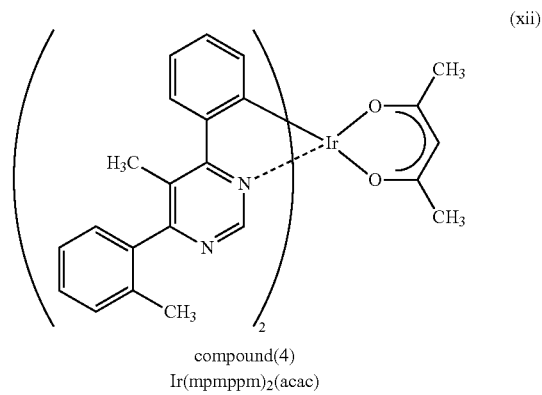

compound(4)
Ir(mpmppm)₂(acac)

Figure 24:
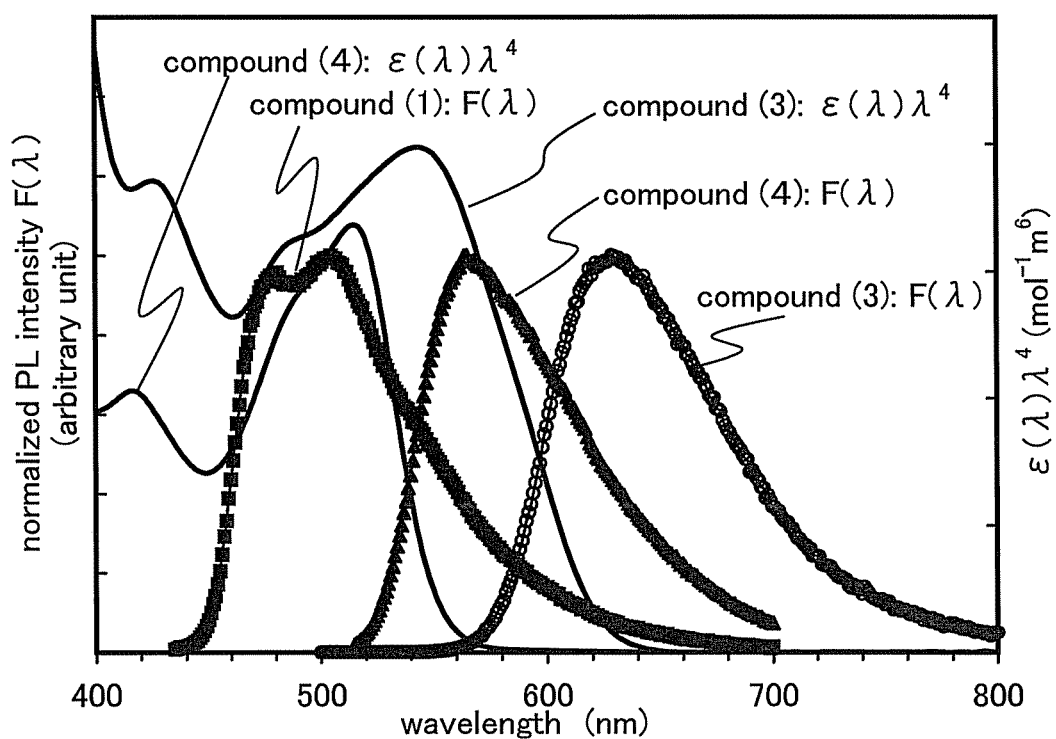
FIG. 24 explains Förster energy transfer from a blue phosphorescent compound.

Here, emission wavelengths F(λ) of the three kinds of phosphorescent compounds used in the light-emitting element 3, and the relation between the emission wavelengths F(λ) and ε(λ)λ⁴ of the compound (3) and the compound (4) are shown in FIG. 24. In the light-emitting element in this example, as shown in FIG. 24, the first light-emitting layer 113B contains the compound (1) as the first phosphorescent compound which provides blue light emission. The second light-emitting layer 113G contains the compound (4) as the second phosphorescent compound which emits light with a wavelength (an emission peak wavelength of 566 nm) longer than that of the light emitted from the first phosphorescent compound and which has, within a range of 440 nm to 520 nm (at 512 nm), the local maximum value A on the longest wavelength side of the function ε(λ)λ⁴. The third light-emitting layer 113R contains the compound (3) as the third phosphorescent compound which emits light with a wavelength longer than that of the light emitted from the second phosphorescent compound and which has, within a range of 520 nm to 600 nm (around 542 nm), the local maximum value B on the longest wavelength side of the function ε(λ)λ⁴. FIG. 24 also shows that the local maximum value B is larger than the local maximum value A.

A method for fabricating the light-emitting element 3 in this example is described below.

(Method for Fabricating Light-Emitting Element 3)

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 is an electrode that functions as an anode of the light-emitting element.

Next, as pretreatment for forming the light-emitting element over the substrate, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, 4,4',4''-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating, so that the hole-injection layer 111 was formed. The thickness of the hole-injection layer 111 was set to 40 nm, and the weight ratio of DBT3P-II to molybdenum oxide was adjusted to 4:2. Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) which is represented by Structural Formula (ii) was formed to a thickness of 20 nm over the hole-injection layer 111 to form the hole-transport layer 112.

Further, the light-emitting layer 113 was formed in the following manner. Over the hole-transport layer 112, 2-[3-(dibenzothiophen-4-yl)phenyl]dibenzo[f,h]quinoxaline (abbreviation: 2mDBTPDBq-II) represented by Structural Formula (iii), 4-phenyl-4'-(9-phenyl-9H-carbazol-3-yl)triphenylamine (abbreviation: PCBA1BP) represented by Structural Formula (iv), and bis(2,3,5-triphenylpyrazinato)(dipivaloylmethanato)iridium(III) (abbreviation: [Ir(tppr)$_2$(dpm)]) represented by Structural Formula (v) (the compound (3)) were deposited by co-evaporation to a thickness of 20 nm with a mass ratio of 2mDBTPDBq-II to PCBA1BP and [Ir(tppr)$_2$(dpm)] being 0.5:0.5:0.05, so that the third light-emitting layer 113R was formed; then, 2mDBTPDBq-II, PCBA1BP, and bis{2-[5-methyl-6-(2-methylphenyl)-4-pyrimidinyl-κN3]phenyl-κC}(2,4-pentanedionato-κ$^2$O,O')iridium(III) (abbreviation: [Ir(mpmppm)$_2$(acac)]) represented by Structural Formula (xii) (the compound (4)) were deposited by co-evaporation to a thickness of 5 nm with a mass ratio of 2mDBTPDBq-II to PCBA1BP and [Ir(mpmppm)$_2$(acac)] being 0.5:0.5:0.05, so that the second light-emitting layer 113G was formed; after that, 3,5-bis[3-(9H-carbazol-9-yl)phenyl]pyridine (abbreviation: 35DCzPPy) represented by Structural Formula (vii), 3,3'-bis(9-phenyl-9H-carbazole) (abbreviation: PCCP) represented by Structural Formula (viii), and tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]) represented by Structural Formula (ix) (the compound (1)) were deposited by co-evaporation to a thickness of 30 nm with a mass ratio of 35DCzPPy to PCCP and [Ir(mpptz-dmp)$_3$] being 0.5:0.5:0.06, so that the first light-emitting layer 113B was formed.

Note that 2mDBTPDBq-II and PCBA1BP form an exciplex and 35DCzPPy and PCCP form an exciplex. Further, the second light-emitting layer 113G and the third light-emitting layer 113R have hole-transport properties by containing 2mDBTPDBq-II, which has an electron-transport property, and PCBA1BP, which has a hole-transport property, in a ratio of 0.5:0.5. The first light-emitting layer 113B has an electron-transport property by containing 35DCzPPy, which has an electron-transport property, and PCCP, which has a hole-transport property, in a ratio of 0.5:0.5.

Then, the electron-transport layer 114 was formed over the light-emitting layer 113 in such a way that a 10-nm-thick film of 2-[3-(dibenzothiophen-4-yl)phenyl]-1-phenyl-1H-benzimidazole (abbreviation: mDBTBIm-II) represented by Structural formula (x) was faulted and a 20-nm-thick film of bathophenanthroline (abbreviation: BPhen) represented by Structural Formula (xi) was formed.

After the formation of the electron-transport layer 114, lithium fluoride (LiF) was deposited by evaporation to a thickness of 1 nm, so that the electron-injection layer 115 was formed. At last, aluminum was deposited by evaporation to a thickness of 200 nm to form the second electrode 102 functioning as a cathode. Thus, the light-emitting element 3 in this example was fabricated.

Note that in all the above evaporation steps, evaporation was performed by a resistance-heating method.

The light-emitting element 3 was sealed using a glass substrate in a glove box containing a nitrogen atmosphere so as not to be exposed to the air (specifically, a sealing material was applied onto an outer edge of the element and heat treatment was performed at 80° C. for 1 hour at the time of sealing). Then, the reliability of the light-emitting elements was measured. Note that the measurement was carried out at room temperature (in an atmosphere kept at 25° C.).

Figure 25:
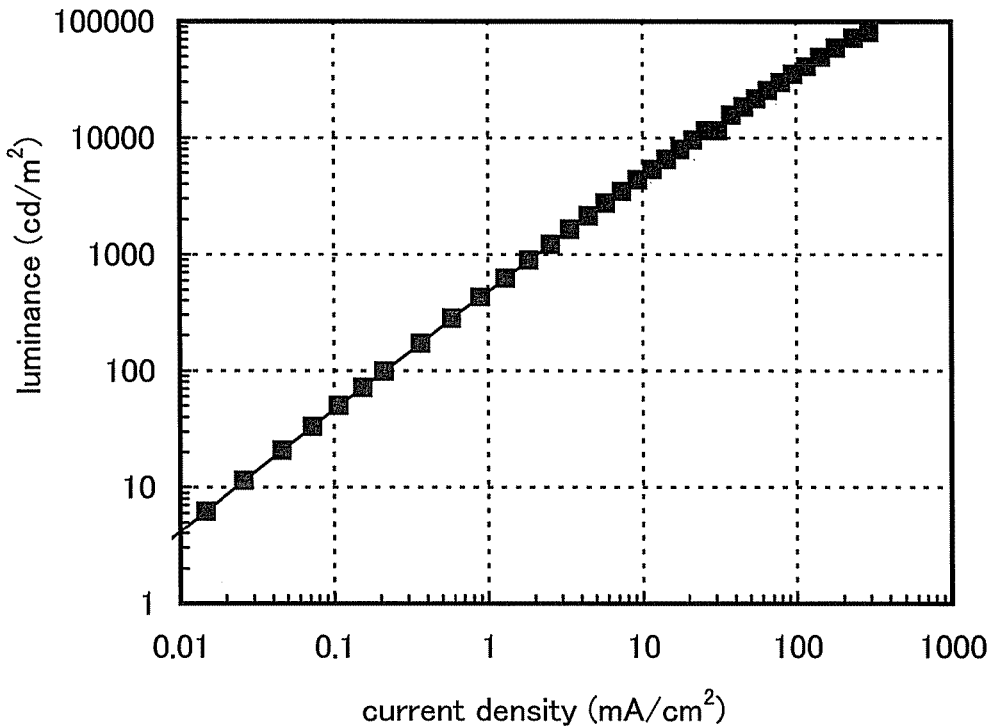
FIG. 25 is a graph showing current density-luminance characteristics of a light-emitting element 3.
Figure 26:
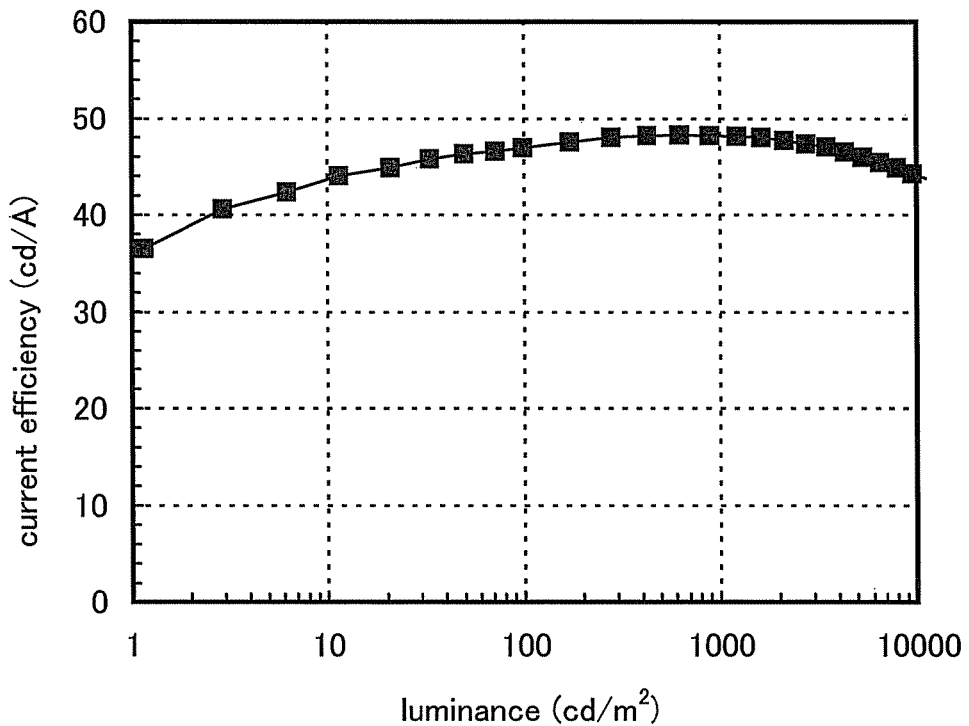
FIG. 26 is a graph showing luminance-current efficiency characteristics of a light-emitting element 3.
Figure 27:
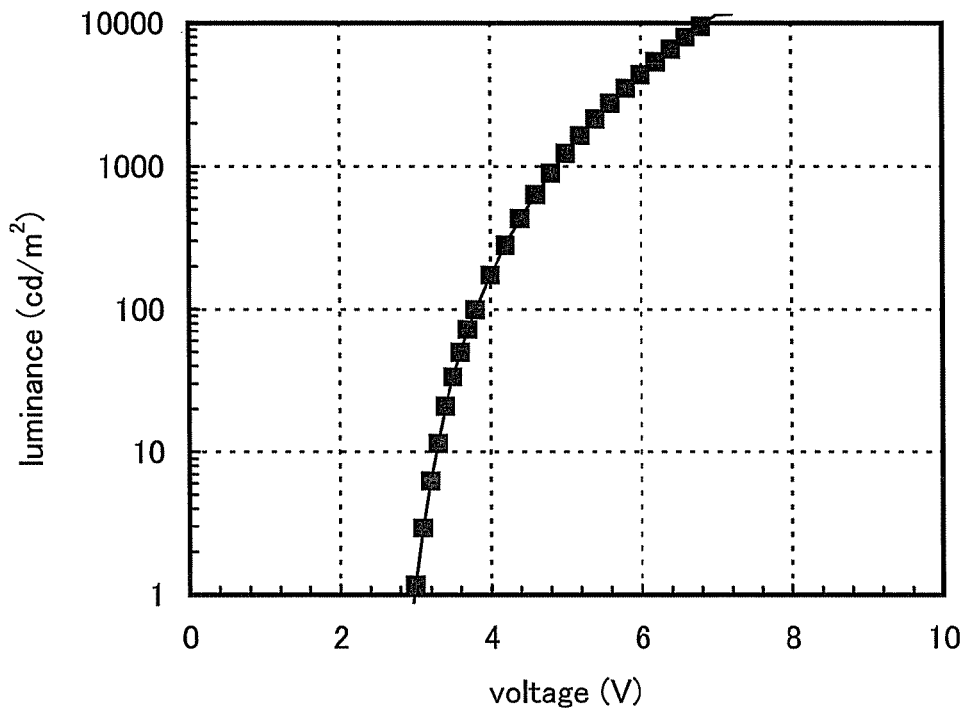
FIG. 27 is a graph showing voltage-luminance characteristics of a light-emitting element 3.
Figure 28:
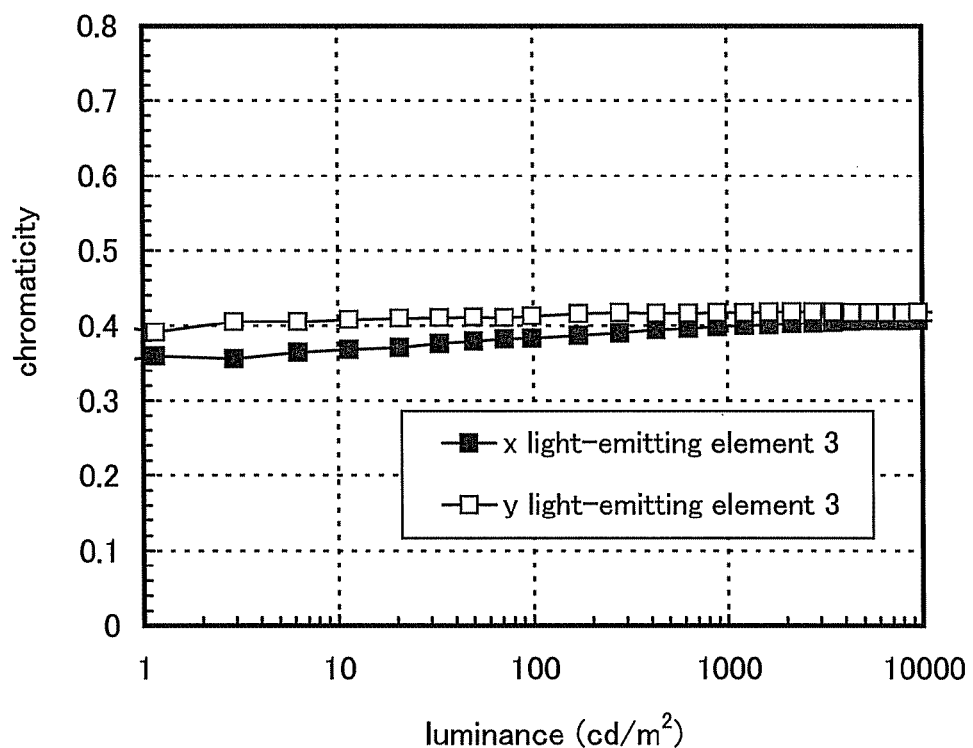
FIG. 28 is a graph showing luminance-chromaticity characteristics of a light-emitting element 3.
Figure 29:
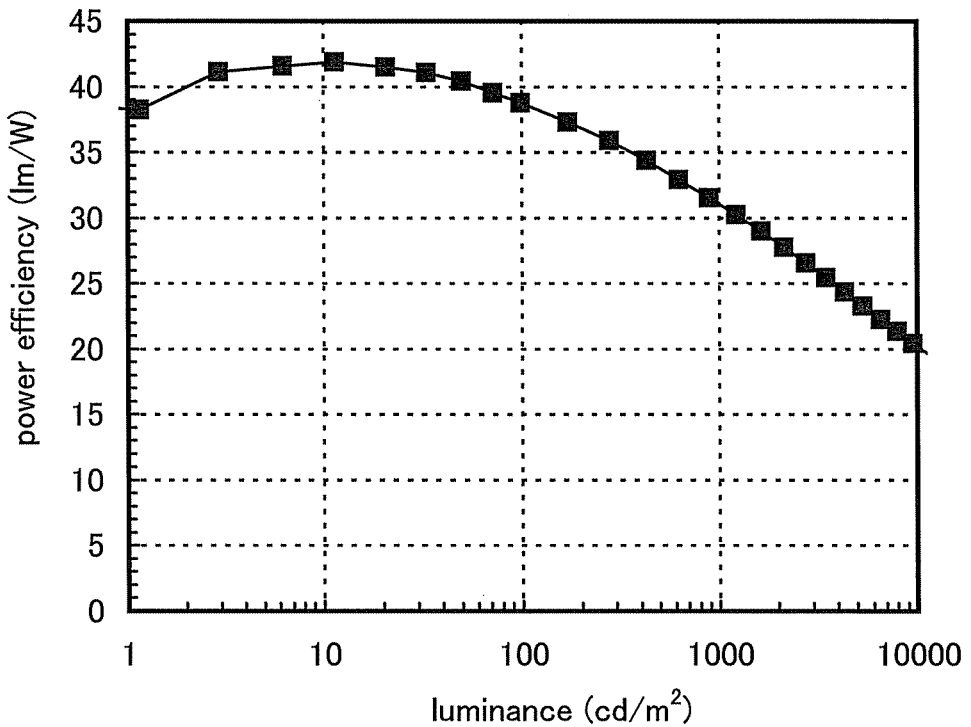
FIG. 29 is a graph showing luminance-power efficiency characteristics of a light-emitting element 3.
Figure 30:
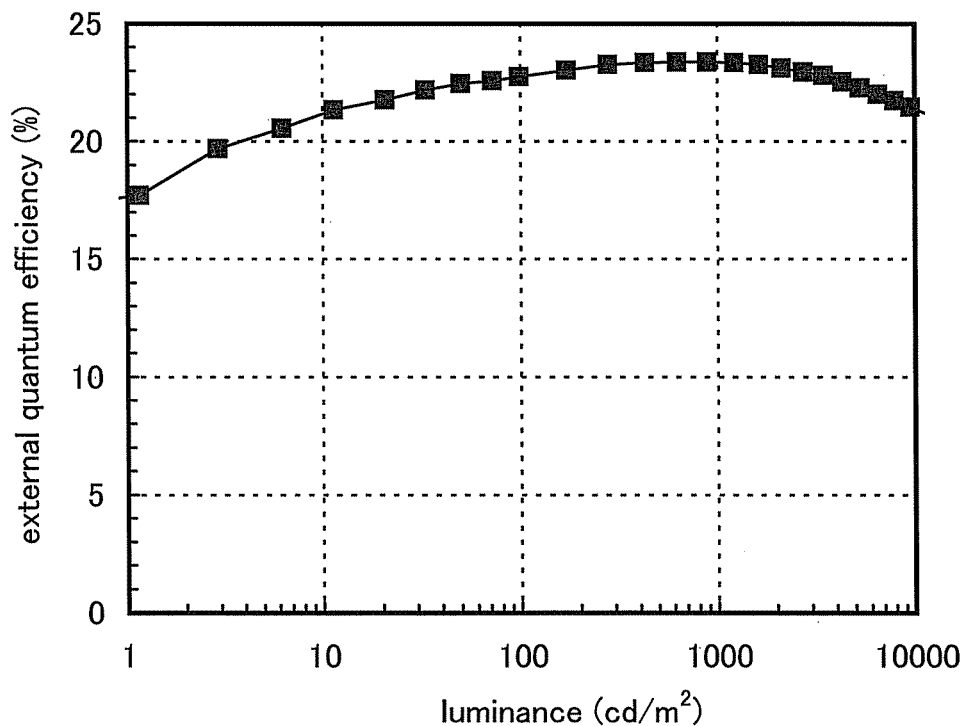
FIG. 30 is a graph showing luminance-external quantum efficiency characteristics of a light-emitting element 3.
Figure 31:
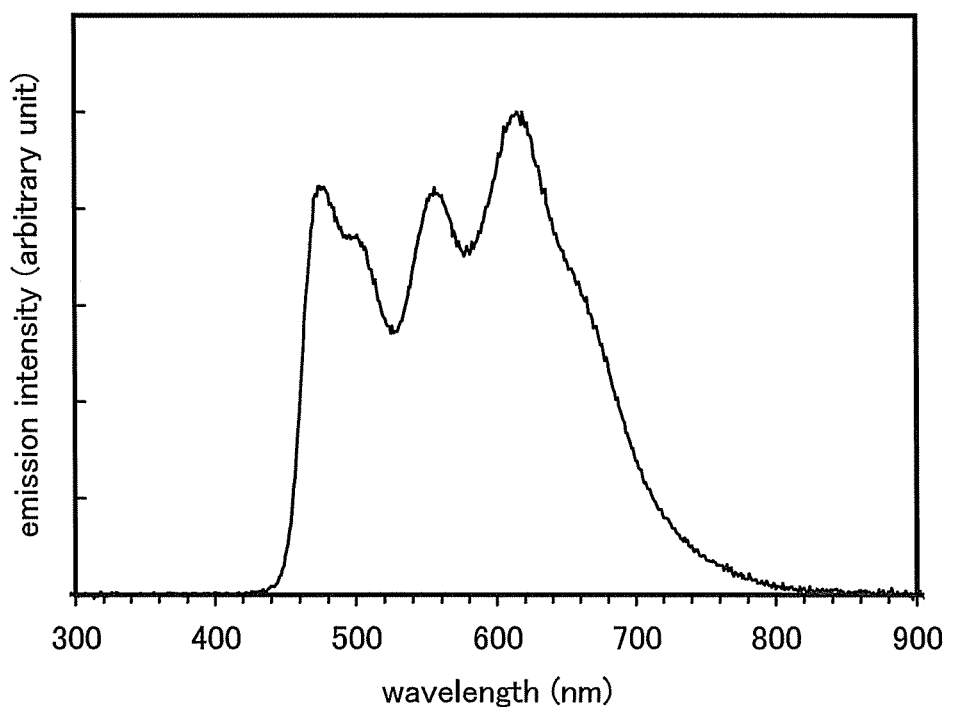
FIG. 31 shows an emission spectrum of a light-emitting element 3.

FIG. 25 shows current density-luminance characteristics of the light-emitting element 3; FIG. 26 shows luminance-current efficiency characteristics thereof; FIG. 27 shows voltage-luminance characteristics thereof; FIG. 28 shows luminance-chromaticity characteristics thereof; FIG. 29 shows luminance-power efficiency characteristics thereof; FIG. 30 shows luminance-external quantum efficiency characteristics thereof; and FIG. 31 shows an emission spectrum thereof.

It was found that the light-emitting element 3 showed extremely favorable characteristics of a current efficiency of 48 cd/A, an external quantum efficiency of 23%, and a power efficiency of 32 lm/W at around 1000 cd/m$^2$, which is a practical luminance. It was also shown that the emission color was a white color of 3860 K and the general color rendering index Ra was 85.1 to reveal a favorable color rendering property. Further, FIG. 20 reveals that the chromaticity of the light-emitting element 3 that is one embodiment of the present invention is less dependent on luminance.

A recombination region of carriers in the light-emitting element 3 is in the vicinity of the interface between the first light-emitting layer 113B and the second light-emitting layer 113G owing to the transport properties of the light-emitting layers; in spite of this fact, the third light-emitting layer 113R sufficiently provided light emission. Further, the spectrum clearly indicates light emitted from the light-emitting substances contained in the first light-emitting layer 113B to the third light-emitting layer 113R, which means that effective transfer of excitation energy occurred in a good balance in the light-emitting element 3.

Example 3

In this example, a light-emitting element 4 which has a structure different from the structures in Examples 1 and 2 and which is one embodiment of the present invention is described. In the light-emitting element 4, 4,4'-di(1-naphthyl)-4''-(9-phenyl-9H-carbazol-3-yl)triphenylamine (abbreviation: PCBNBB) represented by Structural Formula (xiii) is used instead of BPAFLP and PCBA1BP which are used in the light-emitting elements in Example 1; and 2-[3'-(dibenzothiophen-4-yl)biphenyl-3-yl]dibenzo[f,h]quinoxaline (abbreviation: 2mDBTBPDBq-II) represented by Structural Formula (xiv) was used instead of part of 35DCzPPy and 2mDBTPDBq-II which are used in the light-emitting elements in Example 1. Note that the phosphorescent compounds contained in the light-emitting layers are similar to those in Example 1; thus, the relations between the emission wavelengths ($F(\lambda)$ and $\epsilon(\lambda)\lambda^4$ are similar to those described in Example 1.

Structural Formulae of PCBNBB and 2mDBTBPDBq-II are shown below. The other compounds are the same as those used in Example 1 and structural formulae thereof are thus omitted here. Example 1 should be referred to.

[Chemical formula 4]

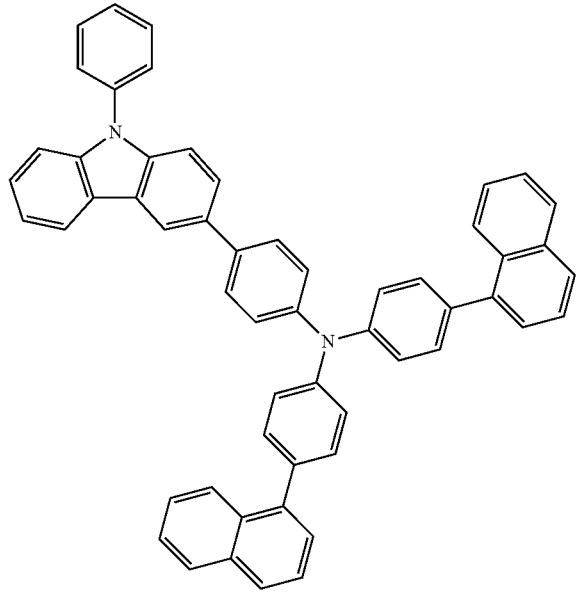

PCBNBB (xiii)

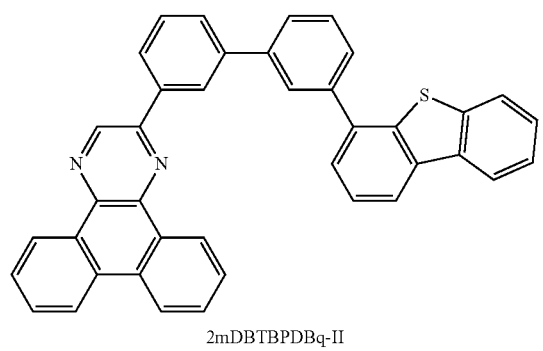

2mDBTBPDBq-II (xiv)

A method for fabricating the light-emitting element 4 in this example is described below.

(Method for Fabricating Light-Emitting Element 4)

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 is an electrode that functions as an anode of the light-emitting element.

Next, as pretreatment for forming the light-emitting element over the substrate, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, 4,4',4"-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating, so that the hole-injection layer 111 was formed. The thickness of the hole-injection layer 111 was set to 40 nm, and the weight ratio of DBT3P-II to molybdenum oxide was adjusted to 4:2. Note that the co-evaporation method refers to an evaporation method in which evaporation is carried out from a plurality of evaporation sources at the same time in one treatment chamber.

Next, a film of PCBNBB was formed to a thickness of 20 nm over the hole-injection layer 111 to form the hole-transport layer 112.

Further, the light-emitting layer 113 was formed in the following manner. Over the hole-transport layer 112, 2mDBTBPDBq-II, PCBNBB, and [Ir(tppr)$_2$(dpm)] were deposited by co-evaporation to a thickness of 10 nm with a mass ratio of 2mDBTBPDBq-II to PCBNBB and [Ir(tppr)$_2$(dpm)] being 0.5:0.5:0.05, so that the third light-emitting layer 113R was formed; then, 2mDBTBPDBq-II, PCBNBB, and [Ir(tBuppm)$_2$(acac)] were deposited by co-evaporation to a thickness of 10 nm with a mass ratio of 2mDBIBPDBq-H to PCBNBB and [Ir(tBuppm)$_2$(acac)] being 0.5:0.5:0.05, so that the second light-emitting layer 113G was formed; after that, 35DCzPPy, PCCP, and [Ir(mpptz-dmp)$_3$] were deposited by co-evaporation to a thickness of 30 nm with a mass ratio of 35DCzPPy to PCCP and [Ir(mpptz-dmp)$_3$] being 0.7:0.3:0.06, so that the first light-emitting layer 113B was formed.

Note that 2mDBTBPDBq-II and PCBNBB form an exciplex and 35DCzPPy and PCCP form an exciplex. Further, the second light-emitting layer 113G and the third light-emitting layer 113R have hole-transport properties by containing 2mDBTBPDBq-II, which has an electron-transport property, and PCBNBB, which has a hole-transport property, in a ratio of 0.5:0.5. The first light-emitting layer 113B has an electron-transport property by containing 35DCzPPy, which has an electron-transport property, and PCCP, which has a hole-transport property, in a ratio of 0.5:0.5.

Then, the electron-transport layer 114 was formed over the light-emitting layer 113 in such a way that a 10-nm-thick film of 35DCzPPy was formed and a 20-nm-thick film of BPhen was formed.

After the formation of the electron-transport layer 114, lithium fluoride (LiF) was deposited by evaporation to a thickness of 1 nm, so that the electron-injection layer 115 was formed. At last, aluminum was deposited by evaporation to a thickness of 200 nm to form the second electrode 102 functioning as a cathode. Thus, the light-emitting element 4 in this example was fabricated.

Note that in all the above evaporation steps, evaporation was performed by a resistance-heating method.

The light-emitting element 4 was sealed using a glass substrate in a glove box containing a nitrogen atmosphere so as not to be exposed to the air (specifically, a sealing material was applied onto an outer edge of the element and heat treatment was performed at 80° C. for 1 hour at the time of sealing). Then, the reliability of the light-emitting elements was measured. Note that the measurement was carried out at room temperature (in an atmosphere kept at 25° C.).

Figure 32:
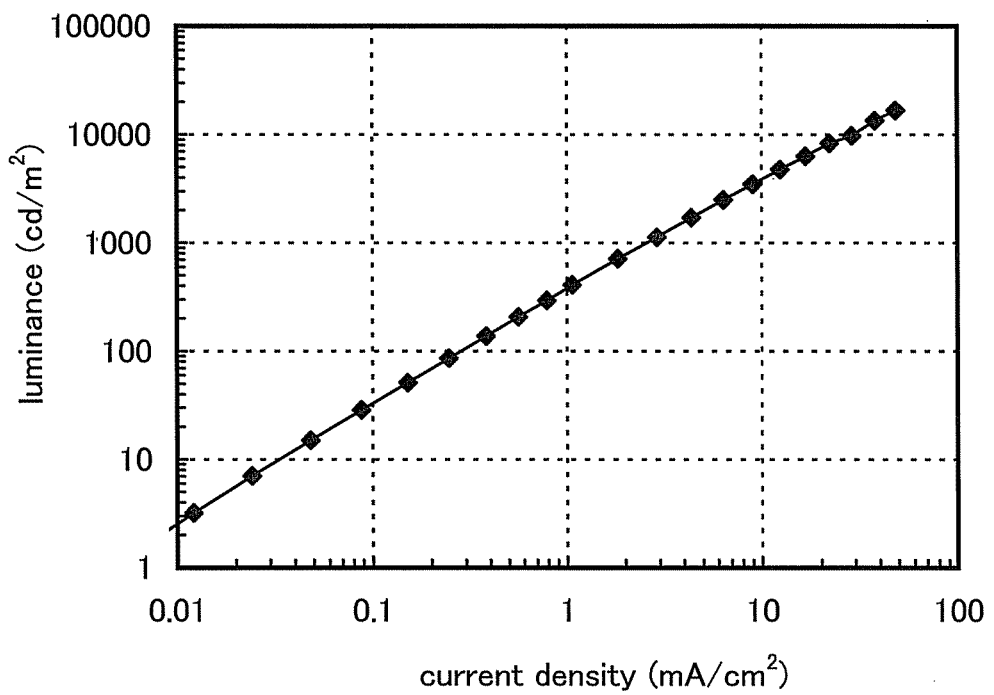
FIG. 32 is a graph showing current density-luminance characteristics of a light-emitting element 4.
Figure 33:
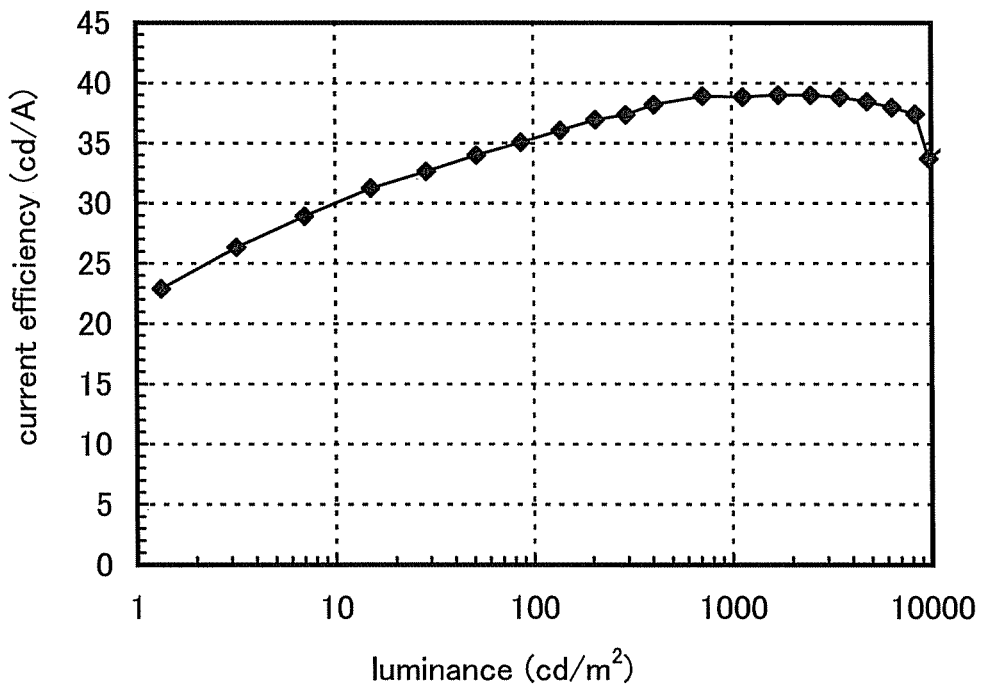
FIG. 33 is a graph showing luminance-current efficiency characteristics of a light-emitting element 4.
Figure 34:
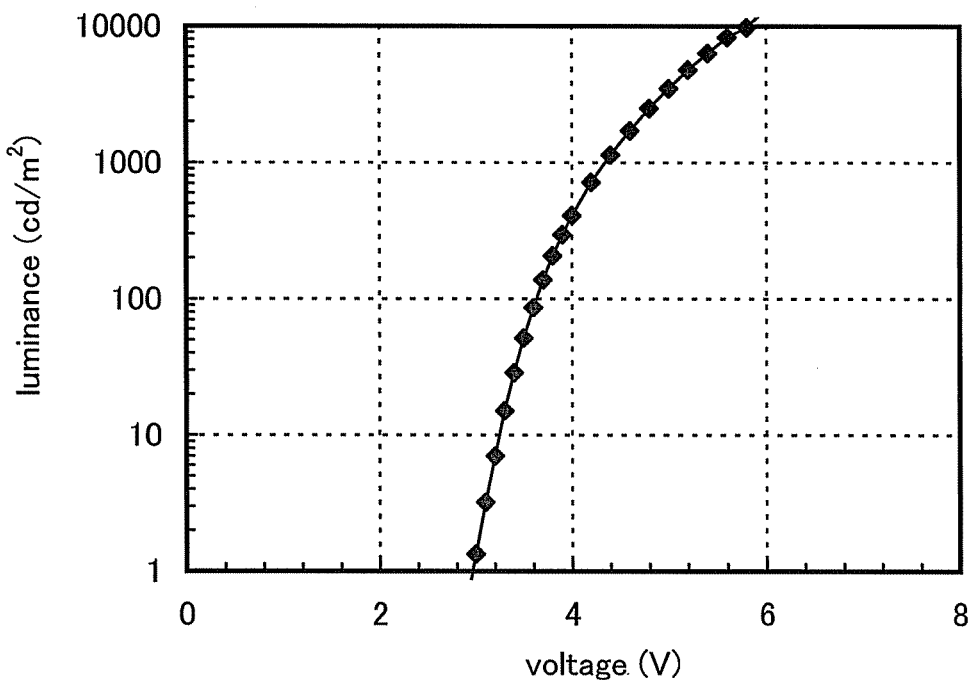
FIG. 34 is a graph showing voltage-luminance characteristics of a light-emitting element 4.
Figure 35:
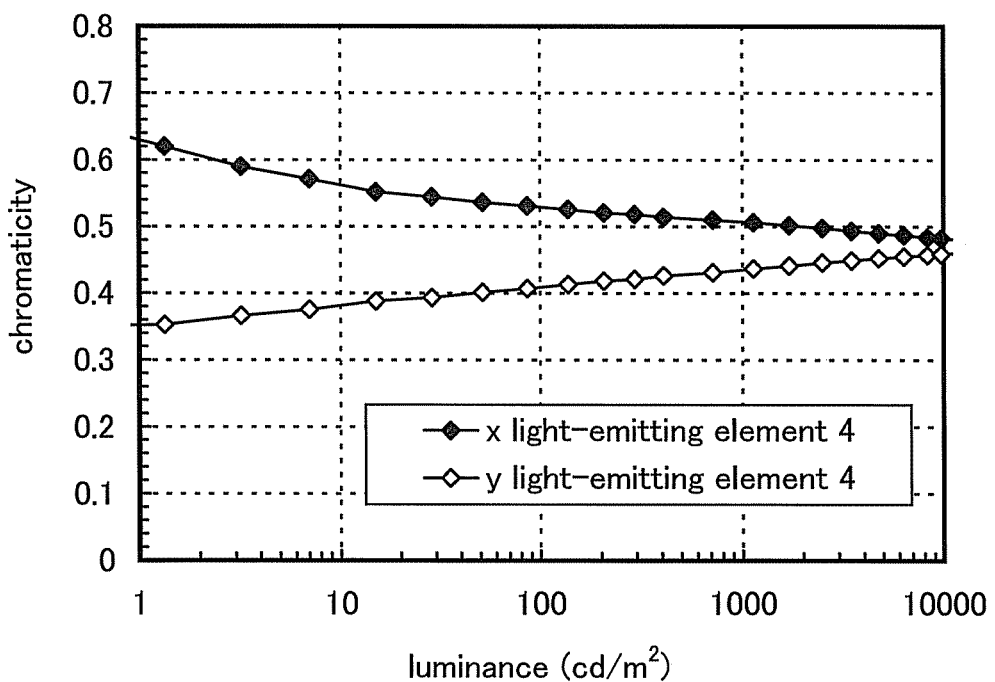
FIG. 35 is a graph showing luminance-chromaticity characteristics of a light-emitting element 4.
Figure 36:
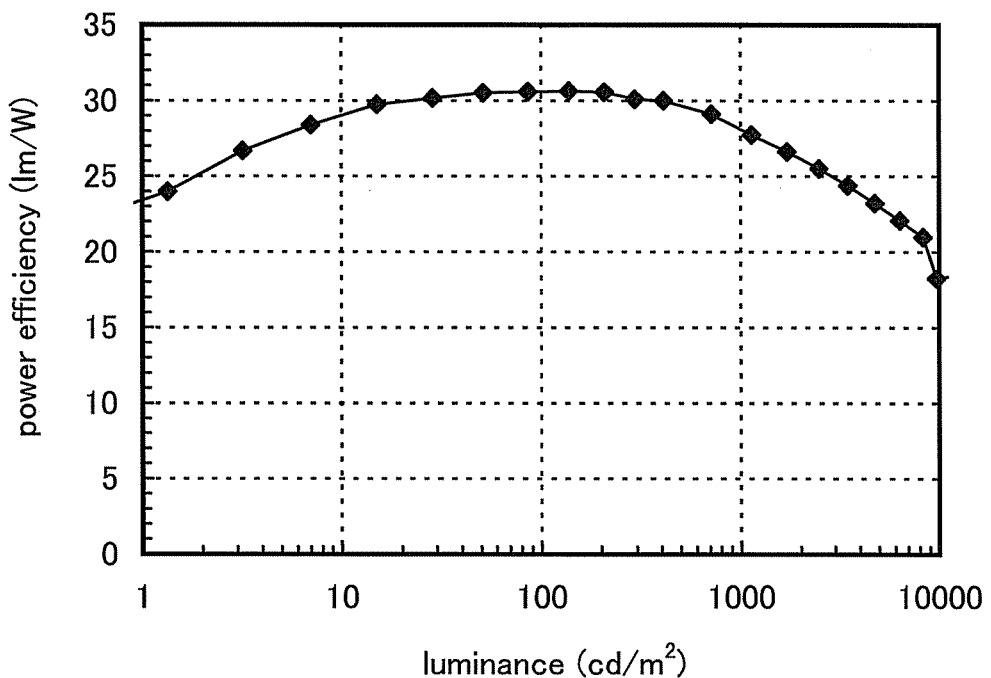
FIG. 36 is a graph showing luminance-power efficiency characteristics of a light-emitting element 4.
Figure 37:
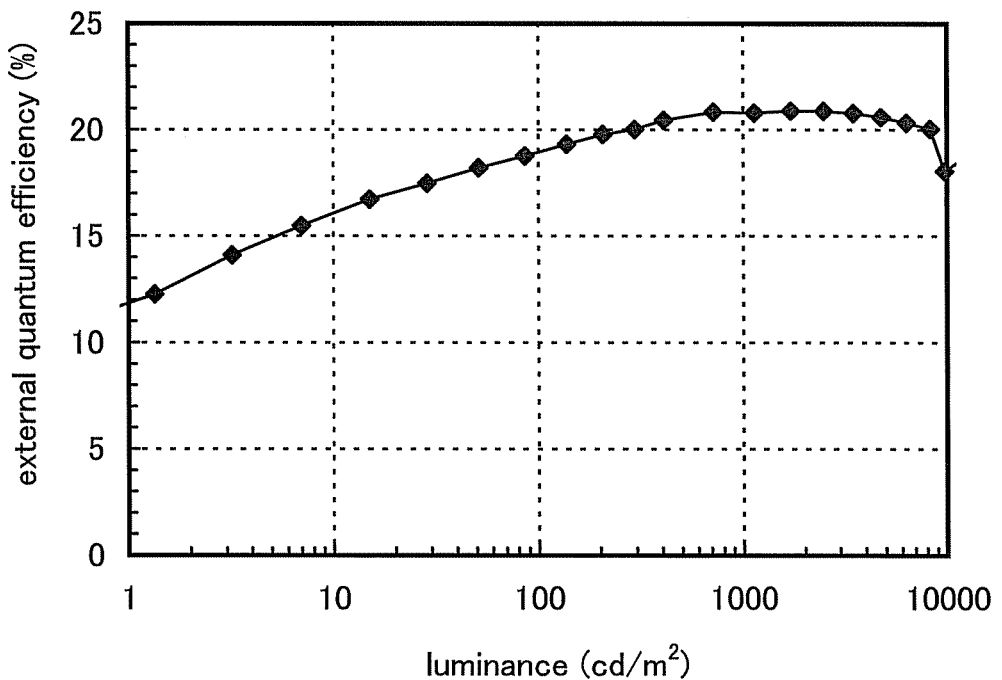
FIG. 37 is a graph showing luminance-external quantum efficiency characteristics of a light-emitting element 4.
Figure 38:
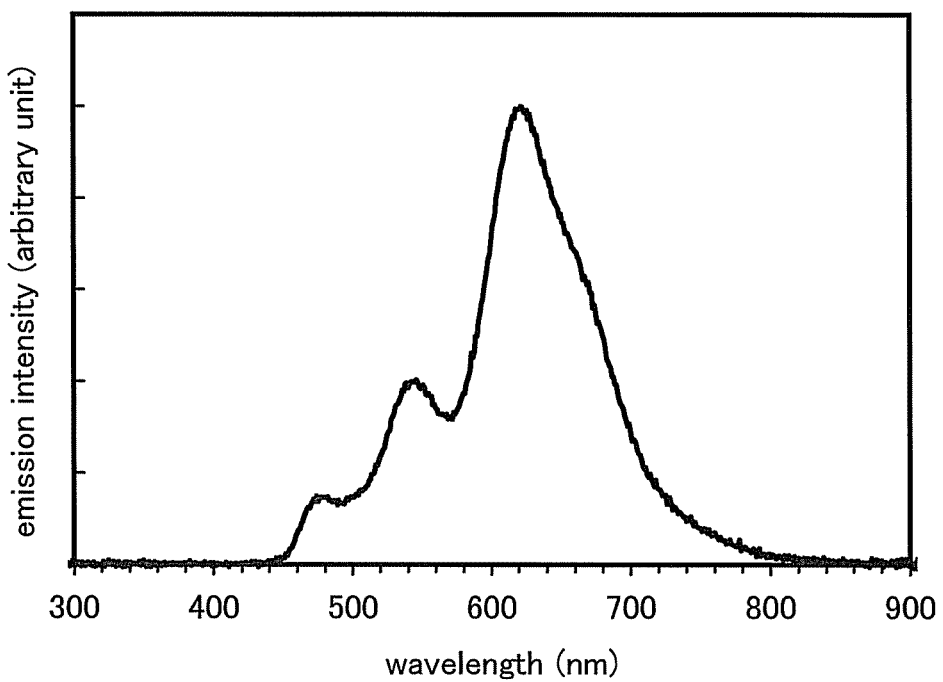
FIG. 38 shows an emission spectrum of a light-emitting element 4.

FIG. 32 shows current density-luminance characteristics of the light-emitting element 4; FIG. 33 shows luminance-current efficiency characteristics thereof; FIG. 34 shows voltage-luminance characteristics thereof; FIG. 35 shows luminance-chromaticity characteristics thereof; FIG. 36 shows luminance-power efficiency characteristics thereof; FIG. 37 shows luminance-external quantum efficiency characteristics thereof; and FIG. 38 shows an emission spectrum thereof.

It was found that the light-emitting element 4 showed favorable characteristics of a current efficiency of 39 cd/A, an external quantum efficiency of 21%, and a power efficiency of 29 lm/W at around 1000 cd/m$^2$, which is a practical luminance. It was also shown that the light had a color of 2260 K and the general color rendering index Ra was 93.4 to reveal a favorable color rendering property.

A recombination region of carriers in the light-emitting element 4 is in the vicinity of the interface between the first light-emitting layer 113B and the second light-emitting layer 113G owing to the transport properties of the light-emitting layers; in spite of this fact, the third light-emitting layer 113R sufficiently provided light emission. Further, the spectrum clearly indicates light emitted from the light-emitting substances contained in the first light-emitting layer 113B to the third light-emitting layer 113R, which means that effective transfer of excitation energy occurred in a good balance.

Figure 39:
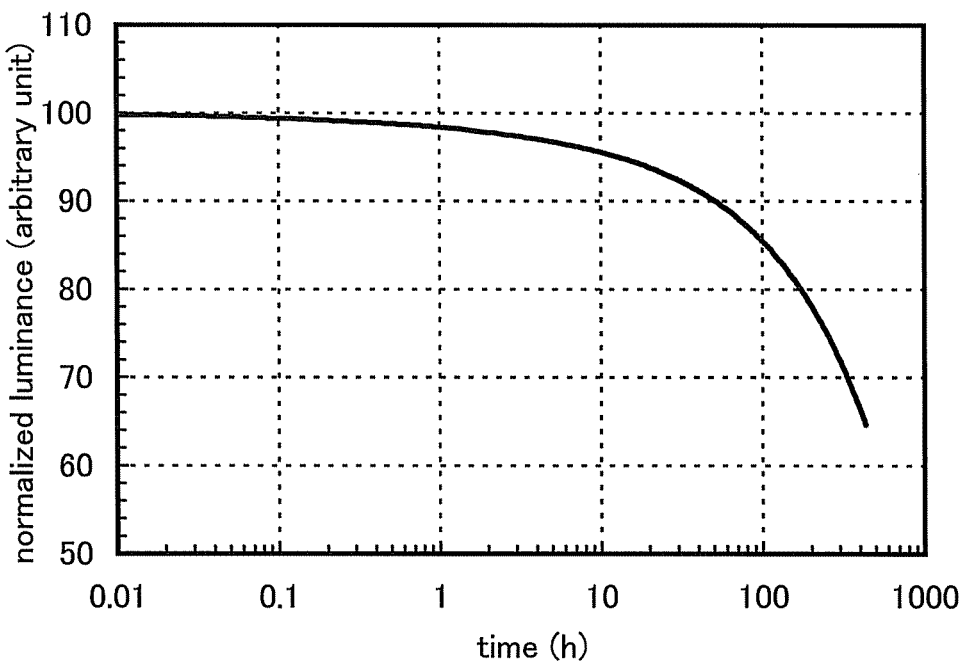
FIG. 39 is a graph showing time-normalized luminance characteristics of a light-emitting element 4.

A reliability test was conducted. In the reliability test, a change in luminance with driving time was measured with an initial luminance taken as 100% under the conditions where the initial luminance was 3000 cd/m$^2$ and the current density was constant. The measurement result is shown in FIG. 39. From the graph, it was found that despite the fact that all the light-emitting layers emit phosphorescence, i.e., the light-emitting element 4 is what is called an all-phosphorescent element, 65% of the initial luminance was kept even after 440 hours elapsed, which means that the light-emitting element 4 that is one embodiment of the present invention also has high durability as an element.

Reference Example 1

A synthesis method of tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), which is the organometallic complex used in the above embodiment, is described. A structure of [Ir(mpptz-dmp)$_3$] (abbreviation) is shown below.

[Chemical formula 5]

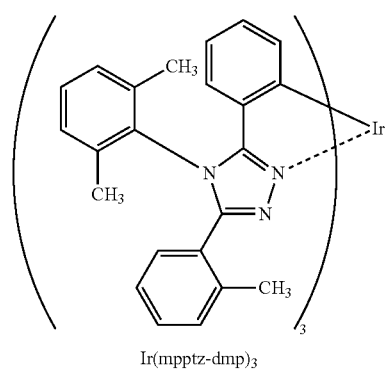

Ir(mpptz-dmp)$_3$

Step 1: Synthesis of 3-(2-Methylphenyl)-4-(2,6-dimethylphenyl)-5-phenyl-4H-1,2,4-triazole (abbreviation: Hmpptz-dmp)

First, 12.6 g (43.3 mmol) of N-[1-chloro-1-(2-methylphenyl)methylidene]-N'-[1-chloro-(1-phenyl)methylidene]hydrazine, 15.7 g (134.5 mmol) of 2,6-dimethylaniline, and 100 ml of N,N-dimethylaniline were put into a 500-ml recovery flask and heated and stirred at 120° C. for 20 hours. After reaction for the predetermined time, this reacted solution was slowly added to 200 ml of 1N hydrochloric acid. Dichloromethane was added to this solution and an objective substance was extracted to an organic layer. The obtained organic layer was washed with water and an aqueous solution of sodium hydrogen carbonate, and was dried with magnesium sulfate. The magnesium sulfate was removed by gravity filtration, and the obtained filtrate was concentrated to give a black liquid. This liquid was purified by silica gel column chromatography. A mixed solvent of ethyl acetate and hexane in a ratio of 1:5 was used as a developing solvent. The obtained fraction was concentrated to give a white solid. This solid was recrystallized with ethyl acetate to give 4.5 g of a white solid of Hmpptz-dmp in a yield of 31%. A synthesis scheme of Step 1 is shown below.

[Chemical formula 6]

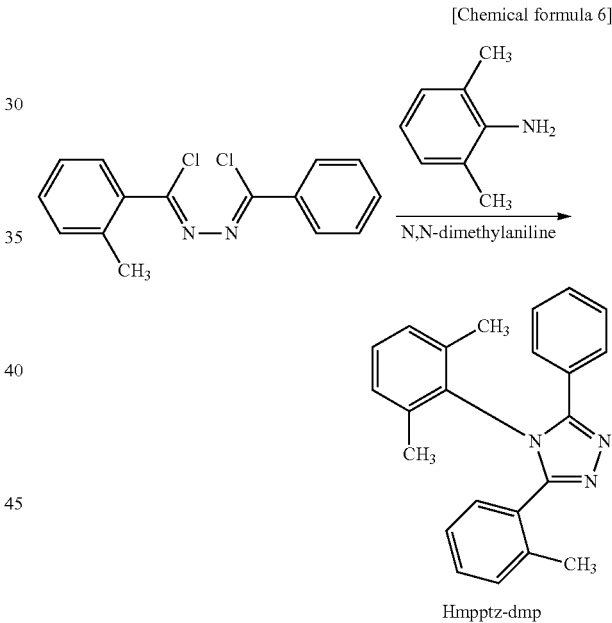

Hmpptz-dmp

Step 2: Synthesis of Tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$)

Then, 2.5 g (7.4 mmol) of Hmpptz-dmp, which was the ligand obtained in Step 1, and 0.7 g (1.5 mmol) of tris(acetylacetonato)iridium(III) were put into a container for high-temperature heating, and degasification was carried out. The mixture in the reaction container was heated and stirred at 250° C. for 48 hours under Ar flow. After reaction for the predetermined time, the obtained solid was washed with dichloromethane, and an insoluble green solid was obtained by suction filtration. This solid was dissolved in toluene and filtered through a stack of alumina and Celite. The obtained fraction was concentrated to give a green solid. This solid was recrystallized with toluene, so that 0.8 g of a green powder of

[Ir(mpptz-dmp)₃] (abbreviation), which is the phosphorescent organometallic iridium complex, was obtained in a yield of 45%. A synthesis scheme of Step 2 is shown below.

[Chemical formula 7]

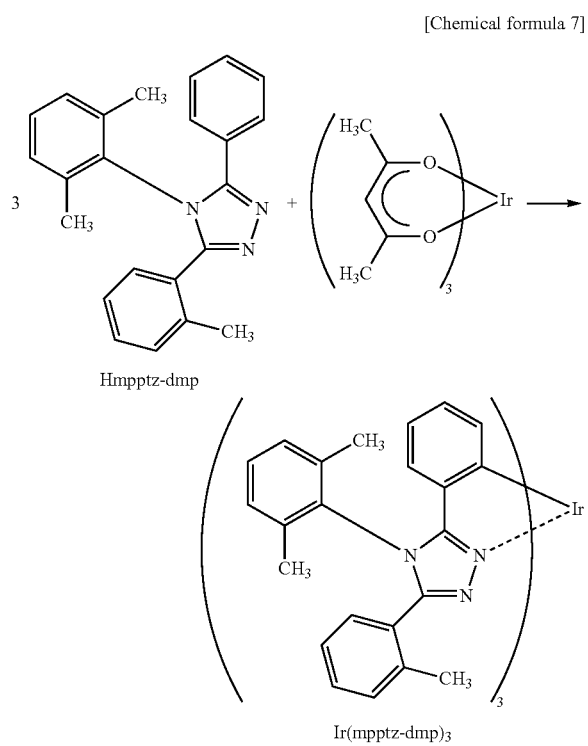

Ir(mpptz-dmp)₃

An analysis result by nuclear magnetic resonance (¹H-NMR) spectroscopy of the green powder obtained in Step 2 is described below. The result revealed that the organometallic complex Ir(mpptz-dmp)₃ (abbreviation) was obtained by the synthesis method.

¹H-NMR. δ(toluene-d8): 1.82 (s, 3H), 1.90 (s, 3H), 2.64 (s, 3H), 6.56-6.62 (m, 3H), 6.67-6.75 (m, 3H), 6.82-6.88 (m, 1H), 6.91-6.97 (t, 1H), 7.00-7.12 (m, 2H), 7.63-7.67 (d, 1H).

Reference Example 2

A synthesis example of the organometallic complex (acetylacetonato)bis(6-tert-butyl-4-phenylpyrimidinato)iridium(III) (another name: bis[2-(6-tert-butyl-4-pyrimidinyl-κN3)phenyl-κC](2,4-pentanedionato-κ²O,O')iridium(III)) (abbreviation: [Ir(tBuppm)₂(acac)]), which is used in the above embodiment, is described. The structure of [Ir(tBuppm)₂(acac)] is shown below.

[Chemical formula 8]

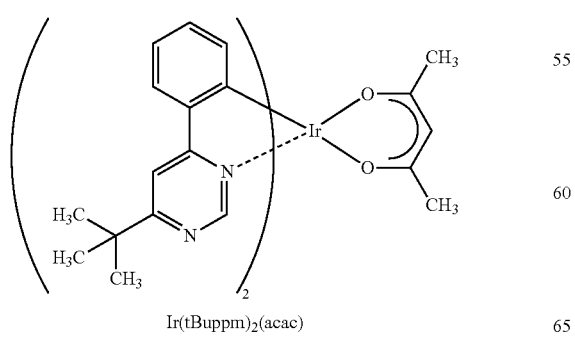

Ir(tBuppm)₂(acac)

Step 1: Synthesis of 4-tert-Butyl-6-phenylpyrimidine (abbreviation: HtBuppm)

First, 22.5 g of 4,4-dimethyl-1-phenylpentane-1,3-dione and 50 g of formamide were put into a recovery flask equipped with a reflux pipe, and the air in the flask was replaced with nitrogen. This reaction container was heated, so that the reacted solution was refluxed for 5 hours. After that, this solution was poured into an aqueous solution of sodium hydroxide, and an organic layer was extracted with dichloromethane. The obtained organic layer was washed with water and saturated saline, and dried with magnesium sulfate. The solution after drying was filtered. The solvent of this solution was distilled off, and then the obtained residue was purified by silica gel column chromatography using hexane and ethyl acetate as a developing solvent in a volume ratio of 10:1, so that a pyrimidine derivative HtBuppm (colorless oily substance, yield of 14%) was obtained. A synthesis scheme of Step 1 is shown below.

[Chemical formula 9]

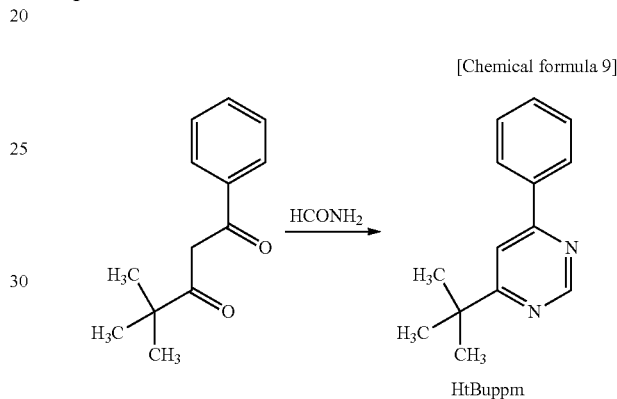

HtBuppm

Step 2: Synthesis of Di-μ-chloro-bis[bis(6-tert-butyl-4-phenylpyrimidinato)iridium(III)] (abbreviation: [Ir(tBuppm)₂Cl]₂)

Next, 15 mL of 2-ethoxyethanol, 5 mL of water, 1.49 g of HtBuppm obtained in Step 1, and 1.04 g of iridium chloride hydrate (IrCl₃·H₂O) were put into a recovery flask equipped with a reflux pipe, and the air in the flask was replaced with argon. After that, irradiation with microwaves (2.45 GHz, 100 W) was performed for 1 hour to cause a reaction. The solvent was distilled off, and then the obtained residue was suction-filtered and washed with ethanol, so that a Binuclear complex [Ir(tBuppm)₂Cl]₂ (yellow green powder, yield of 73%) was obtained. A synthesis scheme of Step 2 is shown below.

[Chemical formula 10]

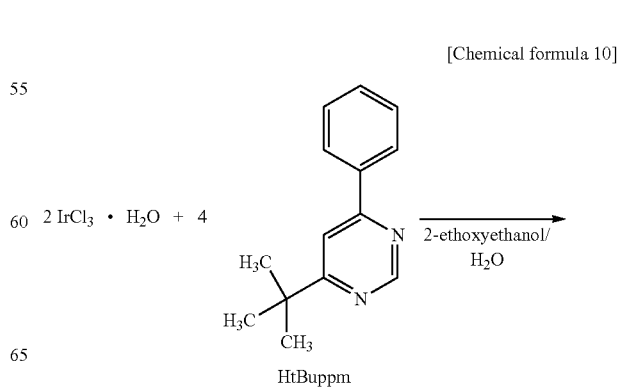

HtBuppm

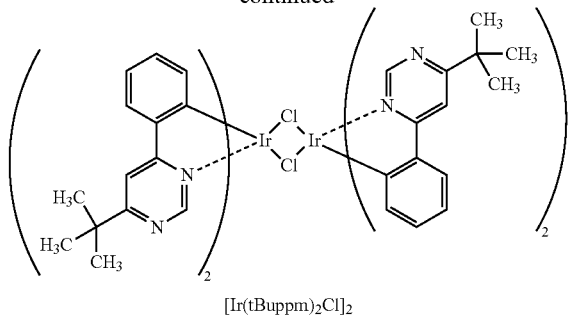

[Ir(tBuppm)₂Cl]₂

Step 3: Synthesis of (Acetylacetonato)bis(6-tert-butyl-4-phenylpyrimidinato)iridium(III) (abbreviation: [Ir(tBuppm)₂(acac)])

Further, 40 mL of 2-ethoxyethanol, 1.61 g of the dinuclear complex [Ir(tBuppm)₂Cl]₂ obtained in Step 2, 0.36 g of acetylacetone, and 1.27 g of sodium carbonate were put into a recovery flask equipped with a reflux pipe, and the air in the flask was replaced with argon. After that, irradiation with microwaves (2.45 GHz, 120 W) was performed for 60 minutes to cause a reaction. The solvent was distilled off, and the obtained residue was suction-filtered with ethanol and washed with water and ethanol. This solid was dissolved in dichloromethane, and the mixture was filtered through a filter aid in which Celite (produced by Wako Pure Chemical Industries, Ltd., Catalog No. 531-16855), alumina, and Celite were stacked in this order. The solvent was distilled off, and the obtained solid was recrystallized with a mixed solvent of dichloromethane and hexane, so that the objective substance was obtained as yellow powder (yield of 68%). A synthesis scheme of Step 3 is shown below.

[Chemical formula 11]

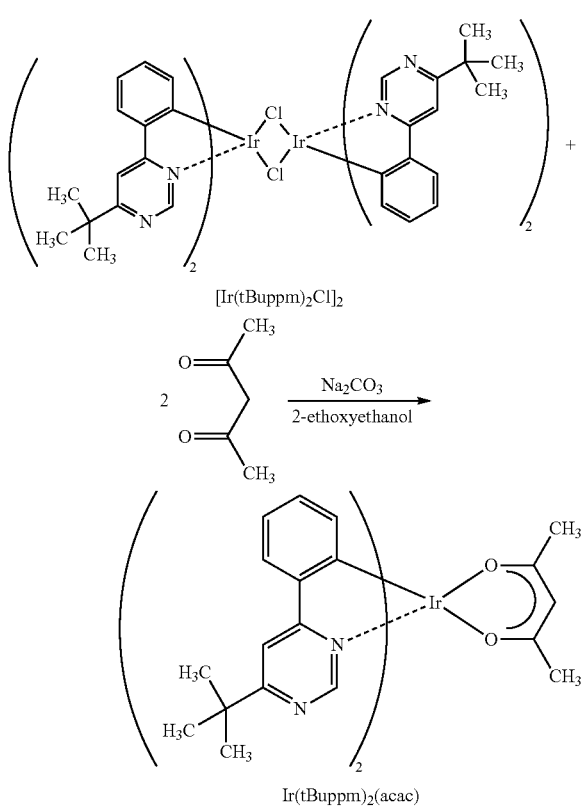

An analysis result by nuclear magnetic resonance (¹H NMR) spectroscopy of the yellow powder obtained in Step 3 is described below. The result revealed that the organometallic complex Ir(tBuppm)₂(acac) was obtained.

¹H NMR. δ (CDCl₃): 1.50 (s, 18H), 1.79 (s, 6H), 5.26 (s, 1H), 6.33 (d, 2H), 6.77 (t, 2H), 6.85 (t, 2H), 7.70 (d, 2H), 7.76 (s, 2H), 9.02 (s, 2H).

REFERENCE NUMERALS

10: electrode, 11: electrode, 101: first electrode, 102: second electrode, 103: EL layer, 111: hole-injection layer, 112: hole-transport layer, 113: light-emitting layer, 113B: first light-emitting layer, 113Bd: first phosphorescent compound, 113Bh: first host material, 113G: second light-emitting layer, 113Gd: second phosphorescent compound, 113Gh: second host material, 113R: third light-emitting layer, 113Rd: third phosphorescent compound, 113Rh: third host material, 113ex: recombination region, 114: electron-transport layer, 115: electron-injection layer, 400: substrate, 401: first electrode, 402: auxiliary electrode, 403: EL layer, 404: second electrode, 405: sealing material, 406: sealing material, 407: sealing substrate, 412: pad, 420: IC chip, 601: driver circuit portion (source line driver circuit), 602: pixel portion, 603: driver circuit portion (gate line driver circuit), 604: sealing substrate, 605: sealing material, 607: space, 608: wiring, 609: FPC (flexible printed circuit), 610: element substrate, 611: switching TFT, 612: current controlling TFT, 613: first electrode, 614: insulator, 616: EL layer, 617: second electrode, 618: light-emitting element, 623: n-channel TFT, 624: p-channel TFT, 625: drying agent, 901: housing, 902: liquid crystal layer, 903: backlight unit, 904: housing, 905: driver IC, 906: terminal, 951: substrate, 952: electrode, 953: insulating layer, 954: partition layer, 955: EL layer, 956: electrode, 1001: substrate, 1002: base insulating film, 1003: gate insulating film, 1006: gate electrode, 1007: gate electrode, 1008: gate electrode, 1020: first interlayer insulating film, 1021: second interlayer insulating film, 1022: electrode, 1024W: first electrode of a light-emitting element, 1024R: first electrode of a light-emitting element, 1024G: first electrode of a light-emitting element, 1024B: first electrode of a light-emitting element, 1025: partition wall, 1028: layer containing an organic compound, 1029: second electrode of a light-emitting element, 1031: sealing substrate, 1032: sealant, 1033: transparent base material, 1034R: red coloring layer, 1034G: green coloring layer, 1034B: blue coloring layer, 1035: black layer (black matrix), 1036: overcoat layer, 1037: third interlayer insulating film, 1040: pixel portion, 1041: driver circuit portion, 1042: peripheral portion, 1044W: white light-emitting region, 1044R: red light-emitting region, 1044B: blue light-emitting region, 1044G: green light-emitting region, 2001: housing, 2002: light source, 3001: lighting device, 3002: display device, 5000: display, 5001: display, 5002: display, 5003: display, 5004: display, 5005: display, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: second display portion, 7301: housing, 7302: housing, 7303: joint portion, 7304: display portion, 7305: display portion, 7306: speaker portion, 7307: recording medium insertion portion, 7308: LED lamp, 7309: operation key, 7310: connection terminal, 7311: sensor, 7400: mobile phone, 7401: housing, 7402: display portion, 7403: operation button, 7404: external connection port, 7405: speaker, 7406: microphone, 9033: clasp, 9034: switch, 9035: power switch, 9036: switch, 9038: operation switch, 9630: housing, 9631: display portion, 9631a: display portion, 9631b: display portion, 9632a: touchscreen region, 9632b: touchscreen region, 9633: solar cell, 9634: charge and discharge control circuit, 9635: battery, 9636: DC-to-DC converter, 9637: operation key, 9638: converter, and 9639: button.

This application is based on Japanese Patent Application serial no. 2012-057241 filed with Japan Patent Office on Mar. 14, 2012, the entire contents of which are hereby incorporated by reference.

The invention claimed is:

1. A light-emitting element comprising:
 a first electrode;
 a first light-emitting layer over the first electrode comprising:
  a first phosphorescent compound; and
  a first host material;
 a second light-emitting layer over the first light-emitting layer comprising:
  a second phosphorescent compound; and
  a second host material;
 a third light-emitting layer over the second light-emitting layer comprising:
  a third phosphorescent compound; and
  a third host material; and
 a second electrode over the third light-emitting layer,
 wherein the first phosphorescent compound emits blue light,
 wherein $\epsilon(\lambda)\lambda^4$ of the second phosphorescent compound has a peak within a wavelength range of 440 nm to 520 nm,
 wherein the second phosphorescent compound emits light with a wavelength longer than a wavelength of the light emitted from the first phosphorescent compound,
 wherein $\epsilon(\lambda)\lambda^4$ of the third phosphorescent compound has a peak within a wavelength range of 520 nm to 600 nm,
 wherein the third phosphorescent compound emits light with a wavelength longer than the wavelength of the light emitted from the second phosphorescent compound,
 wherein $\lambda$ denotes a wavelength, and
 wherein $\epsilon(\lambda)$ denotes a molar absorption coefficient at the wavelength $\lambda$.

2. The light-emitting element according to claim 1, wherein the peak of $\epsilon(\lambda)\lambda^4$ of the third phosphorescent compound within the wavelength range of 520 nm to 600 nm is higher than the peak of $\epsilon(\lambda)\lambda^4$ of the second phosphorescent compound within the wavelength range of 440 nm to 520 nm.

3. The light-emitting element according to claim 1,
 wherein the first light-emitting layer has an electron-transport property, and
 wherein the second light-emitting layer and the third light-emitting layer each have a hole-transport property.

4. The light-emitting element according to claim 1,
 wherein the first host material has an electron-transport property, and
 wherein the second host material and the third host material each have a hole-transport property.

5. The light-emitting element according to claim 1,
 wherein the first light-emitting layer has a hole-transport property, and
 wherein the second light-emitting layer and the third light-emitting layer each have an electron-transport property.

6. The light-emitting element according to claim 1,
 wherein the first host material has a hole-transport property, and
 wherein the second host material and the third host material each have an electron-transport property.

7. The light-emitting element according to claim 1,
 wherein the first light-emitting layer is in contact with the second light-emitting layer, and
 wherein the second light-emitting layer is in contact with the third light-emitting layer.

8. The light-emitting element according to claim 1, wherein the second light-emitting layer has a thickness of greater than or equal to 5 nm and less than or equal to 20 nm.

9. A lighting device comprising the light-emitting element according to claim 1.

10. A light-emitting device comprising:
 the light-emitting element according to claim 1; and
 a means for controlling the light-emitting element.

11. A display device comprising:
 the light-emitting element according to claim 1 in a display portion; and
 a means for controlling the light-emitting element.

12. An electronic device comprising the light-emitting element according to claim 1.

13. A light-emitting element comprising:
 a first electrode;
 a first light-emitting layer over the first electrode comprising:
  a first phosphorescent compound; and
  a first host material;
 a second light-emitting layer over the first light-emitting layer comprising:
  a second phosphorescent compound; and
  a second host material;
 a third light-emitting layer over the second light-emitting layer comprising:
  a third phosphorescent compound; and
  a third host material; and
 a second electrode over the third light-emitting layer,
 wherein the first phosphorescent compound emits blue light,
 wherein $\epsilon(\lambda)\lambda^4$ of the second phosphorescent compound has a peak within a wavelength range of 440 nm to 520 nm,
 wherein the second phosphorescent compound has a peak wavelength of phosphorescence within a range of 520 nm to 600 nm,
 wherein $\epsilon(\lambda)\lambda^4$ of the third phosphorescent compound has a peak within a wavelength range of 520 nm to 600 nm,
 wherein the third phosphorescent compound emits light with a wavelength longer than the wavelength of the light emitted from the second phosphorescent compound,
 wherein $\lambda$ denotes a wavelength, and
 wherein $\epsilon(\lambda)$ denotes a molar absorption coefficient at the wavelength $\lambda$.

14. The light-emitting element according to claim 13, wherein the peak of $\epsilon(\lambda)\lambda^4$ of the third phosphorescent compound within the wavelength range of 520 nm to 600 nm is higher than the peak of $\epsilon(\lambda)\lambda^4$ of the second phosphorescent compound within the wavelength range of 440 nm to 520 nm.

15. The light-emitting element according to claim 13,
 wherein the first light-emitting layer has an electron-transport property, and
 wherein the second light-emitting layer and the third light-emitting layer each have a hole-transport property.

16. The light-emitting element according to claim 13,
 wherein the first host material has an electron-transport property, and
 wherein the second host material and the third host material each have a hole-transport property.

17. The light-emitting element according to claim 13,
wherein the first light-emitting layer has a hole-transport property, and
wherein the second light-emitting layer and the third light-emitting layer each have an electron-transport property.

18. The light-emitting element according to claim 13,
wherein the first host material has a hole-transport property, and
wherein the second host material and the third host material each have an electron-transport property.

19. The light-emitting element according to claim 13,
wherein the first light-emitting layer is in contact with the second light-emitting layer, and
wherein the second light-emitting layer is in contact with the third light-emitting layer.

20. The light-emitting element according to claim 13, wherein the second light-emitting layer has a thickness of greater than or equal to 5 nm and less than or equal to 20 nm.

21. A lighting device comprising the light-emitting element according to claim 13.

22. A light-emitting device comprising:
the light-emitting element according to claim 13; and
a means for controlling the light-emitting element.

23. A display device comprising:
the light-emitting element according to claim 13 in a display portion; and
a means for controlling the light-emitting element.

24. An electronic device comprising the light-emitting element according to claim 13.

25. A light-emitting element comprising:
a first electrode;
a first light-emitting layer over the first electrode comprising:
  a first phosphorescent compound; and
  a first host material;
a second light-emitting layer over the first light-emitting layer comprising:
  a second phosphorescent compound; and
  a second host material;
a third light-emitting layer over the second light-emitting layer comprising:
  a third phosphorescent compound; and
  a third host material; and
a second electrode over the third light-emitting layer,
wherein the first phosphorescent compound has a peak wavelength of phosphorescence within a range of 440 nm to 520 nm,
wherein $\epsilon(\lambda)\lambda^4$ of the second phosphorescent compound has a peak within a wavelength range of 440 nm to 520 nm,
wherein the second phosphorescent compound has a peak wavelength of phosphorescence within a range of 520 nm to 600 nm,
wherein $\epsilon(\lambda)\lambda^4$ of the third phosphorescent compound has a peak within a wavelength range of 520 nm to 600 nm,
wherein $\lambda$ denotes a wavelength, and
wherein $\epsilon(\lambda)$ denotes a molar absorption coefficient at the wavelength $\lambda$.

* * * * *

UNITED STATES PATENT AND TRADEMARK OFFICE
CERTIFICATE OF CORRECTION

PATENT NO.         : 8,653,553 B2
APPLICATION NO.    : 13/799872
DATED              : February 18, 2014
INVENTOR(S)        : Shunpei Yamazaki et al.

It is certified that error appears in the above-identified patent and that said Letters Patent is hereby corrected as shown below:

In the Specification:

Column 19, Line 14; Change "omission" to --emission--.

Column 23, Line 45; Change "p-type T," to --p-type TFT,--.

Column 25, Line 29; Change "polyvinyl fluoride)" to --poly(vinyl fluoride)--.

Column 25, Line 37; Change "described" to --described in--.

Column 42, Line 9; Change "faulted" to --formed--.

Column 44, Line 36; Change "2mDBIBPDBq-H" to --2mDBTBPDBq-II--.

Column 48, Line 49; Change "Binuclear" to --dinuclear--.

Signed and Sealed this
First Day of July, 2014

Michelle K. Lee
*Deputy Director of the United States Patent and Trademark Office*